(12) United States Patent
Rogers et al.

(10) Patent No.: US 8,367,035 B2
(45) Date of Patent: Feb. 5, 2013

(54) METHODS OF MAKING SPATIALLY ALIGNED NANOTUBES AND NANOTUBE ARRAYS

(75) Inventors: John A. Rogers, Champaign, IL (US); Coskun Kocabas, Urbana, IL (US); Moonsub Shim, Savoy, IL (US); Seong Jun Kang, Champaign, IL (US); Jang-Ung Park, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 13/596,343

(22) Filed: Aug. 28, 2012

(65) Prior Publication Data
US 2012/0321785 A1    Dec. 20, 2012

Related U.S. Application Data

(63) Continuation of application No. 11/465,317, filed on Aug. 17, 2006, now abandoned.

(60) Provisional application No. 60/779,714, filed on Mar. 3, 2006.

(51) Int. Cl.
*D01F 9/127* (2006.01)
*C01B 31/02* (2006.01)

(52) U.S. Cl. ............. 423/447.3; 423/461; 977/843; 977/845; 977/888; 977/890; 977/932

(58) Field of Classification Search .......... 423/445 R, 423/447.1, 447.2, 447.3, 447.5, 460, 461; 977/842, 843, 890, 891, 892, 845, 888, 932
See application file for complete search history.

(56) References Cited

U.S. PATENT DOCUMENTS

| | | | |
|---|---|---|---|
| 4,761,335 | A | 8/1988 | Aurichio et al. |
| 5,545,291 | A | 8/1996 | Smith et al. |
| 5,772,905 | A | 6/1998 | Chou |
| 5,783,856 | A | 7/1998 | Smith et al. |
| 5,817,242 | A | 10/1998 | Biebuyck et al. |
| 5,824,186 | A | 10/1998 | Smith et al. |
| 5,904,545 | A | 5/1999 | Smith et al. |
| 6,006,589 | A | 12/1999 | Rodahl et al. |
| 6,225,149 | B1 | 5/2001 | Gan et al. |
| 6,274,508 | B1 | 8/2001 | Jacobsen et al. |
| 6,281,038 | B1 | 8/2001 | Jacobsen et al. |
| 6,291,896 | B1 | 9/2001 | Smith |
| 6,316,278 | B1 | 11/2001 | Jacobsen et al. |

(Continued)

FOREIGN PATENT DOCUMENTS

| | | |
|---|---|---|
| JP | 2002092984 | 3/2002 |
| JP | 2002-118248 | 4/2002 |

(Continued)

OTHER PUBLICATIONS

Zhang et al., "Electric-field-directed growth of aligned single-walled carbon nanotubes," 2001, Appl. Phys. Lett., vol. 79, No. 19, pp. 3155-3157.*

(Continued)

*Primary Examiner* — Melvin C Mayes
*Assistant Examiner* — Brittany Martinez
(74) *Attorney, Agent, or Firm* — Greenlee Sullivan P.C.

(57) ABSTRACT

The present invention provides arrays of longitudinally aligned carbon nanotubes having specified positions, nanotube densities and orientations, and corresponding methods of making nanotube arrays using guided growth and guided deposition methods. Also provided are electronic devices and device arrays comprising one or more arrays of longitudinally aligned carbon nanotubes including multilayer nanotube array structures and devices.

31 Claims, 35 Drawing Sheets

U.S. PATENT DOCUMENTS

| | | |
|---|---|---|
| 6,334,960 B1 | 1/2002 | Willson et al. |
| 6,380,729 B1 | 4/2002 | Smith |
| 6,417,025 B1 | 7/2002 | Gengel |
| 6,420,266 B1 | 7/2002 | Smith et al. |
| 6,468,638 B2 | 10/2002 | Jacobsen et al. |
| 6,479,395 B1 | 11/2002 | Smith et al. |
| 6,527,964 B1 | 3/2003 | Smith et al. |
| 6,555,408 B1 | 4/2003 | Jacobsen et al. |
| 6,566,744 B2 | 5/2003 | Gengel |
| 6,580,151 B2 | 6/2003 | Vandeputte et al. |
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,608,370 B1 | 8/2003 | Chen et al. |
| 6,623,579 B1 | 9/2003 | Smith et al. |
| 6,655,286 B2 | 12/2003 | Rogers |
| 6,657,289 B1 | 12/2003 | Craig et al. |
| 6,665,044 B1 | 12/2003 | Jacobsen et al. |
| 6,683,663 B1 | 1/2004 | Hadley et al. |
| 6,693,384 B1 | 2/2004 | Vicentini et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,780,696 B1 | 8/2004 | Schatz |
| 6,814,898 B1 | 11/2004 | Deeman et al. |
| 6,816,380 B2 | 11/2004 | Credelle et al. |
| 6,844,673 B1 | 1/2005 | Bernkopf |
| 6,848,162 B2 | 2/2005 | Arneson et al. |
| 6,850,312 B2 | 2/2005 | Jacobsen et al. |
| 6,863,219 B1 | 3/2005 | Jacobsen et al. |
| 6,864,435 B2 | 3/2005 | Hermanns et al. |
| 6,864,570 B2 | 3/2005 | Smith |
| 6,872,645 B2 | 3/2005 | Duan et al. |
| 6,878,871 B2 | 4/2005 | Scher et al. |
| 6,949,199 B1 | 9/2005 | Gauzner et al. |
| 6,949,206 B2 | 9/2005 | Whitford |
| 7,169,669 B2 | 1/2007 | Blakers et al. |
| 7,195,733 B2 | 3/2007 | Rogers et al. |
| 7,255,919 B2 | 8/2007 | Sakata et al. |
| 7,347,981 B2 | 3/2008 | Crespi et al. |
| 7,374,968 B2 | 5/2008 | Kornilovich et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,704,684 B2 | 4/2010 | Rogers et al. |
| 2003/0006527 A1 | 1/2003 | Rabolt et al. |
| 2003/0178316 A1 | 9/2003 | Jacobs et al. |
| 2004/0005723 A1 | 1/2004 | Empedocles et al. |
| 2004/0026684 A1 | 2/2004 | Empedocles et al. |
| 2004/0079464 A1 | 4/2004 | Kumakura |
| 2004/0095658 A1 | 5/2004 | Buretea et al. |
| 2004/0112964 A1 | 6/2004 | Empedocles et al. |
| 2004/0136866 A1 | 7/2004 | Pontis et al. |
| 2004/0146560 A1 | 7/2004 | Whiteford et al. |
| 2004/0178390 A1 | 9/2004 | Whiteford |
| 2004/0206448 A1 | 10/2004 | Dubrow |
| 2004/0250950 A1 | 12/2004 | Dubrow |
| 2005/0038498 A1 | 2/2005 | Dubrow et al. |
| 2005/0067349 A1 | 3/2005 | Crespi et al. |
| 2005/0081625 A1 | 4/2005 | Chen et al. |
| 2005/0238967 A1 | 10/2005 | Rogers et al. |
| 2006/0038182 A1 | 2/2006 | Rogers et al. |
| 2006/0127817 A1 | 6/2006 | Ramanujan et al. |
| 2006/0134893 A1 | 6/2006 | Savage et al. |
| 2006/0189822 A1 | 8/2006 | Yoon et al. |
| 2006/0244105 A1 | 11/2006 | Forbes et al. |
| 2006/0279191 A1 | 12/2006 | Geohegan et al. |
| 2007/0032089 A1 | 2/2007 | Nuzzo et al. |
| 2008/0020487 A1 | 1/2008 | McLean et al. |
| 2008/0055581 A1 | 3/2008 | Rogers et al. |
| 2009/0199960 A1 | 8/2009 | Nuzzo et al. |
| 2011/0147715 A1 | 6/2011 | Rogers et al. |

FOREIGN PATENT DOCUMENTS

| | | |
|---|---|---|
| JP | 2003-081622 | 3/2003 |
| TW | 0367570 | 8/1999 |
| WO | WO 00/46854 | 8/2000 |
| WO | WO 00/49421 | 8/2000 |
| WO | WO 00/49658 | 8/2000 |
| WO | WO 00/55915 | 9/2000 |
| WO | WO 00/55916 | 9/2000 |
| WO | WO 01/33621 | 5/2001 |
| WO | WO 02/27701 | 4/2002 |
| WO | WO 02/43032 | 5/2002 |
| WO | WO 02/097708 | 12/2002 |
| WO | WO 02/097724 | 12/2002 |
| WO | WO 03/032240 | 4/2003 |
| WO | WO 03/049201 | 6/2003 |
| WO | WO 03/063211 | 7/2003 |
| WO | WO 03/085700 | 10/2003 |
| WO | WO 03/085701 | 10/2003 |
| WO | WO 03/092073 | 11/2003 |
| WO | WO 2004/003535 | 1/2004 |
| WO | WO 2004/022637 | 3/2004 |
| WO | WO 2004/022714 | 3/2004 |
| WO | WO 2004/023527 | 3/2004 |
| WO | WO 2004/024407 | 3/2004 |
| WO | WO 2004/027822 | 4/2004 |
| WO | WO 2004/032190 | 4/2004 |
| WO | WO 2004/032191 | 4/2004 |
| WO | WO 2004/032193 | 4/2004 |
| WO | WO 2004/034025 | 4/2004 |
| WO | WO 2004/086289 | 10/2004 |
| WO | WO 2004/094303 | 11/2004 |
| WO | WO 2004/100252 | 11/2004 |
| WO | WO 2004/099068 | 12/2004 |
| WO | WO 2004/105456 | 12/2004 |
| WO | WO 2005/005679 | 1/2005 |
| WO | WO 2005/015480 | 2/2005 |
| WO | WO 2005/017962 | 2/2005 |
| WO | WO 2005/022120 | 3/2005 |

OTHER PUBLICATIONS

Ago et al., "Synthesis of horizontally-aligned single-walled carbon nanotubes with controllable density on sapphire surface and polarized Raman spectroscopy," 2006, Chemical Physics Letters, 421, pp. 399-403.*

Ago et al., "Aligned growth of isolated single-walled carbon nanotubes programmed by atomic arrangement of substrate surface," 2005, Chemical Physics Letters, 408, pp. 433-438.*

Han et al., "Template-Free Directional Growth of Single-Walled Carbon Nanotues on a- and r-Plane Sapphire," 2005, J. Am. Chem. Soc., 127, pp. 5294-5295.*

Ismach et al., "Atomic-Step-Templated Formation of Single Wall Carbon Nanotube Patterns," 2004, Angew. Chem. Int. Ed., 43, pp. 6140-6143.*

Ismach et al., "Carbon Nanotube Graphoepitaxy: Highly Oriented Growth by Faceted Nanosteps," 2005, J. Am. Chem. Soc., vol. 127, No. 33, pp. 11554-11555.*

Xiong et al., "Aligned millimeter-long carbon nanotube arrays grown on single crystal magnesia," 2006, Carbon, 44, pp. 969-973.*

Buitelaar et al., "Charge pumping and current quantization in surface acoustic-wave-driven carbon nanotube devices," Oct. 17, 2006, Semiconductor Science and Technology, 21, pp. S69-S77.*

Kong et al., "Chemical vapor deposition of methane for single-walled carbon nanotubes," 1998, Chemical Physics Letters, 292, pp. 567-574.*

Tokunaga Seiichi et al., JP 2003-081622 A translation, Mar. 19, 2003.*

Ding et al., "Growth of High-Density Parallel Arrays of Long Single-Walled Carbon Nanotubes on Quartz Substrates," 2008, J. Am. Chem. Soc., 130, pp. 5428-5429.*

Kang et al., "Printed Multilayer Superstructures of Aligned Single-Walled Carbon Nanotubes for Electronic Applications," 2007, Nano Lett., vol. 7, No. 11, pp. 3343-3348.*

Kocabas et al., "Improved Synthesis of Aligned Arrays of Single-Walled Carbon Nanotubes and Their Implementation in Thin Film Type Transistors," 2007, J. Phys. Chem. C, 111, pp. 17879-17886.*

Yuan et al., "Horizontally Aligned Single-Walled Carbon Nanotube on Quartz from a Large Variety of Metal Catalysts," 2008, Nano Lett., vol. 8, No. 8, pp. 2576-2579.*

Ding et al., "Selective Growth of Well-Aligned Semiconducting Single-Walled Carbon Nanotubes," 2009, Nano Lett., vol. 9, No. 2, pp. 800-805.*
Adachi et al. (1983) "Chemical Etching Characteristics of (001)GaAs," *J. Electrochem. Soc.* 130:2427-2435.
Adachi et al (1982) "Chemical Etching of InGaAsP/InP DH Wafer," *J. Electrochem. Soc.* 129:1053-1062.
Allen et al. (Feb. 20, 2006) "Nanomaterial Transfer Using Hot Embossing for Flexible Electronic Devices," *Appl. Phys. Lett.* 88:083112.
Alivisatos et al. (1996) "Semiconductor Clusters, Nanocrystals, and Quantum Dots," *Science* 271:933-937.
Alivisatos et al. (1998) "From Molecules to Materials: Current Trends and Future Directions," *Adv. Mater.* 10:1297-1336.
Ambrosy et al. (1996) "Silicon Motherboards for Multichannel Optical Modules," *IEEE Trans. Compon. Pack. A* 19:34-40.
Anagnostopoulos et al. (2003) "Micro-Jet Nozzle Array for Precise Droplet Metering and Steering Having Increased Droplet Deflection," *12th International Conference on Solid State Sensors, Actuators and Microsystems*, Boston, pp. 368-371.
Ando et al. (2004) "Self-Aligned Self-Assembly Process for Fabricating Organic Thin-Film Transistors," *Appl. Phys. Lett.* 85:1849-1851.
Aoki et al. (2003) "Microassembly of Semiconductor Three Dimensional Photonic Crystals," *Nat. Mater.* 2:117-121.
Bechtold et al. (Nov. 9, 2001) "Logic Circuits with Carbon Nanotube Transistors," *Science* 294:1317-1320.
Balmer et al. (2005) "Diffusion of Alkanethiols in PDMS and Its Implications on Microcontact Printing (μCP)," *Langmuir* 21(2):622-632.
Bao et al. (1999) "Printable Organic and Polymeric Semiconducting Materials and Devices," *J. Mater. Chem.* 9:1895-1904.
Bao et al. (1997) "High-Performance Plastic Transistors Fabricated by Printing Techniques," *Chem. Mater.* 9:1299-1301.
Barquins, M. (1992) "Adherence, Friction and Wear of Rubber-Like Materials," *Wear* 158:87-117.
Bates, F.S. (1991) "Polymer-Polymer Phase Behavior," *Science* 251:898-905.
Battaglia et al. (2003) "Colloidal Two-Dimensional Systems: CdSe Quantum Shells and Wells," *Angew. Chem. Int. Ed.* 442:5035-5039.
Bauer et al. (2004) "Biological Applications of High Aspect Ratio Nanoparticles," *J. Mater. Chem.* 14:517-526.
Berg et al. (2003) "Tailored Micropatterns Through Weak Polyelectrolyte Stamping," Langmuir 19:2231-2237.
Bernard et al. (1998) "Printing Patterns of Proteins," *Langmuir* 14(9):2225-2229.
Bhunia et al. (2004) "Free-Standing and Vertically Aligned InP Nanowires Grown by Metalorganic Vapor Phase Epitaxy," *Physica E* 21:583-587.
Bietsch et al. (2000) "Conformational Contact and Pattern Stability of Stamps Used for Soft Lithography," *J. Appl. Phys.* 88:4310-4318.
Blanchet et al. (2003) "Large Area, High Resolution, Dry Printing of Conducting Polymers for Organic Electronics," *Appl. Phys. Lett.* 82:463-465.
Blanchet et al. (2003) "Printing Techniques for Plastic Electronics," *J. Imag. Sci. Tech.* 47(4):296-303.
Blazdell et al. (1995) "The Computer Aided Manufacture of Ceramics Using Multilayer Jet Printing," *Sci. Lett.* 14:1562-1565.
Blazdell et al. (Nov. 1999) "Preparation of Ceramic Inks for Solid Freeforming Using a Continuous Jet Printer," *J. Mat. Syn. Process.* 7(6):349-356.
Boltau et al. (1998) "Surface-Induced Structure Formation of Polymer Blends on Patterned Substrates," *Nature* 391:877-879.
Bowden et al. (2001) "Molecule-Mimetic Chemistry and Mesoscale Self-Assembly," *Acc. Chem. Res.* 34:231-238.
Bowden et al. (1998) "Spontaneous Formation of Ordered Structures in Thin Films of Metals Supported on an Elastomeric Polymer," *Nature* 393:146-149.
Bowden et al. (1997) "Self Assembly of Mesoscale Objects into Ordered Two-Dimensional Arrays," *Science* 276:233-235.
Bradley et al. (2003) "Flexible Nanotube Electronics," *Nano Lett.*, vol. 3, No. 10, pp. 1353-1355.

Braun et al. (1999) "Electrochemically Grown Photonic Crystals," *Nature* 402:603-604.
Brown, H.R. (1991) "The Adhesion Between Polymers," *Ann. Rev. Mater. Sci.* 21:463-489.
Bruschi et al. (2001) "Micromachined Silicon Suspended Wires With Submicrometric Dimensions," *Microelectron. Eng.* 57-58:959-965.
Bulashevich et al. (2002) "Nanotube Devices: A Microscopic Model," *Jets Lett.* 75(4):205-209.
Buma et al. (2001) "High-Frequency Ultrasound Array Element Using Thermoelastic Expansion in an Elastomeric Film," *Appl. Phys. Lett.* 79:548-550.
Burdinski et al. (2005) "Single Etch Patterning of Stacked Silver and Molybdenum Alloy Layers on Glass Using Microcontat Wave Printing," *J. Am. Chem. Soc.* 127(31):10786-10787.
Burgin et al. (2000) "Large Area Submicrometer Contact Printing Using a Contact Aligner," *Langmuir* 16:5371-5375.
Burns et al. (2003) "Printing of Polymer Thin-Film Transistors for Active-Matrix-Display Applications," *J. Soc. Inf. Display* 11:599-604.
Campbell et al. (2000) "Fabrication of Photonic Crystals for the Visible Spectrum by Holographic Lithography," *Nature* 404:53-56.
Cao et al. (2006) "Transparent flexible organic thin-film transistors that use printed single-walled carbon nanotube electrodes," *Applied Physics Letters*, vol. 88.
Cao et al. (2006) "Highly Bendable, Transparent Thin-Film Transistors That Use Carbon-Nanotube-Based Conductors and Semiconductors with Elastomeric Delectrics," *Adv. Mater.* 18(3):304-309.
Carr et al. (1998) "Measurement of Nanomechanical Resonant Structures in Single-Crystal Silicon," *J. Vac. Sci. Technol. B* 16:3821-3824.
Chadhury et al. (1991) "Direct Measurement of Interfacial Interactions Between Semispherical Lenses and Flat Sheets of Poly(dimethylsilxoane) and their Chemical Derivatives," *Langmuir* 7:1013-1025.
Chang et al. (1994) "Process Techniques, Lithography and Device-Related Physics and Principles," In; *GaAs High-Speed Devices: Physics, Technology and Circuit Application*, John Wiley and Sons, New York, pp. 115-278.
Chen et al. (2003) "Electronic Paper: Flexible Active-Matrix Electronics Ink Display," *Nature* 423:136-.
Chen et al. (2003) "Characterization of Pd-GaAs Schottly Diodes Prepared by the Electrodes Plating Technique," *Semiconductor. Sci. Technol.* 18:620-626.
Chen et al. (Mar. 24, 2006) "An Integrated Logic Crcuit Assembled on a Single Carbon Nanotube," *Science* 311:1735-.
Chen et al. (Feb. 27, 2006) "Complementary Carbon Nanotube-Gated Carbon Nanotube Thin-Fim Transistor," *Appl. Phys. Lett.* 88:093502.
Chen et al. (2005) "The Role of Metal-Nanotube Caontact in the Performance of Carbon Nanotube Field-Effect Transistors," *Nano Lett.* 5(7):1497-1502.
Chen et al. (2004) "Herringbone Buckling Patterns of Compresses Thin Films on Comlliant Substrates," *J. AppL Mech.* 71:597.
Cheng et al. (2005) "Ink-Jet Printing, Self-Assembled Polyelectrolytes, and Electroless Plating: Low Cost Fabrication of Circuits on a Flexible Substrate at Room Temperature," *Macromol. Rapid Commun.* 26:247-264.
Childs et al. (2002) "Decal Transfer Microlithography: A New Soft-Lithographic Patterning Method," *J. Am. Chem. Soc.* 124:13583-13596.
Chou et al. (2004) "An Orientation-Controlled Pentacene Film Aligned by Photoaligned Polyimide for Organic Thin-Film Transistor Applications," *Adv. Func. Mater.* 14:811-815.
Chu et al. (2005) "High-Performance Organic Thin-Film Transistors with Metal Oxide/Metal Bilayer Electrode," *Appl. Phys. Lett.* 87:193508.
Chung et al. (2000) "Silicon Nanowire Devices," *Appl. Phys. Lett.* 76(15):2068-2070.
Collins et al. (Apr. 27, 2001) "Engineering Carbon Nanotubes and Nanotube Circuits Using Electrical Breakdown," *Science* 292:706-709.
Creagh et al. (2003) "Design and Performance of Inkjet Print Heads for Non-Graphic-Arts Applications," *MRS Bull.* 28:807-811.

Crowder et al. (1998) "Low-Temperature Single-Crystal Si TFTs Fabricated on Si Films Processed via Sequential Lateral Solidification," *IEEE Electron. Dev. Lett.* 19:306-308.

Cui et al. (2001) "Nanowire Nanosensors for Highly Sensitive and Selective Detection of Biological and Chemical Species," *Science* 293:1289-1292.

Dai et al. (2003) "Novel Nanostructures of Functional Oxides Synthesized by Thermal Evaporation," *Adv. Funct. Mater.* 13:9-24.

Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.

DeBoer et al. (2004) "Organic Single-Crystal Field-Effect Transistors," *Phys. Stat. Sol.* 201:1302-1331.

Decre et al. (2003) Wave Printing(1): Towards Large-Area, Multilayer Microcontact Printing, *Materials Research Society Fall Meeting*, pp. M4.9:59-61.

Deen et al. (2004) "Electrical Characterization of Polymer-Based FETs Fabricated by Spin-Coating Poly(3-alkylthiophene)s," *IEEE Trans. Electron Devices* 51:1892-1901.

de Gans (2004) "Inkjet Printing of Polymers: State of the Art and Future Developments," *Adv. Mater.* 16(3):203-213.

Delmerche et al. (1997) "Stability of Molded Polydimethylsiloxane Microstructures," *Adv. Mat.* 9:741-746.

Deruelle et al. (1995) "Adhesion at the Solid-Elastomer Interface: Influence of Interfacial Chains," *Macromol.* 28:7419-7428.

Derycke et al. (Sep. 2001) "Carbon Nanotube Inter- and Intramolecular Logic Gates," *Nano Lett.* 1(9):453-456.

Dinsmore et al. (2002) "Colloidosomes: Selectively Permeable Capsules Composed of Colloidal Particles," *Science* 298:1006-1009.

Divliansky et al. (2003) "Fabrication of Three-Dimensional Polymer Photonic Crystal Structures Using Single Diffraction Element Interference Lithography," *Appl. Phys. Lett.* 82(11):1667-1669.

Dodabalapur et al. (1995) "Organic Transistors: Two-Dimensional Transport and Improved Electrical Characteristics," *Science* 268:270-271.

Duan et al. (2003) "High-performance Thin-Film Transistors Using Semiconductor Nanowires and Nanoribbons," *Nature* 425:274-278.

Duan et al. (2000) "General Synthesis of Compound Semiconductor Nanowires," *Adv. Mater.* 12:298-302.

Duboz et al. (1998) "Transistors and Detectors Based on GaN-Related Materials," In; *Group III Nitride Semiconductor Compounds*, Gill, B. ed., Clarendon, Oxford, pp. 343-387.

Duesberg et al. (2000) "Polarized Raman Spectroscopy on Isolated Single-Wall Carbon Nanotubes," *Phys. Rev. Lett.*, vol. 85, No. 25, pp. 5436-5439.

Duffy et al. (1998) "Rapid Prototyping of Microfluidic Systems in Poly(dimethylsiloxane)," *Anal. Chem.* 70(23):4974-4984.

Durkop et al. (2004) "Extraordinary Mobility in Semiconducting Carbon Nanotube," *Nano Lett.* 4(1):35-39.

Edrington et al. (2001)"Polymer-Based Photonic Crystals," *Adv. Mater.* 13:421-425.

Eftekhari, G. (1993) "Variation in the Effective Richardson Constant of Metal—GaAs and Metal—InP Contacta Due to the Effect of Processing Parameters," *Phys. Status Solid A-Appl. Res.* 140:189-194.

Faez et al. (1999) "An Elastomeric Conductor Based on Polyaniline Prepared by Mechanical Mixing," *Polymer* 40:5497-5503.

Felgner et al. (1996) "Flexural Rigidity of Microtubules Measured with the Use of Optical Tweezers," *J. Cell Sci.* 109:509-516.

Fink et al. (1999) "Block Copolymers as Photonic Bandgap Materials," *J. Lightwave Tech.* 17:1963-1969.

Flewitt et al. (2005) "Low-Temperature Deposition of Hydrogenated Amorphous Silicon in an Electron Cyclotron Resonance Reactor for Flexible Displays," *Proc. IEEE* 93:1364-1373.

Folch et al. (1999) "Wafer-Level In-Registry Microstamping," *J. Microelectromech. Syst.* 8:85-89.

Forment et al. (2004) "Influence of Hydrogen Treatment and Annealing Processes Upon the Schottky Barrier Height of Au/n-GaAs and Ti/n-GaAs Diodes," *Semicond. Sci. Technol.* 19:1391-1396.

Forrest et al. (2004) "The Path to Ubiquitous and Low-Cost Organic Electronic Appliances on Plastic," *Nature* 428:911-918.

Fortunato et al. (2005) "Flexible a-Si: H Position-Sensitive Detectors," *Proc. IEEE* 93:1281-1286.

Freund, L.B. (2000) "The Mechanics of Electronic Materials," *Int. J. Solids Struct.* 37:185-196.

Friedman et al. (2005) "Nanotechnology: High-Speed Integrated Nanowire Circuits," *Nature* 434:1085-.

Furneaux et al. (1989) "The Formation of Controlled-Porosity Membranes from Anodically Oxidized Aluminum," *Nature* 337:147-149.

Gan et al. (2002) "Preparation of Thin-Film Transistors with Chemical Bath Deposited CdSe and CdS Thin Films," *IEEE Trans. Electron. Dev.* 49:15-18.

Garnier et al. (1994) "All-Polymer Field-Effect Transistor Realized by Printing Techniques," *Science* 265:1684-1686.

Geissler et al. (Jun. 2003) "Selective Wet-Etching of Microcontact-Printed Cu Substrates with Control Over the Etch Profile," *Microelec. Eng.* 67-68:326-332.

Geissler et al. (2003) "Fabrication of Metal Nanowires Using Microcontact Printing," *Langmuir* 19(15):6301-6311.

Gelinck et al. (2000) "High-Performance All-Polymer Integrated Circuits," *Appl. Phys. Lett.* 77:1487-1489.

Gelinck et al. (2004) "Fleible Active-Matrix Displays and Shift Registers Based on Solution-Processed Organic Transistors," *Nat. Mater.* 3:106-110.

Georgakilas et al. (2002) "Wafer-Scale Integration of GaAs Optoelectronic Devices with Standard Si Integrated Circuits Using a Low-Temperature Bonding Procedure," *Appl. Phys. Lett.* 81:5099-5101.

Givargizov, E.I. (1991) "Applications," In; *Oriented Crystallization on Amorphous Substrates*, Plenum Press, New York, pp. 341-363.

Gleskova et al. (2004) "Field-Effect Mobility of Amorphous Silicon Thin-Film Transistors Under Strain," *J. Noncryst. Sol.* 338:732-735.

Goetting et al. (1999) "Microcontact Printing of Alkanephosphonic Acids on Aluminum: Pattern Transfer by Wet Chemical Etching," *Langmuir* 15:1182-1191.

Goldmann et al. (2004) "Hole Mobility in Organic Single Crystals Measured by a "Flip-Crystal" Field-Effect Technique," *J. Appl. Phys.* 96:2080-2086.

Goldman et al. (1996) "Correlation of Buffer Strain Relaxation Modes with Transport Properties of Two-Dimensional Electron Gases," *J. Apple. Phys.* 80:6849-6854.

Gratz et al. (1991) "Atomic Force Microscopy of Atomic-Scale Ledges and Etch Pits Formed During Dissolution of Quartz," *Science*, 251:1343-1346.

Gray et al. (Dec. 2001) "Screen Printed Organic Thin Film Transistors (OTFTs) on a Flexible Substrate," *Proc. SPIE* 4466:89-94.

Gray et al. (2004) "High-CONductivity Elastomeric Electronics," *Adv. Mater.* 16:393-397.

Grove et al. (1999) "Color Flat Panel Manufacturing Using Ink Jet Technology," Display Works '99, 1-4.

Guo et al. (Aug. 19, 2002) "Metal-Insulator-Semiconductor Electrostatics of Carbon Nanotubes," *Appl. Phys. Lett.* 81(8):1486-1488.

Gur et al. (2005) "Air-Stable All-Inorganic Nanocrystal Solar Cells Processed from Solution," *Science* 310:462-465.

Haisma et al. (2002) "Contact Bonding, Including Direct-Binding in a Historical and Recent Context of Materials Science and Technology, Physics and Chemistry—Historical Review in a Broader Scope and Comparative Outlook," *Mater. Sci. Eng. R* 37:1-60.

Halik et al. (2004) "Low-Voltage Organic Transistors with an Amorphous Molecular Gate Dielectric," *Nature* 431:963-966.

Hamilton et al. (2004) "Field-Effect Mobility of Organic Polymer Thin-Film Transistors," *Chem. Mater.* 16:4699-4704.

Han et al. (2005) "Template-Free Directional Growth of Single-Walled Carbon Nanotues on a- and r-Plane Sapphire," *J. Am. Chem. Soc.* 127:5294-5295.

Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.

Hayes et al. (Sep.-Dec. 1998) "Micro-Jet Printing of Polymers and Solder for Electronics Manufacturing," *J. Elec. Manufac.* 8(3-4):209-216.

Heffelfinger et al. (1997) "Steps and the structure of the (0001) α-alumina surface," *Surf. Sci.*, 370:L168-L172.

Hines et al. (2005) "Nanotransfer Printing of Organic and Carbon Nanotube Thin-Film Transistors on Plastic Substrates," *Appl. Phys. Lett.* 86:163101.

Horn et al. (1992) "Contact Electrification and Adhesion Between Dissimilar Materials," *Science* 256:362-364.

Hoyer, P. (1996) "Semiconductor Nanotube Formation by a Two-Step Template Process," *Adv. Mater.* 8:857-859.

Hsia et al. (2005) "Collapse of Stamps for Soft Lithography Due to Interfacial Adhesion," *Appl. Phys. Lett.* 86:154106.

Hsu et al. (2002) "Amorphous Si TFTs on Plastically Deformed Spherical Domes," *J. Non-Crystalline Solids* 299-302:1355-1359.

Hsu et al. (2003) "Nature of Electrical Contacts in a Metal—Molecule—Semiconductor System," *J. Vac. Sci. Technol. B* 21(4):1928-1935.

Hsu et al. (2004) "Effects of Mechanical Strain on TFTs on Spherical Strains," *IEEE Trans. Electron Dev.* 51(3):371-377.

Hu et al. (2004) "Percolation in Transparent and Conducting Carbon Nanotube Networks," *Nano Lett.*, vol. 4, No. 12, pp. 2513-2517.

Hu et al. (1999) Chemistry and Physics in One Dimension: Synthesis and Properties of Nanowires and Nanotubes, *Acc. Chem. Res.* 32:435-445.

Hu et al. (1997) "Using Soft Lithography to Fabricate GaAs/AlGaAs Heterostructure Field Effect Transistors," *Appl. Phys. Lett.* 71:2020-2022.

Huang et al. (2001) "Room-Temperature Ultraviolet Nanowire Nanolasers," *Science* 292:1897-1899.

Huang et al. (2001) "Directed Assembly of One-Dimensional Nanostructures into Functional Networks," *Science* 291:630-633.

Huang et al. (2005) "Nonlinear Analyses of Wrinkles in a Film Bonded to a Compliant Substrate," *J. Mech. Phys. Solids* 53:2101-2118.

Huang et al. (2005) "Stamp Collapse in Soft Lithography," *Langmuir* 21:8058-8068.

Huang et al. (2004) "Self-Organizing High-Density Single-Walled Carbon Nanotube Arrays from Surfactant Suspensions," *Nanotechnol.* 15:1450-1454.

Huang et al. (2003) "Growth of Millimeter-Long and Horizontally Aligned Single-Walled Carbon Nanotubes on Flat Substrates," *J. Am. Chem. Soc.*, 125:5636-5637.

Huck et al. (2000) "Ordering of Spontaneousely Formed Buckles on Planar Surfaces," *Langmuir* 16:3497-3501.

Huie, J.C. (2003) "Guided Molecular Self Assembly: A review of Recent Efforts," *Smart Mater. Struct.* 12:264-271.

Huitema et al. (2001) "Plastic Transistors in Active-Matrix Displays," *Nature* 414:599.

Hur et al. (2005) "Printed thin-film transistors and complementary logic gates that use polymer-coated single-walled carbon nanotube networks," *J. Appl. Phys.*, 98, 114302.

Hur et al. (2005) "Organic Nanodelectrics for Low Voltage Carbon Nanotube Thin Film Transistors and Complementary Logc Gates," *J. Am. Chem. Soc.* 127:13808-13809.

Hur etal. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.

Hutchinson et al. (1992) "Mixed Mode Cracking in Layered Materials," *Adv. Appl. Mech.* 29:63-191.

Imparato et al. (2005) "Excimer Laser Induced Crystallization of Amorphous Silicon on Flexible Polymer Substrates," *Thin Solid Films* 487:58-62.

International Search Report, Corresponding to International Application No. PCT/US06/32125, Mailed Mar. 21, 2008.

Islam et al. (Jan. 16, 2003) "High Weight Fraction Surfactant Solubilization of Single-Wall Carbon Nanotubes in Water," *Nano Lett.* 3(2):269-273.

Ismach et al. (2004) "Atomic-Step-Templated Formation or a Single Wall Carbon Nanotube Patterns," *Angew. Chem. Int. Ed.* 43:6140-6143.

Itoh et al. (1991) "Cathodoluminescence Properties of Undoped and Zn-Doped $Al_xGa_{1-x}N$ Grown by Metaloganic Vapor Phase Epitaxy," *Jap. J. Appl. Phys.* 30:1604-1608.

Jabbour et al. (2001) "Scren Printing for the Fabrication of Organic Light-Emitting Devices," *IEEE J. Select. Top. Quantum. Electron.* 7(5):769-773.

Jacobs et al. (2002) "Fabrication of a Cylindrical Display by Patterned Assembly," *Science* 296:323-325.

Jain et al. (2000) "III-Nitrides: Growth, Characterization, and Properties," *J. Appl. Phys.* 87:965-1006.

Jain et al. (2005) "Flexible Electronics and Displays: High-Resolution, Roll-to-Roll, Projection Lithography and Photoblation processing Technologies for Hiogh-Throughput Production," *Proc. IEEE* 93:1500-1510.

James et al. (1998) "Patterned Protein Layers on Solid Substrates by This Stamp Microcontact Printing," *Langmuir* 14:742-744.

Jang et al. (2006) "Low-Voltage and High-Field-Effect Mobility Organic Transistors with a Polymer Insulator," *Appl. Phys. Lett.* 88:072101.

Javey et al. (2005) "High Performance n-Type Carbon Nanotube Field-Effect Transistors with Chemically Doped Contacts," *Nano Lett.*, vol. 5, No. 2, pp. 345-348.

Javey et al. (Aug. 7, 2003) "Ballistic Carbon Nanotube Field-Effect Transistors," *Nature* 424:654-657.

Javey et al. (2002) "High-κ Dielectrics for Advanced Carbon-Nanotube Transistors and Logic Gates," *Nature Mater.* 1:241-246.

Jenkins et al. (1994) "Gallium Arsenide Transistors: Realization Through a Molecularly Designed Insulator," *Science* 263:1751-1753.

Jeon et al. (2004) "Fabricating Complex Three-Dimensional Nanostructures with High Resolution Conformable Phase Masks," *Proc. Natl. Acad. Sci.* USA 101:12428-12433.

Jeon et al. (2004) "Three Dimensional Nanofabrication with Rubber Stamps and Conformable Photomasks," *Adv. Mater.* 16:593-600.

Jeon et al. (1995) "Patterning of Dielectric Oxide Thin Layers by Microcontact Printing of Self-Assembled Monolayers," *J. Mater. Res.* 10:2996-2999.

Jiang et al. (1999) "Preparation of Macroporous Metal Films from Colloidal Crystals," *J. Am. Chem. Soc.* 121:7957-7958.

Jiang et al. (2002) "Polymer-on-Polymer Stamping: Universal Approaches to Chemically Patterned Surfaces," *Langmuir* 18:2607-2615.

Jin et al. (2004) "Scalable Interconnection and Integration of Nanowire Devices Without Registration," *Nano Lett.* 4:915-919.

Jin et al. (2004) "Soft Lithographic Fabrication of an Image Senbsor Array on a Curved Substrate," *J. Vac. Sci. Technol. B* 22:2548-2551.

Jiyun, C.H. (2003) "Guided Molecular Self-Assembly: A Review of Recent Efforts," *Smart Mater. Struct.* 12:564-271.

Johnson et al. (1999) "Ordered Mesoporous Polymers of Tunable Pore Size from Colloidal Silica Templates," *Science* 283:963-965.

Jortner et al. (2002) "Nanostructured Advanced Materials Perspectives and Directions," *Pure Appl. Chem.* 74(9):1491-1506.

Joselevich (2002) "Vectorial Growth of Metallic and Semiconducting Single-Wall Carbon Nanotubes," *Nano Lett.*, vol. 2, No. 10, pp. 1137-1141.

Kagan et al. (2001) "Patterning Organic—Inorganic Thin-Film Transistors Using Microcontact Printed Templates," *Appl. Phys Lett.* 79(21):3536-3538.

Kagan (1999) "Organic-Inorganic Hybrid Materials as Semiconducting Channels in Thin-Film Field-Effect Transistors," *Science* 286:945-947.

Kagan et al. (2003) *Thin Film Transistors*, Dekker, New York, pp. 1-34.

Kane et al. (2000) "Analog and Digital Circuits Using Organic Thin-Film Transistors on Polyester Substrates," *IEEE Electron. Dev. Lett.* 21:534-536.

Kang et al. (2007) "High-Performance Electronics Using Dense, Perfectly Aligned Arrays of Single-Walled Carbon Nanotubes," *Nat. Nanotechnol.* 2:230-236.

Karnik et al. (2003) "Multiple Lateral Polysilicon Diodes as Temperature Sensors for Chemical Microreaction Systems," *Jpn. J. Appl. Phys.* 42:1200-1205.

Karnik et al. (2003) "Lateral Polysilicon $p^+$-p-$n^+$ and $p^+$-n-$n^+$ Diodes," *Solid-State Electronics* 47:653-659.

Katz et al. (2001) "Synthetic Chemistry for Ultrapure, Processable, and High-Mobility Organic Transistor Semiconductors," *Acc. Chem. Res.* 34:359-369.

Katz, H.E. (2004) "Recent Advances in Semiconductor Performance and Printing Processes for Organic Transistor-Based Electronics," *Chem. Mater.* 16:4748-4756.

Kawata et al. (2001) "Finer Features for Functional Microdevices," *Nature* 412:697-698.

Kendall, D.L. (1979) "Vertical Etching of Silicon at Very High Apect Ratios," *Ann. Rev. Mater. Sci.* 9:373-403.

Khan et al. (1993) "High Electron Mobility Transistor Based on a $GaN-Al_xGa_{1-x}N$ Heterojunction," *Appl. Phys. Lett.* 63:1214-1215.

Khang et al. (2006) "A Stretchable Form of Single-Crystal Silicon for High-Performance Electronics on Rubber Substraights," *Science* 311:208-212.

Kilby, J.S. (1976) "Invention of the Integrated Circuit," *IEEE Trans. Electron. Dev.* 23:648-654.

Kim et al. (2003) "Epitaxial self-assembly of block copolymers on lithographically defined nanopatterned substrates," *Nature* 424:411-414.

Kim et al. (2002) "Nanolithography Based on Patterned Metal Transfer and its Application to Organic Electronic Devices," *Appl. Phys. Lett.* 80:4051-4053.

Kim et al. (2000) "Field Emission from Carbon Nanotubes for Displays," *Diamond and Related Mater.* 9(3-6):1184-1189.

Klauk et al. (2002) "High-Mobility Polymer Gate Dielectric Pentacene Thin Film Transistors," *J. Appl. Phys.* 92:5259-5263.

Klein-Wiele et al. (2003) "Fabrication of Periodic Nanostructures by Phase-Controlled Multiple-Beam Interference," *Appl. Phys. Lett.* 83(23):4707-4709.

Knipp et al. (2003) "Pentacine Thin Film Transistors on Inorganic Dielectrics: Morphology, Structural Properties, and Electronic Transport," *J Appl. Phys.* 93:347-355.

Kocabas et al. (2006) "Large Area Aligned Arrays of SWNTs for High Performance Thin Film Transistors," American Physical Society, APS March Meeting, Mar. 13-17, 2006, Abstract #W31.004.

Kocabas et al. (2006) "Spatially Selective Guided Growth of High-Coverage Arrays and Random Networks of Single-Walled Carbon Nanotbes and Thir Integration into Electronic Devices," *J. Am. Chem. Soc.* 128:4540-4541.

Kocabas et al. (2005) "Guided Growth of Large-Scale, Horizontally Aligned Arrays of Single-Walled Carbon Nanotubes and Their Use in Thin-Film Transstors," *Small* 1(11):1110-1116.

Kocabas et al. (2004) "Aligned Arrays of Single-Walled Carbon Nanotubes Generated from Random Networks by Orientationally Selective Laser Ablation," *Nano Lett.*, vol. 4, No. 12, pp. 2421-2426.

Koide et al. (2000) "Patterned Luminescence of Organic Light-Emitting Diodes by Hot Microcontact Printing (HµCP) of Self-Assembled Monolayers," *J. Am. Chem. Soc.* 122:11266-11267.

Kong et al. (2004) "Single-Crystal Nanorings Formed by Epitaxial Self-Coiling of Polar Nanobelts," *Science* 303:1348-1351.

Kong et al. (Jan. 28, 2000) "Nanotube Molecular Wires as Chemical Sensors," *Science* 287:622-625.

Kulkarni et al. (2002) "Mesoscale Organization of Metal Nanocrystals," *Pure Appl. Chem* 74(9):1581-1591.

Kumar et al. (2005) "Percolating in Finite Nanotube Networks," *Phys. Rev. Lett.*, 95, 066802.

Kumar et al. (2002) "Thermally-Stable Low-Resistance Ti/Al/Mo/Au Multilayer Ohmic Contacts on n-GaN," *J. Appl. Phys.* 92:1712-1714.

Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(14):2002-2004.

Kumar et al. (1994) "Patterning Self-Assembled Monolayers: Applications in Materials Science," *Langmuir* 10:1498-1511.

Kuo et al. (1985) "Effect of Mismatch Strain on Band Gap in III-V Semiconductors," *J. Appl. Phys.* 57:5428-5432.

Lacour et al. (2005) "Stretchable Interconnects for Elastic Electronic Surfaces," *Proc. IEEE* 93(8):1459-1467.

Lacour et al. (2003) "Stretchable Gold Conductors on Elastomeric Substrates," *Appl. Phys. Lett.* 82(15):2404-2406.

Lambacher et al. (2004) "Electrical Imaging of Neuronal Activity by Multi-Transistor-Array (MTA) Recording at 7.8 µm Resolution," *Appl. Phys. A* 79:1607-1611.

Landes et al. (2002) "Some Properties of Spherical and Rod-Shaped Semiconductor and Metal Nanocrystals," *Pure Appl. Chem.* 74(9):1675-1692.

Law et al. (2004) "Semiconductor Nanowires and Nanotubes," *Ann. Rev. Mater. Res.* 34:83-122.

Lay et al. (2004) "Simple Route to Large-Scale Ordered Arrays of Liquid-Deposited Carbon Nanotubes," *Nano Lett.*, vol. 4, No. 4, pp. 603-606.

Leclercq et al. (1998) "III-V Micromachined Devices for Microsystems," *Microelectronics J.* 29:613-619.

Lee et al. (2003) "High-Performance Poly-Si TFTs on Plastic Substrates Using a Nano-Structured Separation Layer Approach," *IEEE Elec. Dev. Lett.* 24:19-21.

Lee et al. (2000) "Thin Film Transistors for Displays on Plastic Substrates," *Solid State Electron.* 44:1431-1434.

Lee et al. (2005) "Large-Area, Selective Transfer of Microstructured Silicon (µs-Si): A Printing-Based Approach to High-Performance Thin0Film Transistors Supported on Flexible Substraights," *Adv. Mater.* 17:2332-2336.

Lee et al. (2005) "A Printable Form of Single-Crystalline Gallium Nitride for Flexable Optoelectronic Systems," *Small* 1:1164-1168.

Lee et al. (2004)"Organic Light-Emitting Diodes Formed by Soft Contact Lamination," *Proc. Natl. Acad. Sci.* USA 101(2):429-433.

Lee et al. (Feb. 2001) "Application of Carbon Nanotubes to Field Emission Displays," *Diamond and Related Mater.* 10(2):265-270.

Li et al. (2002) "High-Resolution Contact Printing with Dendrimers," *Nano Lett.* 2(4):347-349.

Li et al. (2003) "Ultrathin Single-Crystalline-Silicon Cantilever Resonators: Fabrication Technology and Significant Specimen Size Effect on Young's Modulus," *Appl. Phys. Lett.* 83:3081-3083.

Li et al. (2004) "Electrospinning of Nanofibers: Reinventing the Wheel," *Adv. Mater.* 16(14):1151-1170.

Lieber, C. (2001) "The Incredible Shrinking Circuit," *Sci. Am.* 285(3):58-64.

Lieber, C.M. (2003) "Nanoscale Science and Technology: Building a Bog Future from Small Things," *MRS. Bull.* 28:486-.

Lim et al. (2005) "Flexible Membrane Pressure Sensor," *Sens. Act. A* 119:332-335.

Lin et al. (2005) "High-Performance Carbon Nanotube Field-Effect Transistor with Tunable Polarities," *IEEE Trans. Nano* 4(5):481-489.

Ling et al. (2004) "Thin Film Deposition, Patterning, and Printing in Organic Thin Film Transistors," *Chem. Mater.* 16:4824-4840.

Liu et al. (1999) "Controlled deposition of individual single-walled carbon nanotubes on chemically functionalized templates," *Chem. Phys. Lett.*, 303:125-129.

Long et al. (1990) "Heterostructure FETs and Bipolar Transistors," In; *Gallium Arsenide Digital Integrated Circuit Design*, McGraw-Hill, New York, pp. 58-69.

Loo et al. (2003) "Electrical Contacts to Molecular Layers by Nanotransfer Printing," *Nano Lett.* 3(7):913-917.

Loo et al. (2002) "Additive, Nanoscale Patterning of Metal Films with a Stamp and a Surface Chemistry Mediated Transfer Process: Applications in Plastic Electronics," *Appl. Physics Lett.* 81:562-564.

Loo et al. (2002) "Interfacial Chemistries for Nanoscale Transfer Printing," *J. Am. Chem. Soc.* 124:7654-7655.

Loo et al. (2002) "High-Resolution Transfer Printing on GaAs Surfaces Using Alkane Dithiol Monolayers," *J. Vac. Sci. Technol. B* 20(6):2853-2856.

Loo et al. (2002) "Soft, Conformable Electrical Contacts for Organic Semiconductors: High-Resolution Plastic Circuits by Lamination," *Proc. Natl. Acad. Sci.* USA 99(16):10252-10256.

Luan et al. (1992) "An Experimental Study of the Source/Drain Parasitic Resistance Effects in Amorphous Silicon Thin Film Transistors," *J. Appl. Phys.* 72:766-772.

Madou, M. (1997) "Etch-Stop Techniques," In; *Fundamentals of Microfabrication*, CRC Press, New York, pp. 193-199.

Maikap et al. (2004) "Mechanically Strained-Si NMOSFETs," *IEEE Electron. Dev. Lett.* 25:40-42.

Maldovan et al. (2004) "Diamond-Structured Photonic Crystals," *Nature Materials* 3:593-600.

Markovich et al. (1999) "Architectonic Quantum Dot Solids," *Acc. Chem. Res.* 32:415-423.

Marquette et al. (2004) "Conducting Elastomer Surface Texturing: A Path to Electrode Spotting Application to the Biochip Production," *Biosens. Bioelectron.* 20:197-203.

Martensson et al. (2004) "Nanowire Arrays Defined by Nanoimprint Lithography," *Nano Lett.* 4:699-702.

Martin, C.R. (1995) "Template Synthesis of Electronically Conductive Polymer Nanostructures," *Acc. Chem. Res.* 28:61-68.

Mas-Torrent et al. (2006) "Large Photoresponsivity in High-Mobility Single-Crystal Organic Field-Effect Phototransistors," *ChemPhysChem* 7:86-88.

Matsunaga et al. (2003) "An Improved GaAs Device Model for the Simulation of Analog Integrated Circuit," *IEEE Trans. Elect. Dev.* 50:1194-1199.

McAlpine et al. (2005) "High-Performance Nanowire Electronics and Photonics and Nanoscale Patterning on Flexible Plastic Substrates," *Proc. IEEE* 93:1357-1363.

McAlpine et al. (2003) "High-Performance Nanowire Electronics and Photonics on Glass and Plastic Substrates," *Nano Lett.* 3:1531-1535.

McCaldin et al. (1971) "Diffusivity and Solubility of Si in the Al Metallization of Integrated Circuits," *Appl. Phys. Lett.* 19:524-527.

Meisel et al. (2004) "Three-Dimensional Photonic Crystals by Holographic Lithography Using the Umbrella Configuration: Symmetries and Complete Photonic Band Gaps," *Phys. Rev. B.* 70:165101:1-10.

Meitl et al. (2004) "Solution Casting and Transfer Printing Single-Walled Carbon Nanotube Films," *Nano Lett.* 4(9):1643-1647.

Meitl et al. (2006) "Transfer Printing by Kinetic Control of Adhesion to an Elastomeric Stamp," *Nat. Mater.* 5:33-38.

Melosh et al. (2003) "Ultrahigh-Density Nanowire Lattices and Circuits," *Science* 300:112-115.

Menard et al. (2004) "A Printable Form of Silicon for High Performance Thin Film Transistors on Plastic Substrates," *Appl. Phys. Lett.* 84:5398-5400.

Menard et al. (2004) "High-Performance n- and p-Type Single-Crystal Organic Transistors with Free-Space Gate Dielectrics," *Adv. Mat.* 16:2097-2101.

Menard et al. (2005) Bendable Single Crystal Silicon Thin Film Transistors Formed by Printing on Plastic Substrates *Appl. Phys. Lett.* 86:093507.

Menard et al. (2004) "Improved Surface Chemistries, Thin Film Deposition Techniques, and Stamp Designs for Nanotransfer Printing," *Langmuir* 20:6871-6878.

Michel et al. (2001) Printing Meets Lithography: Soft Approaches to High-Resolution Patterning, *IBM J. Res. Dev.* 45(5):697-719.

Milliron et al. (2004) "Colloidal Nanocrystal Heterostructures with Linear and Branched Topology," *Nature* 430:190-195.

Min, G. (Apr. 4, 2003) "Plastic Electronics and Their Packaging Technologies," *Syn. Metals.* 135:141-143.

Mirkin et al. (Jul. 2001) "Emerging Methods for Micro- and Nanofabrication," *MRS Bull.* 26(7):506-507.

Misewich et al. (May 2, 2003) "Electronically Induced Optical Emission from a Carbon Nanotube FET," *Science* 300:783-786.

Mishra et al. (2002) "AlGaN/GaN HEMTs—an Overview of Device Operation and Applications," *Proc. IEEE* 90:1022-1031.

Mitzi et al. (2004) "High-Mobility Ulltrathin Semiconducting Films Prepared by Spin Coating," *Nature* 428:299-303.

Moon et al. (2002) "Ink-Jet Printing of Binders for Ceramic Compinents," *J. Am. Ceram. Soc.* 85(4):755-762.

Moore et al. (Sep. 9, 2003) "Individually Suspended Single-Walled Carbon Nanotubes in Various Surfactants," *Nano Lett.* 3(10):1379-1382.

Mori et al. (1978) "A New Etching Solution System, $H_3PO_4$-$H_2O_2$-$H_2O$, for GaAs and Its Kinetics," *J. Electrochem. Soc.* 125:1510-1514.

Morkoc et al. (1995) "High-Luminosity Blue and Blue-Green Gallium Nitride Light-Emitting Diodes," *Science* 267:51-55.

Morkved et al. (1994) "Mesoscopic Self-Assembly of Gold Islands on Diblock-Copolymer Films," *Appl. Phys. Lett.* 64:422-424.

Morra et al. (1990) "On the Aging of Oxygen Plasma-Treated Polydimethylsiloxane Surfaces," *J. Colloid Interface Sci.* 137:11-24.

Murakami et al. (2005) "Polarization Dependence of the Optical Absorption of Single-Walled Carbon Nanotubes," *Phys. Rev. Lett.*, 94, 087402.

Namazu et al. (2000) "Evaluation of Size Effect on Mechanical Properties of Single Crystal Silicon by Nanoscale Bending Test Using AFM," *J. MEMS* 9:450-459.

Nath et al. (2002) "Nanotubes of the Disulfides of Groups 4 and 5 Metals," *Pure Appl. Chem.* 74(9):1545-1552.

Nathan et al. (2002) "Amorphous Silicon Technology for Large Area Digital X-Ray and Optical Imaging," *Microelectronics Reliability* 42:735-746.

Newman et al. (2004) "Introduction to Organic Thin Film Transistors and Design of n-Channel Organic Semiconductors," *Chem. Mater.* 16:4436-4451.

Nirmal et al. (1999) "Luminescence Photophysics in Semiconductor Nanocrystals," *Acc. Chem. Res.* 32:407-414.

Noda et al. (1996) "New Realization Method for Three-Dimensional Photonic Crystal in Optical Wavelength Region," *Jpn. J. Appl. Phys.* 35:L909-L912.

Nomura et al. (2004) "Room-Temperature Fabrication of Transparent Flexible Thin-Film Transistors Using Oxide Semiconductors," *Nature* 432:488-492.

Notice of Reasons for Rejection corresponding to Japanese Patent Application No. P2008-558248, Dispatched Aug. 7, 2012 (Japanese along with English Translation).

O'Connell et al. (Jul. 26, 2002) "Bang Gap Fluorescence from Individual Single-Walled Caarbon Nanotubes," *Science* 297:593-596.

Odom et al. (2002) "Improved Pattern Transfer in Soft Lithography Using Compasite Stamps," *Langmuir* 18:5314-5320.

Ong et al. (2004) "High-Performance Semiconducting Poolythiophenes for Organic Thin-Film Transistors," *J. Am. Chem. Soc.* 126:3378-3379.

Ong et al. (2005) "Design of High-Performance Regioreular Polythiophenes for Organic Thin-Film Transistors," *Proc. IEEE* 93:1412-1419.

Oringin Energy (May 2004) "Fact Sheet—Sliver Cells," www.originenergy.com.au/sliver.

O'Riordan et al. (2004) "Field Configured Assembly: Programmed Manipulation and Self-Assembly at the Mesoscale," *Nano Lett.* 4:761-765.

Ouyang et al. (2002) "High-Performance, Flexible Polymer Light-Emitting Diodes Fabricated by a Continuous Polymer Coating Process," *Adv. Mat.* 14:915-918.

Pan et al. (2001) "Nanobelts of Semiconducting Oxides," *Science* 291:1947-1949.

Panev et al. (2003) "Sharp Exciton Emission from Single InAs Quantum Dots in GaAs Nanowires," *Appl. Phys. Lett.* 83:2238-2240.

Pardo et al. (2000) "Application of Screen Printing in the Fabrication of Organic Ligh-Emitting Devices," *Adv. Mater.* 12(17):1249-1252.

Park et al. (1998) "Fabrication of Three-Dimensional Macroporous Membranes with Assemblies of Microspheres as Templates," *Chem. Mater.* 10:1745-1747.

Park et al. (1997) "Block Copolymer Lithography: Periodic Arrays of ~$10^{11}$ Holes in 1 Square Centimeter," *Science* 276:1401-1404.

Pearton et al. (1999) "GaN: Processing, Defects, and Devices," *J. Appl. Phys.* 86:1-78.

Podzorov et al. (2005) "Hall Effect in the Accumulation Layers on the Surface of Orgaic Semiconductors," *Phys. Rev. lett.* 95:226601.

Preisler et al. (2005) "Ultrathin Epitaxial Germanium on Crystalline Oxide MetalOxide-Semiconductor-Field-Effect Transistors," *Appl. Phys Lett.* 86:223504.

Pushpa et al. (2002) "Stars and Stripes. Nanoscale Misfit Dislocation Patterns on Surfaces," *Pure Appl. Chem.* 74(9):1663-1671.

Quake et al (2000) "From Micro- to Nanofabrication with Soft Materials," *Science* 290:1536-1540.

Raman et al. (1989) "Study of Mesa Undercuts Produced in GaAs with $H_3PO_4$-Based Etchants," *J. Electrochem. Soc.* 136:2405-2410.

Rao et al. (2003) "Large-scale assembly of carbon nanotubes," *Nature*, 425:36-37.

Razeghi et al. (1994) "High-Power Laser Diodes Based on InGaAsP Alloys," *Nature* 369:631-633.

Reuss et al. (2005) "Macroelectronics: Perspectives on Technology and Applications," *Proc. IEEE* 93:1239-1256.

Ribas et al. (1998) "Bulk Micromachining Characterization of 0.2 µm HEMT MMIC Technology for GaAs MEMS Design," *Mater. Sci. Eng. B* 51:267-273.

Ridley et al. (1999) "All-Inorganic Field Effect Transistors Fabricated by Printing," *Science* 286:746-749.

Roberts et al. (1979) "Looking at Rubber Adhesion," *Rubber Chem. Technol.* 52:23-42.

Robinson et al. (1983) "GaAs Readied for High-Speed Microcircuits," *Science* 219:275-277.

Rogers et al. (1997) "Using an Elastomeric Phase Mask for Sub-100 nm Photolithography in the Optical Near Field," *Appl. Phys. Lett.* 70:2658-2660.

Rogers et al. (2002) "Printed Plastic Electronics and Paperlike Displays," *J. Polym. Sci. Part A. Polym. Chem.* 40:3327-3334.

Rogers et al. (1998) "Quantifying Distortions in Soft Lithography," *J. Vac. Sci. Technol.* 16:88-97.

Rogers et al. (1998) "Generating ~90 Nanometer Features Using Near Field Contact Mode Photolithography with an Elastomeric Phase Mask," *J. Vac. Sci. Technol.* 16(1):59-68.

Rogers et al. (1998) "Using Printing and Molding Techniques to Produce Distributed Feedback and Bragg Reflector Resonators for Plastic Lasers," *Appl. Phys. Lett.* 73:1766-1768.

Rogers et al. (2001) "Paper-Like Electronic Displays: Large-Area Rubber-Stamped Plastic Sheets of Electronics and Microencapsulated Electrophoretic Inks," *Proc. Natl. Acad. Sci. USA* 98:4835-4840.

Rogers, J.A. (2001) "Toward Paperlike Displays," *Science* 291:1502-1503.

Rogers, J.A. (2001) "Rubber Stamping for Plastic Electronics and Fiber Optics," *MRS Bulletin* 26(7):530-534.

Rogers et al. (1999) Printing Process Sutable for Reel-to-Reel Production of High-Performance Organic Transistors and Circuits, *Adv. Mater.* 11(9):741-745.

Rogers et al. (2000) "Organic Smart Pixels and Complementart Inverter Circuits Formed on Plastic Substrates by Casting and Rubber Stamping," *IEEE Electron Dev. Lett.* 21(3):100-103.

Rosenblatt et al. (2002) "High Performance Electrolyte Gated Carbon Nanotube Transistors," *Nano Lett.* 2(8):869-872.

Rotkin et al. (2003) "Universal Description of Channel Conductivity for Nanotube and Nanowire Transistors," *Appl. Phys. Lett.* 83:1623-1625.

Roundy et al. (2003) "Photonic Crystal Structure with Square Symetry within Each Layer and a Three-Dimensional Band Gap," *Appl. Phys Lett.* 82:3835-3837.

Samuelson et al. (2004) "Semiconductor Nanowires for Novel One-Dimensional Devices," *Physica E* 21:560-567.

Sangwal et al. (1997) "Nature of multilayer steps on the {100} cleavage planes of MgO single crystals," *Surf. Sci.*, 383:78-87.

Sanyal et al. (2002) "Morphology of Nanostructures Materials," *Pure Appl. Chem.* 74(9):1553-1570.

Sazonov et al. (2005) "Low-Temperature Materials and Thin-Film Transistors for Flexible Electronics," *Proc. IEEE* 93:1420-1428.

Schellekens et al. (2003) *Materials Research Socielty Fall Meeting*, pp. M2.9.1.

Schlegel et al. (2002) "Structures of quartz (1010)- and (1011)-water interfaces determined by X-ray reflectivity and atomic force microscopy of natural growth surfaces," *Geochim. Cosmochim. Acta*, vol. 66, No. 17, pp. 3037-3054.

Schmid et al. (2003) "Preparation of Metallic Films on Elastomeric Stamps and Their Application for Contact Processing and Contact Printing," *Adv. Funct. Mater.* 13:145-153.

Schnable et al. (1969) "Aluminum Metallization; Advantages and Limitations for Integrated Circuit Applications," *IEEE* 57:1570-1580.

Schon et al. (1995) "Ambipolar Pentacene Field-Effect Transistors and Inverters," *Science* 287:1022-1023.

Schrieber et al. (1998) "The Effectiveness of Silane Adhesion Promotors in the Performance of Polyurethane Adhesives," *J. Adhesion* 68:31-44.

Seidel et al. (2004) "High-Current Nanotube Transistors," *Nano Lett.*, vol. 4, No. 5, pp. 831-834.

Sekitani et al. (Dec. 2003) "Organic Fiels-Effect Transistors with Bending Radius Down to 1mm," *Materials Research Society (MRS) Meeting*, Boston, MA, Dec. 1-5, 93-98.

Sekitani et al. (2005) Bending Experimant on Pentacene Field-Effect Transistors on Plastic Films, *Appl. Phys. Lett.* 86:073511.

Sen et al. (2002) "Nonequilibrium Processes for Generating Silicon Nanostructures in Single-Crystalline Silicon," *Pure Appl. Chem.* 74(9):1631-1641.

Servanti et al. (2005) "Functional Pixel Circuits for Elastic AMOLED displays," *Proc. IEEE* 93:1257-1264.

Sharp et al. (2003) "Holographic Photonic Crystals with Diamond Symmetry," *Phys. Rev. B* 68:205102/1-205102/6.

Sheraw et al. (2002) "Organic Thin-Film Transistor-Driven Polymer-Dispersed Liquid Crystal Displays on Flexible Polymeric Substrates," *Appl. Phys. Lett.* 80:1088-1090.

Shetty et al. (2005) "Formation and Characterization of Silicon Films on Flexible Polymer Substrates," *Mater. Lett.* 59:872-875.

Shtein et al. (Sep. 16, 2004) "Direct, Mask- and Solvent-Free Printing of Molecular Organic Semiconductors," *J. Adv. Mater.* 16(18):1615-1620.

Shtein et al. (Oct. 15, 2004) "Direct Mask-Free Patterning of Molecular Organic Semiconductors Using Organic Vapor Jet Printing," *J. Appl. Phys.* 96(8):4500-4507.

Shull et al. (1998) "Axisymmetric Adhesion Tests of Soft Materials," *Macromol. Chem. Phys.* 199:489-511.

Sim et al. (1993) "An Analytical Back-Gate Bias Effect Model for Ultrathin SOI CMOS Devices," *IEEE Trans. Elec. Dev.* 40:755-765.

Sirringhaus et al. (2003) "Inkjet Printing of Functional Materials," *MRS Bull.* 28:802-806.

Sirringhaus, H. (2005) "Device Physics of Solution-Processed Organic Field-Effect Transistors," *Adv. Mater.* 17:2411-2425.

Sirringhaus et al. (Dec. 15, 2000) "High-Resolution Inkjet Printing of All-Polymer Transistor Circuits," *Science* 290:2123-2126.

Smay et al. (2002) "Colloidal Inks for Directed Assembly of 3-D Periodic Structures," *Langmuir* 18:5429-5437.

Smith et al. (2000) "Electric-Field Assisted Assembly and Alignment of Metallic Nanowires," *Appl. Phys. Lett.* 77(9):1399-1401.

Snow et al. (2005) "High-mobility carbon-nanotube transistors on a polymeric substrate," *Appl. Phys. Lett.*, 86, 033105.

Snow et al. (2003) "Random networks of carbon nanotubes as an electronic material," *Appl. Phys. Lett.*, vol. 82, No. 13, pp. 2145-2147.

Someya et al. (2005) "Integration of Organic FETs with Organic Photodiodes for a Large Area, Flexible, and Lightweight Sheet Image Scanners," *IEEE Trans. Electron Devices* 52:2502-2511.

Someya et al. (2005) "Conformable, Flexible, Large-Area Networks of Pressure and Thermal Sensors with Organic Transistor Active Matrixes," *Proc. Nat. Acad. Sci.* USA 102:12321-12325.

Someya et al. (Jul. 6, 2004) "A Large-Area, Flexible Pressure Sensor Matrix With Organic Field-Effect Transistors for Artificial Skin Applications," *Proc. Nat. Acad. Sci.* USA 101(27):9966-9970.

Son et al. (Jul. 2005) "Formation of Pb/63Sn Solder Bumps Using a Solder Droplet Jetting Method," *IEEE Trans. Electron. Package Manufac.* 28(3):274-281.

Stafford et al. (2004) "A Buckling-Based Metrology for Measuring the Elastic Moduli of Polymeris Thin Films," *Nature Mater.* 3:545-550.

Star et al. (2004) "Nanotube Optoelectric Memory Devices," *Nano Lett.*, vol. 4, No. 9, pp. 1587-1591.

Strano et al. (Mar. 12, 2004) "Understanding the Nature of the DNA-Assited Separation of Single-Walled Carbon Nanotubes Using Fluorescence and Raman Spectroscopy," *Nano Lett.* 4(4):543-550.

Sun et al. (2004) "Fabricating Semiconductor Nano/Microwires and Transfer Printing Ordered Arrays of them onto Plastic Substrates," *Nano Lett.* 4:1953-1959.

Sun et al. (2005) "Photolithographic Route to the Fabrication of Micro/Nanowires of III-V Semiconductors," *Adv. Funct. Mater.* 15:30-40.

Sun et al. (2005) "Bendable GaAs Metal-Semiconductor Field-Effect Transistors Formed with a Printed GaAs Wire Arrays on Plastic Substrates," *Appl. Phys. Lett.* 87:083501.

Sun et al. (2005) "Advances in Organic Field-Effect Transistors," *J. Mater. Chem.* 15:53-65.

Sundar et al. (2004) "Elastomeric Transistor Stamps: Reversible Probing of CHaarge Transport in Organic Crystals," Science 303:1644-1646.

Suo et al. (Feb. 22, 1999) "Mechanics of Rollable and Foldable Film-on-Foil Electronics," Appl. Phys. Lett. 74(8):11771179.

Sze, S. (1994) "Semiconductor Sensor Technologies," In; Semiconductor Sensors, John Wiley and Sons: New York pp. 17-95.

Sze, S. (1985) "Lithography and Etching," In; Semiconductor Devices: Physics and Technology, New York: Wiley, pp. 428-467.

Sze, S. (1988) "Ion Implantation," In; VLSI Technology, Mcgraw-Hill, 327-374, 566-611.

Sze et al. (1985) Semiconductor Devices, Physics and Technology, $2^{nd}$ ed., Wiley, New York, pp. 190-192.

Tanase et al. (2002) "Magnetic Trapping and Self-Assembly of Multicomponent Nanowires," J. Appl. Phys. 91:8549-8551.

Tang et al. (2005) "One-Dimensional Assemblies of Nanoparticles: Preparation, Properties, and Promise," Adv. Mater. 17:951-962.

Tao et al. (2003) "Langmuir-Blodgett Silver Nanowire Monolayers for Molecular Sensing Using Surface-Enhanced Raman Spectroscopy," Nano Lett. 3:1229-1233.

Tate et al. (2000) "Anodization and Microcontact Printing on Elotroless Silver: Solution-Based Fabrication Procudures for Low-Voltage Electronic Systems with Organic Acitve Components," Langmuir 16:6054-6060.

Theiss et al. (1998) "PolySilicon Thin Film Transistors Fabricated at 100° C. on a Flexible Plastic Substrate," IEDM 98:257-260.

Toader et al. (2004) "Photonic Band Gaps Based on Tetragonal Lattices of Slanted Pores," Phys. Rev. Lett. 90:233901/1-233901/4.

Toader et al. (2004) "Photonic Band Gap Architectures for Holographic Lithography," Phy. Rev. Lett. 043905/1-043905/4.

Tong (1999) "Stresses in Bonded Wafers," In; Semiconductor Wafer Bonding: Science and Technology, John Wiley; New York, pp. 187-221.

Trau et al. (1997) "Microscopic Patterning of Orientated Mesoscopic Silica Through Guided Growth," Nature 390:674-676.

Trentler et al. (1995) "Solution-Liquid-Solid Growth of Crytalline III-V Semiconductors: An Analogy to Vapor-Liquid-Solid Growth," Science 270:1791-1794.

Ucjikoga, S. (2002) "Low-Temperature Polycrystalline Silicon Thin-Film Transistor Technologies ofr System-on-Glass Displays," MRS Bull. 27:881-.

Velev et al. (1997) "Porous silica via colloidal crystallization," Nature 389:447-448.

Vilan et al. (2000) "Molecular Control Over Au/GaAs Diodes," Nature 404:166-168.

Vlasov et al. (2001) "On-Chip Natural Assembly of Silicon Photonic Bandgap Crystals," Nature 414:289-293.

Voss, D. (2000) "Cheap and Cheerful Circuits," Nature 407:442-444.

Wagner et al. (2003) "Silicon for Thin-Film Transistors," Thin Solid Films 430:15-19.

Wagner et al. (2005) "Electronic Skin: Architecture and Components," Physica E 25:326-334.

Wang et al. (2005) "Electronically Selective Chemical Functionalization of Carbon Nanotubes: Correlation between Raman Spectral and Electrical Responses," J. Am. Chem. Soc., 127:11460-11468.

Wang et al. (2003) "A Solution-Phase, Precursor Route to Polycrystalline $SnO_2$ Nanowores That Can Be Used for Gas Sensing under Ambient Conditions," J. Am. Chem. Soc. 125:16176-16177.

Weber et al. (Ja. 2004) "A Novel Low-Cost, High Efficiency Micromachined Silicon Solar Cell," IEEE Electron Device Lett. 25(1):37-39.

Whang et al. (2003) "Large-Scale Hierarchical Organization of Nanowire Arrays for Integrated Nanosystems," Nano Lett. 3(9):1255-1259.

Willner et al. (2002) "Functional Nanoparticle Architectures for Senoric, Optoelectronic, and Bioelectronic Applications," Pure Appl. Chem. 74(9):1773-1783.

Wind et al. (May 20, 2002) "Vertical Scaling of Carbon Nanotube-Field-Effect Transistors Using Top Gate Electrodes," Appl. Phys. Lett. 80(20):3871-3819.

Won et al. (2004) "Effect of Mechanical and Electrical Stresses on the Performance of an a-Si:H TFT on Plastic Substrate," J. Electrochem. Soc. 151:G167-G170.

Written Opinion, Corresponding to International Application No. PCT/US06/32125, Completed Feb. 29, 2008.

Wu et al. (2002) "Growth of Au-Catalyzed Ordered GaAs Nanowire Arrays by Molecular-Beam Epitaxy," Appl. Phys. Lett. 81:5177-5179.

Wu et al. (2003) "Growth, Branching, and Kinking of Molecular-Beam Epitaxial (110) GaAs Nanowires," Appl. Phys. Lett. 83:3368-3370.

Wu et al. (2001) "Amorphous Silicon Crystallization and Polysilicon Thin Film Transistors on SiO2 Passivated Steel Foil Substrates," Apple. Surf. Sci 175-176:753-758.

Wu et al. (2001) "Thermal Oxide of Polycrystalline Silicon on Steel Foil as a Thin-Film Transitor Gate Dielectric," Appl. Phys. Lett. 78:3729-2731.

Xia et al. (2003) "One-Dimensional Nanostructures: Synthesis, Characterization and Applications," Adv. Mater. 15:353-389.

Xia et al. (1998) "Soft Lithography," Annu. Rev. Mater. Sci. 28:153-184.

Xia et al. (1999) "Unconventional Methods for Fabricating and Patterning Nanostructures," Chem. Rev. 99:1823-1848.

Xia (1998) "Soft Lithography" Angew. Chem. Int. Ed. 37:551-575.

Xiao et al. (2003) "High-mobility thin-film transistors based on aligned carbon nanotubes," Appl. Phys. Lett., vol. 83, No. 1, pp. 150-152.

Yang et al. (1997) "Mesoporous Silica with Micrometer-Scale Desgns," Adv. Mater. 9:811-814.

Yang et al. (2002) "Creating Periodic Three-Dimensional Structures by Multibeam Interface of Visible Laser," Chem. Mater. 14:2831-2833.

Yang et al. (2000) "Stability of Low-Temperature Amorphous Silicon Thin Film Transistors Formed on Glass and Transparent Plastic Substrates," J. Vac. Sci. Technol. B 18:683-689.

Yang, P. (2005) "The Chemistry and Physics of Semiconductor Nanowires," MRS Bull. 30:85-.

Yanina et al. (2002) "Terraces and ledges on (001) spinel surfaces," Surf. Sci., 513:L402-L412.

Yao et al. (Mar. 2000) "High-Field Effect Electrical Transport in Single-Walled Carbon Nanotubes," Phys. Rev. Lett. 84(13):2941-2944.

Yeh et al. (1994) "Fluidic Self-Assembly for the Integration of GaAs Light-Emitting Diodes on Si Substrates," IEEE Photon. Technol. Lett. 6:706-708.

Yin et al. (2000) "A Soft Lithography Approach to the Fabrication of Nanostructures of Single Crystalline Silicon with Well-Defined Dimensions and Shapes," Adv. Mater. 12:1426-1430.

Yin et al. (2005) "Colloidal Nanocrystal Synthesis and the Organic-Inorganic Interface," Nature 437:664-670.

Yoon et al. (2005) "Low-Voltage Organic Field-Effect Transistors and Inverters Enabled by Ultrathin Cross-Linked Polymers as Gate Dielectrics," J. Am. Chem. Soc. 127:10388-10395.

Yu et al. (2003) "Two- Versus Three-Dimensional Quantum Confinement in Indium Phosphide Wires and Dots," Nat. Mater. 2:517-520.

Yu et al. (2003) "Solution-Liquid-Solid Growth of Soluble GaAs Nanowires," Adv. Mater. 15:416-419.

Yurelki et al. (Jul. 24, 2004) "Small-Angle Neutron Scattering from Surfactant-Assisted Aqueous Dispersions of Carbon Nanotubes," J. Am. Chem. Soc. 126(32):9902-9903.

Zakhidov et al. (1998) "Carbon Structure with Three-Dimensional Periodicity at Optical Wavelengths," Science 282:897-901.

Zaumseil et al. (2003) "Nanoscale Organic Transistors that use Source/Drain Electrodes Supported by High Resolution Rubber Stamps," Appl. Phys. Lett. 82(5):793-795.

Zaumseil et al. (2003) "Three-Dimensional and Multilayer Nanostructures Formed by Nanotransfer Printing," Nano Lett. 3(9):1223-1227.

Zhang et al. (2001) "Electric-field-directed growth of aligned single-walled carbon nanotubes," Appl. Phys. Lett., vol. 79, No. 19. pp. 3155-3157.

Zheng et al. (2004) "Shape-and Solder-Directed Self-Assembly to Package Semiconductor Device Segments," *Appl. Phys. Lett.* 85:3635-3637.

Zhou et al. (2004) "p-Channel, n-Channel Thin Film Transistors and p-n. Diodes Based on Single Wall Carbon Nanotube Networks," *Nano Lett.* 4:2031-2035.

Zhou et al. (2002) "An Efficient Two-Photon-Generated Photoacid Applied to Positive-Tone 3D Microfabrication," *Science* 296:1106-1109.

Zhou et al. (2005) "Band Structure, Phonon Scattering, and the Performance Limit of Single-Walled Carbon Nanotube Transistors," *Phys. Rev. Lett.* 95:146805.

Zhu et al. (2005) "Spin on Dopants for High-Performance Singel-Crystal Silicon Transistors on Flexible Plastic Substrates," *Appl. Phys. Lett.* 86:133507.

Zhou et al. (2006) "High-Contrast Organic Light-Emitting Devices with Improved Electrical Characteristics," *Appl. Phys. Lett.* 88:233505.

Ago et al. (2006) "Synthesis of horizontally-aligned single walled carbon nanotubes with controllable density on sapphire surface and polarized Raman spectroscopy," *Chem. Phys. Lett.*, 421:399-403.

Ago et al. (2005) "Aligned growth of isolated single walled carbon nanotubes programmed by atomic arrangement of substrate surface," *Chem. Phys.Lett.*, 408:433-438.

Huang et al. (2004) "Long and oriented single-walled carbon nanotubes grown by ethanol chemical vapor deposition," *J. Phys. Chem.*, 108:16451-16456.

Ismach et al. (2005) "Carbon nanotube graphoepitaxy: highly oriented growth by faceted nanosteps," *J. Am. Chem. Soc.*, 127:11554.

Jang et al. (2003) "Lateral growth of aligned multiwalled carbon nanotubes under electric field," *Solid State Commun.*, 126:305-308.

Khakani et al. (2006) "Lateral growth of single wall carbon nanotubes on various substrates by means of an "all-laser" synthesis approach," *Diam. Relat. Mater.*, 15:1064-1069.

Leek et al. (2005) "Charge pumping in carbon nanotubes ," *Phys. Rev. Lett.*, 95, 256802.

Su et al. (2000) "Lattice-oriented growth of single-walled carbon nanotubes," *J. Phys. Chem.*, 104(28):6505-6508.

Truong et al. (2006) "Soft lithography using acryloxy perfluoropolyether composite stamps," *Langmuir*, 23(5):2898-2905.

Xiong et al. (2006) "Aligned millimeter-long carbon nanotube arrays grown on single crystal magnesia," *Carbon*, 44:969-973.

* cited by examiner

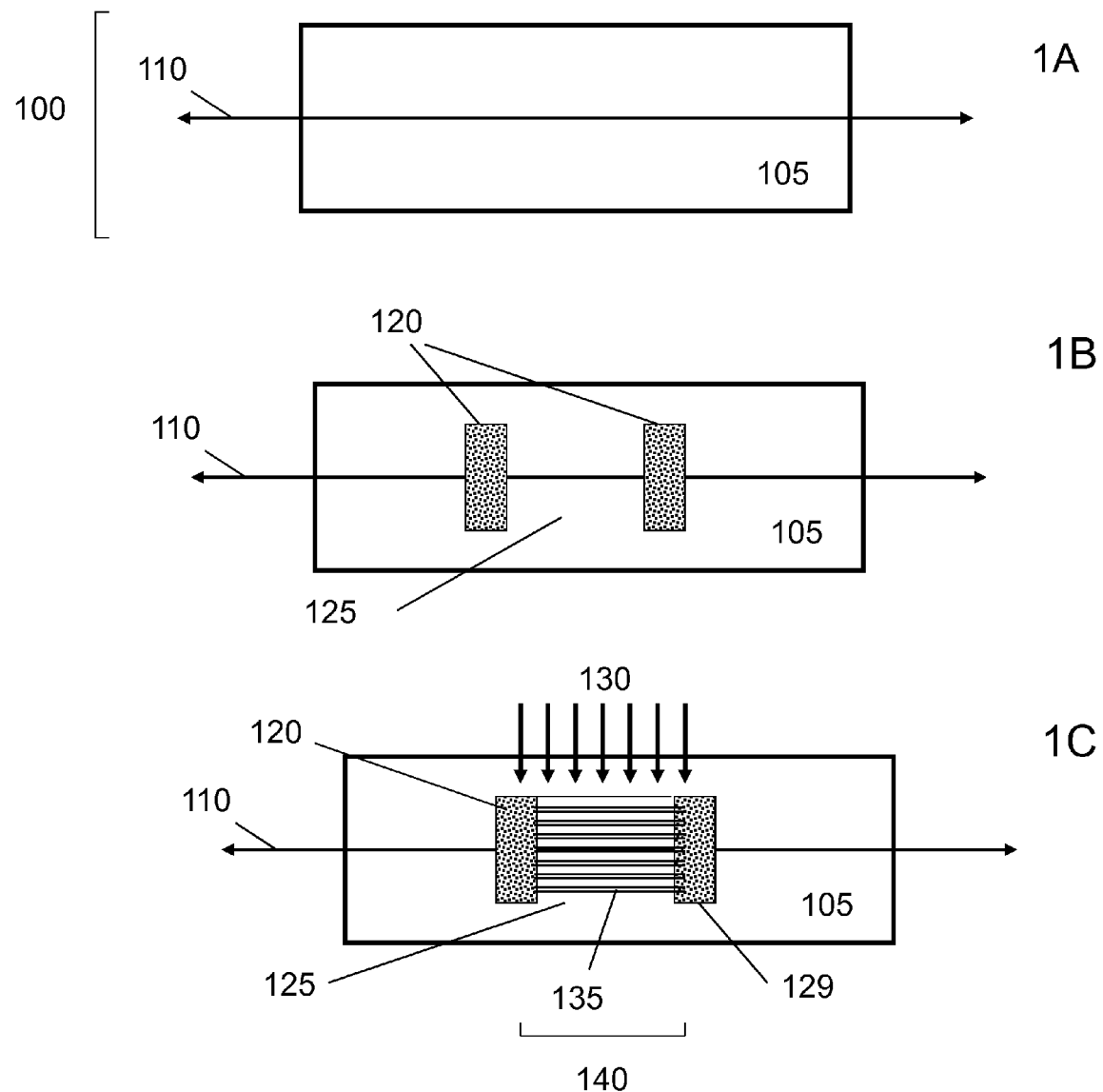

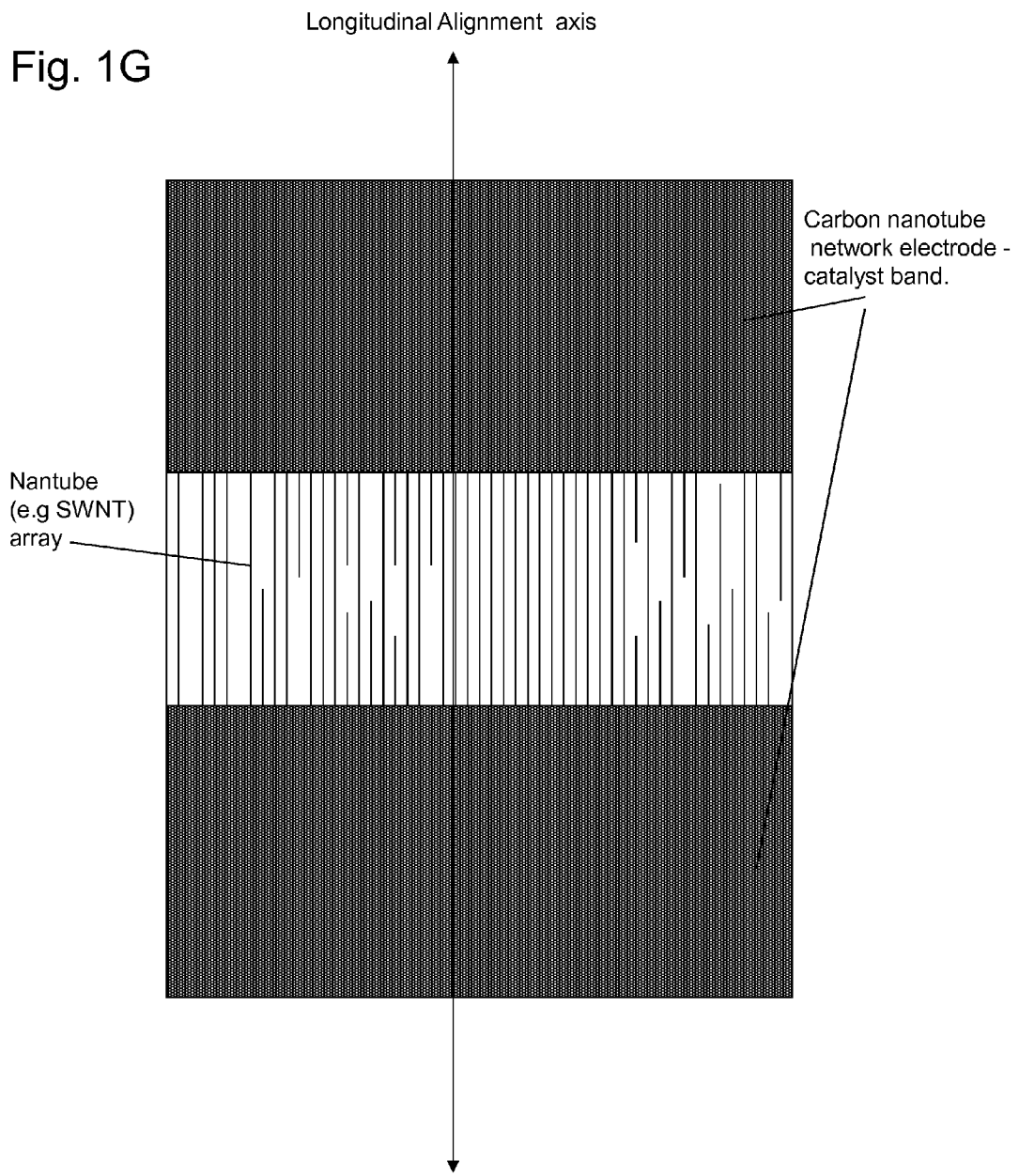

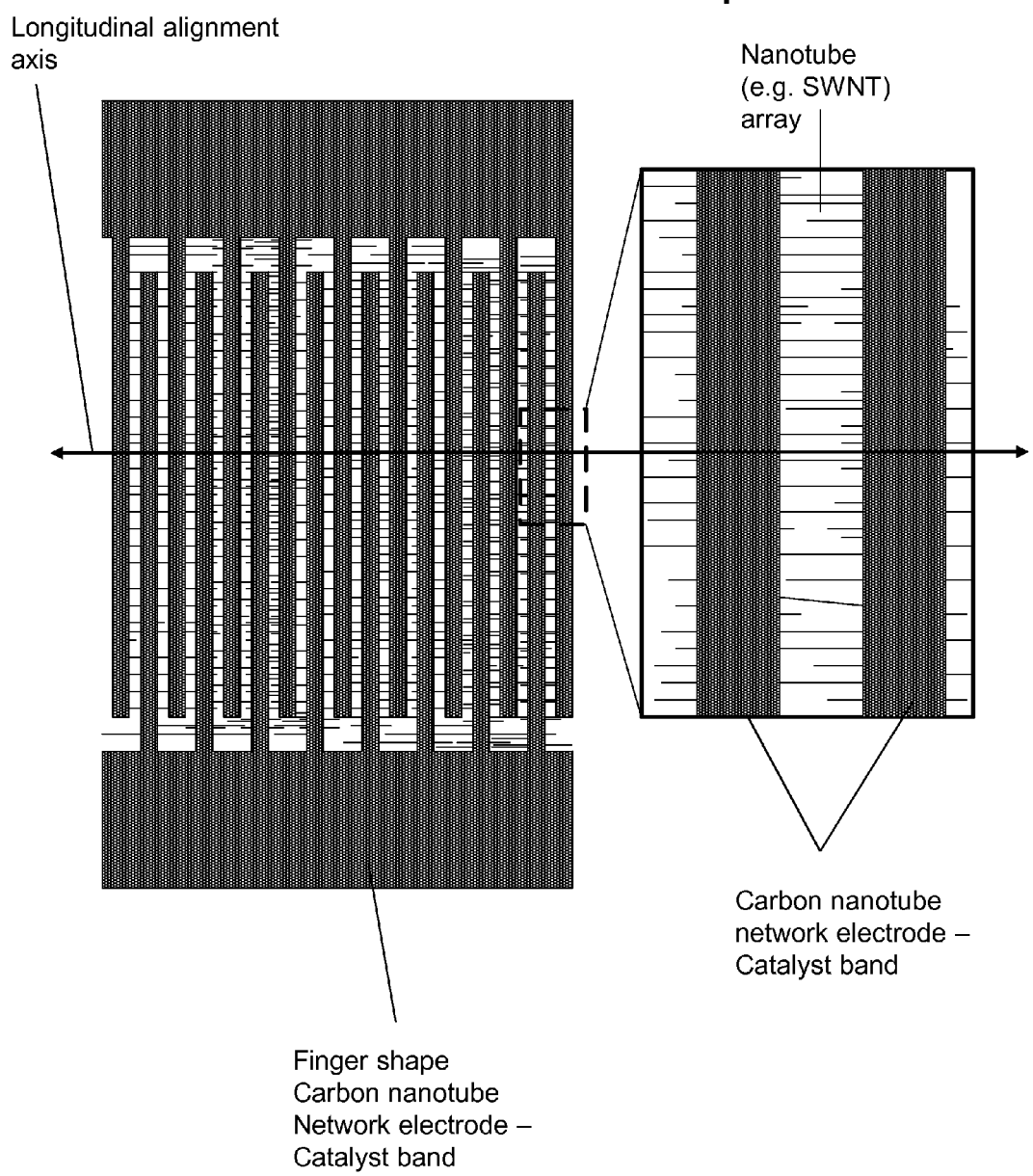

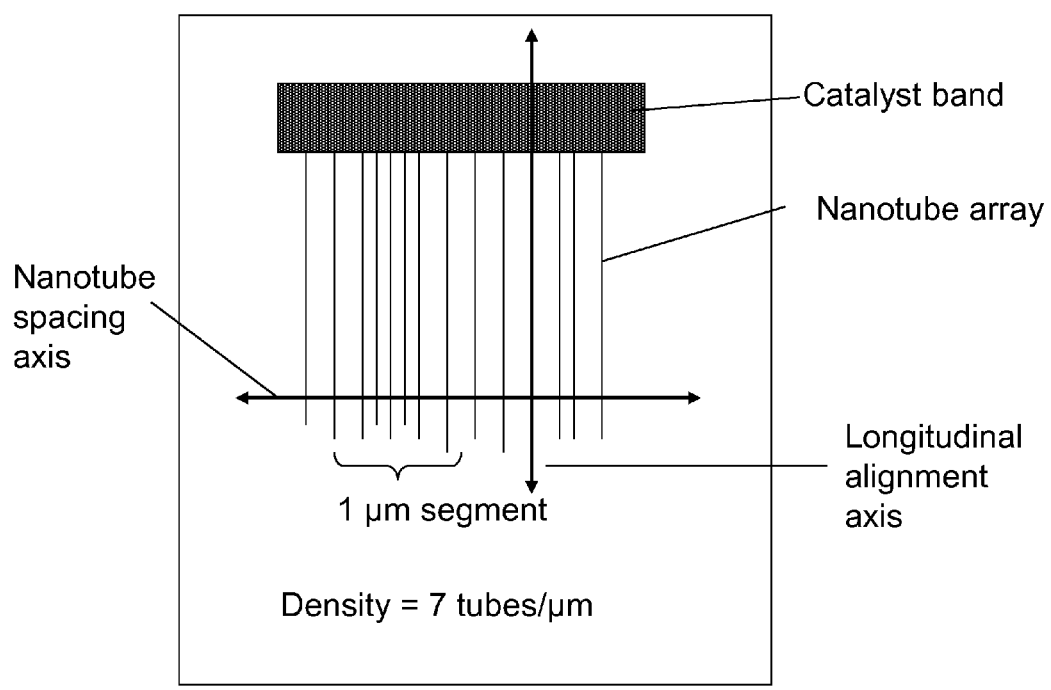

9a

9b

9c

9d 10a
10b
10c
10d 12a　　　　12b　　　　12c

13a

13b

15a

15b

15c

16a

16b

16c

Fig. 24D1 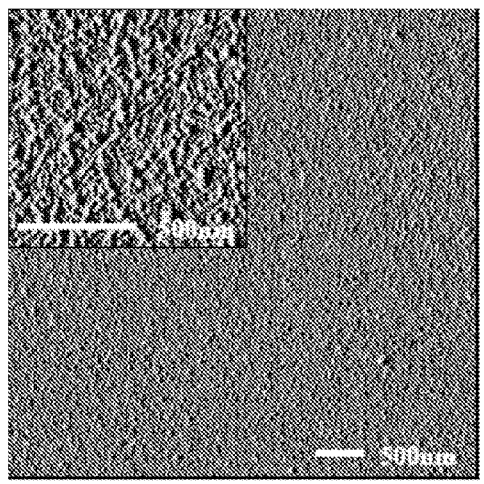
Fig. 24D2 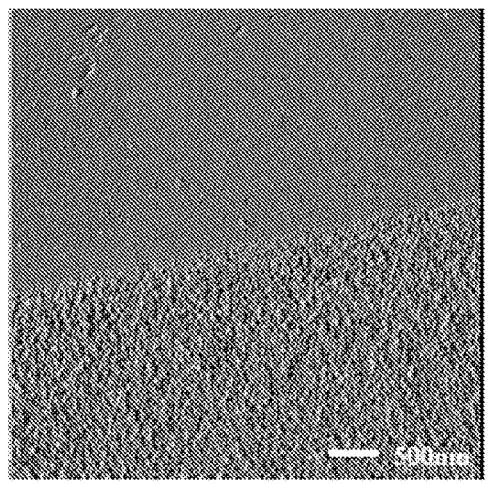

METHODS OF MAKING SPATIALLY ALIGNED NANOTUBES AND NANOTUBE ARRAYS

CROSS-REFERENCE TO RELATED APPLICATIONS

This application is a continuation of U.S. application Ser. No. 11/465,317, filed on Aug. 17, 2006, now abandoned, which claims priority under 35 U.S.C. 119(e) to U.S. provisional Patent Application 60/779,714 filed Mar. 3, 2006, each of which are hereby incorporated by reference in its entirety.

STATEMENT REGARDING FEDERALLY SPONSORED RESEARCH OR DEVELOPMENT

This invention was made with United States Government support under Contract Number 0403489 awarded by the National Science Foundation (NSF). The United States Government has certain rights in the invention.

BACKGROUND OF INVENTION

Since their discovery in the early 1990s, a great deal has been learned about the composition and properties of carbon nanotube materials. This research has demonstrated that carbon nanotubes exhibit extraordinary mechanical, electronic and chemical properties, which has stimulated substantial interest in developing applied technologies exploiting these properties. Accordingly, substantial research is currently directed at developing techniques for organizing, arranging and incorporating carbon nanotube materials into useful functional devices.

Carbon nanotubes are allotropes of carbon comprising one or more cylindrically configured graphene sheets and are classified on the basis of structure as either single walled carbon nanotubes (SWNTs) or multiwalled carbon nanotubes (MWNTs). Typically having small diameters ($\approx$1-30 nanometers) and large lengths (up to several microns), SWNTs and MWNTs commonly exhibit very large aspect ratios (i.e., length to diameter ratio$\approx 10^3$ to about $10^5$). Carbon nanotubes exhibit either metallic or semiconductor electrical behavior, and the energy band structure of nanotube materials varies considerably depending on their precise molecular structure and diameter. Doped nanotubes having intercalants, such as potassium, have been prepared and the central cavities of nanotubes have been filled with a variety of materials, including crystalline oxide particles, metals, gases and biological materials.

Single walled carbon nanotubes (SWNTs), in particular, are identified as candidates for functional materials in a new generation of high performance passive and active nanotube based electronic devices. SWNTs are made up of a single, contiguous graphene sheet wrapped around and joined with itself to form a hollow, seamless tube having capped ends similar in structure to smaller fullerenes. SWNTs typically have very small diameters ($\approx$1 nanometer) and are often present in curled, looped and bundled configurations. SWNTs are chemically versatile materials capable of functionalization of their exterior surfaces and encapsulation of materials within their hollow cores, such as gases and molten materials.

A number of unique properties of SWNTs make these materials particularly attractive for a variety of emerging applied technologies including, sensors, light emissive systems, flexible electronics, and novel composite materials. First, SWNTs are believed to have remarkable mechanical properties, such as tensile strengths at least 100 times that of steel or any known other known fiber. Second, the electron transport behavior in SWNTs is predicted to be essentially that of a quantum wire, and the electrical properties of SWNTs have been observed to vary upon charge transfer doping and intercalation, opening up an avenues for potentially tuning the electrical properties of nanotube materials. Finally, SWNTs have also be demonstrated to have very high intrinsic field affect mobilities (e.g., about 9000 $cm^2V^{-1} s^{-1}$) making them interesting for possible applications in nano-electronics.

The astonishing electronic and mechanical properties of SWNTs, together with the ability to deposit nanotubes onto plastics and other unusual device substrates, make them well-suited for use in large-scale distributed electronics for steerable antenna arrays, flexible displays, and other systems. Recent work indicates that random networks of SWNTs can form effective semiconductor layers for thin-film transistor- (TFT-) type devices. The device mobilities that have been achieved with these networks are, however, still far below the intrinsic tube mobilities inferred from measurements of transistors that incorporate an individual tube (or small number of tubes) spanning the gap between the source and drain electrodes. The resistance at the many tube-tube contacts that are inherent in the networks may limit charge transport.

Large-scale, dense longitudinally aligned arrays of SWNTs may provide a means of avoiding these problems, thereby offering the possibility to exceed the device mobilities that can be achieved in the networks. Forming such arrays, patterning their coverage and, possibly, interfacing them with SWNT networks represent significant experimental challenges. Some degree of alignment can be obtained by casting SWNTs from solution, but dense arrays formed in this fashion usually involve large numbers of overlapping tubes. In addition, transistors that use solution-deposited tubes typically have properties that are inferior to those of transistors built with tubes grown directly on the device substrate by, for example, chemical vapor deposition (CVD). Arrays of SWNTs can be generated from random networks, formed by CVD growth or solution deposition, via orientation-selective ablation with linearly polarized laser pulses. This process has the advantage that it does not rely on chemistries or solvents that can alter the properties of the tubes; it is, however, an inherently destructive process. Electric-field assisted growth or fast heating can produce aligned arrays of SWNTs. However, high-density arrays that cover large areas have not been demonstrated with these techniques; device implementations have also not been described.

It will be appreciated from the foregoing that there is currently a need in the art for improved methods for generating arrays of longitudinally aligned carbon nanotubes useful for realizing passive and active nanotube electronic devices for a range of applications. Methods are needed that are capable of generating nanotube arrays on device substrates, including polymer and other flexible substrates, having specific, preselected nanotube orientations, positions and physical dimensions. Methods are needed that are capable of generating dense nanotube arrays capable of providing electronic properties, such as field affect mobilities, necessary for enabling high performance electronic devices.

SUMMARY OF THE INVENTION

The present invention provides methods of making spatially aligned carbon nanotubes and arrays of spatially aligned carbon nanotubes, including longitudinally aligned nanotubes and nanotube arrays. Methods of the present invention provide methods of making and patterning nanotubes and nanotube arrays on selected regions of a receiving surface of substrate. Methods of the present invention further provide a means for organizing, assembling and integrating carbon nanotubes and nanotube arrays into functional devices, device arrays and systems. The present nanotube assembly and integration methods include methods of transferring arrays of spatially aligned carbon nanotubes prepared by the present methods to other substrates, including polymer substrates and functional substrates (e.g., substrates prepatterned with functional device components), in a manner providing selected nanotube array positions and orientations.

The present invention also provides arrays of longitudinally aligned nanotubes patterned on substrate surfaces, and systems, networks and devices thereof. Nanotube arrays of the present invention, and related devices, have well defined spatial orientations, physical dimensions, nanotube densities and/or positions. The present invention also provides high coverage, dense nanotube arrays and high performance electronic devices and device arrays incorporating high coverage, dense nanotube arrays.

In one aspect, the present invention provides methods for making an array of longitudinally aligned carbon nanotubes on a substrate. In an embodiment, a guided growth substrate having a receiving surface is provided. The receiving surface of the substrate is patterned with carbon nanotube growth catalyst, thereby generating a two dimensional pattern of catalyst-containing regions of the receiving surface and regions of the receiving surface having substantially no catalyst present. Nanotubes are grown on the substrate via a guided growth mechanism that is at least partially mediated by the guided growth substrate patterned with catalyst. In one embodiment, for example, at least a portion of the nanotubes grow along nanotube growth axes parallel to at least one principle guided growth axis of the guided growth substrate and at least a portion of the nanotubes grow the from the catalyst-containing regions to regions of the receiving surface having substantially no catalyst present. Growth of nanotubes in this manner results in formation of at least one nanotube array on the receiving surface comprising a plurality of spatially aligned carbon nanotubes having a longitudinal alignment parallel to each other and parallel to the principle guided growth axis of the guided growth substrate. In a useful embodiment for a variety of device applications, nanotubes of the nanotube array comprise SWNTs.

In the context of this description, the term "guided growth" refers to growth of carbon nanotubes on a substrate wherein growth of individual nanotubes occurs along nanotube growth axes having selected spatial orientations, such as an orientation that is parallel to at least a portion of the growth axes of other nanotubes in the array and/or an orientation that is parallel to a principle guided growth axis of the guided growth substrate. Guided growth in the present invention arises from electrostatic, energetic and/or steric interactions between the nanotubes and or catalyst with the guided growth substrate. For example, guided growth of nanotubes may occur via a mechanism involving energetically favorable van der Waals interactions between growing nanotubes and/or catalyst particles with the lattice arrangement of the guided growth substrate. Guided growth of nanotubes may also occur via interaction of the nanotubes and/or catalyst particles with step edges, microfacets, nanofacets or other surface features of the receiving surface of the guided growth substrate.

Guided growth of nanotubes in this aspect of the invention may be carried out in any manner resulting in formation of nanotubes and/or nanotube arrays that are aligned with selected spatially orientations. Exposure of catalyst patterned guided growth substrates, such as single crystalline sapphire or single crystalline quartz substrates, to nanotube precursors results in growth of nanotubes along growth axes that are parallel to the principle guided growth axis of the guided growth substrate. In one embodiment, for example, chemical vapor deposition of nanotube precursors on catalyst patterned single crystalline sapphire or single crystalline quartz substrates generates an array of parallel nanotubes having spatially orientations parallel to the principle guided growth axis. Useful guided growth substrates in this aspect of the present invention include a Y-cut quartz substrate having a cut angle selected over the range of about 0 degrees to about 42.75 degrees, such as 0-Y cut quartz substrate (0 degree mis-cut), AT cut quartz substrate (35.15 degree mis-cut), and a ST cut quartz substrate (42.75 degree mis-cut).

In a method of the present invention useful for providing nanotube arrays that can be easily integrated into functional devices, the substrate is patterned with catalyst such that bands of catalyst-containing regions are provided in specific orientations and positions on the receiving surface, and are separated from each other by regions of the receiving surface having substantially no catalyst present. In one embodiment, for example, parallel bands of catalyst are provided on the receiving surface that are separated from each other and are longitudinal oriented along longitudinal catalyst alignment axes oriented perpendicular to the principle guided growth axis of the guided growth substrate. This parallel pattern of catalyst causes nanotube growth along segments of the nanotube growth axes positioned between the bands of catalyst and results in an array of longitudinally aligned nanotubes extending between parallel bands of catalyst.

The position of catalyst bands patterned on the substrate define the starting points for nanotube growth and the presence of low catalyst surface concentrations in the regions of the receiving surface positioned between catalyst bands ensures that growth of the nanotubes extends along growth axes that are substantially parallel to the principle guided growth axis of the guided growth substrate. Selection of the band positions and spatially orientations, therefore, provides a means of controlling the specific positions and spatial orientations of nanotube arrays on the receiving surface. The presence of regions of the receiving surface having low catalyst densities between catalyst bands in this embodiment also allows for formation of high density nanotube arrays because electrostatic interactions between adjacent nanotubes during growth can disrupt their orientation is minimized by maintaining a parallel longitudinal alignment during nanotube growth. In addition, minimizing such disruptive interactions and nanotube crossing between adjacent nanotubes by using the present guided growth methods also generates nanotube arrays having enhanced electronic properties, such as high field effect mobilities. Useful catalyst-containing regions of the present invention have a surface concentration of catalyst selected from the range of about 10 particles $\mu m^{-2}$ to about 1000 particles $\mu m^{-2}$, and regions of the receiving surface having substantially no catalyst present have a surface concentration of catalyst less than or equal to about 1 particles $\mu m^{-2}$. Bands of catalyst useful in the present invention have lengths selected from the range of about 100 nanometers to about 100 microns and widths selected from the range of about 100 nanometers to about 100 microns. In one embodiment, first and second bands of catalyst are provided that are separated by a distance along a catalyst band separation axis selected from the range of about 100 nanometers to about 500 microns. Ferritin is a particularly useful catalyst in the present methods as is can be efficiently patterned on substrate surfaces using spin casting techniques and because it does not tend to aggregate so it can uniformly coat selected areas of a substrate surface.

Any shape or spatial orientation of catalyst bands patterned on the receiving surface capable of providing nanotube arrays having useful physical dimensions, spatial orientations and properties may be used in the present invention. In one embodiment, for example, first and second bands of catalyst are provided in a parallel longitudinal oriented configuration, wherein adjacent first and second bands extend along parallel catalyst alignment axes and are separated from each other by a selected distance along an axis parallel to the principle guided growth axis and perpendicular to the catalyst alignment axes. First and second catalyst bands are positioned in selected areas of the receiving surface. This configuration results in growth of the nanotubes from the first and second bands along segments of nanotube growth axes extending between the bands. Nanotube growth generates an array of nanotubes extending from the first band to the second band and having a selected position and spatial orientation on the receiving surface of the substrate.

Patterning the receiving surface with carbon nanotube growth catalyst may be carried out by any method wherein catalyst is distributed or deposited to selected regions of the receiving surface, for example regions having preselected physical dimensions and positions. Preferred methods are capable of depositing catalyst to discrete, well defined regions of the receiving surface, while at the same time preventing catalyst from accumulating on other regions of the receiving surface, particularly in regions of the receiving surface separating adjacent bands of catalyst. Useful catalyst patterning techniques include soft lithography, photolithography, solution printing and/or deposition and electrochemical substrate patterning methods. In one embodiment of the present invention, the step of patterning the receiving surface with carbon nanotube growth catalyst comprises the steps of: (1) providing a mask to selected portions of the receiving surface, thereby generating masked regions and unmasked regions of the receiving surface; (2) spin casting the nanotube growth catalyst onto the unmasked regions; and (3) removing the mask, thereby patterning the receiving surface with carbon nanotube growth catalyst.

In another aspect the present invention provides methods of assembling longitudinally aligned carbon nanotubes and arrays of longitudinally aligned carbon nanotubes on substrates via guided deposition. In these embodiments, a solution containing one or more nanotubes, and optionally surfactant, is contacted with a receiving surface of a guided deposition substrate. Interactions between the substrate, the carbon nanotubes and, optionally a carrier liquid, solvent and/or surfactant, provide for positioning and orientating at least a portion of the nanotubes along alignment axes having selected spatial orientations and positions including longitudinally aligned parallel orientations. In these embodiments, therefore, the guided deposition substrate provides a means of aligning and organizing carbon nanotubes, and optionally arrays of longitudinally aligned nanotubes, in selected spatial orientations and positions on substrate surfaces.

In the context of this description, the expression "guided deposition" refers to assembling and/or positioning materials, such as carbon nanotubes, on a substrate via a concerted process providing for spatial orientation, position and/or organization selected with good accuracy and precision. In some embodiments, guided deposition methods of the present invention provide a means of assembling and/or positioning carbon nanotubes in spatial orientations and positions selected such that their longitudinal axes are parallel to a principle guided deposition axis of a guided deposition substrate. In some embodiments, guided deposition methods of the present invention provide a means of assembling and/or positioning carbon nanotubes in orientations and positions wherein their longitudinal axes are parallel to each other.

Guided deposition in some embodiments of the invention arises from a self assembly process mediated by electrostatic, energetic and/or steric interactions between the deposited nanotubes and the guided deposition substrate. For example, guided deposition of nanotubes in the present methods may occur via a mechanism involving electrostatic interactions, such as dipole-dipole and/or van der Waals interactions, between nanotubes and the receiving surface of a guided deposition substrate that control a self alignment process resulting in selective longitudinal orientation and position of the deposited nanotubes, for example providing for longitudinal orientation wherein the lengths of deposited nanotubes are aligned along parallel alignment axes. Guided deposition of nanotubes may also occur via self assembly processes wherein nanotubes in the solution phase sample a range of spatial orientations and positions, and ultimately assume longitudinally aligned orientations corresponding to lower energy and stable configurations. Guided deposition methods include methods wherein contact between deposited tubes and the guided deposition surface is carried out without the use of a nanotube solution, for example by contacting the guided deposition surface with carbon nantoubes in the gas phase.

In one embodiment, the invention provides a method for assembling one or more longitudinally aligned carbon nanotube(s) on a substrate via guided deposition. In an embodiment, a method of the present invention comprises the steps of providing a solution containing a carbon nanotube and providing a guided deposition substrate having a receiving surface. The solution containing the carbon nanotube is contacted with the receiving surface of the guided deposition substrate; wherein the nanotube(s) longitudinally aligns along an alignment axis parallel to at least one principle guided deposition axis of the guided deposition substrate. This embodiment of the present invention is useful for assembling and positioning one or more longitudinally aligned carbon nanotubes on a substrate. This aspect of the present invention also include methods of making arrays of longitudinally aligned nanotubes further comprising the step of providing a solution containing a plurality of nanotubes. In an embodiment, the solution having a plurality of nanotubes is contacted with the receiving surface of the guided deposition substrate, wherein at least a portion of the nanotubes longitudinally align along alignment axes parallel to each other and also parallel to at least one principle guided deposition axis of the guided deposition substrate, thereby generating an array of longitudinally aligned nanotubes.

Optionally, methods of these embodiments may further comprise the step of removing carrier liquid or solvent comprising the solution after deposition of the nanotubes to the receiving surface of the guided deposition substrate. In exemplary methods, carrier liquid or solvent is removed by evaporation or drying, initiated for example by raising the temperature of the guided deposition substrate, or by transport removal processes, such as flowing off or spinning off the carrier liquid or solvent. Optionally, methods of these embodiments of the present invention may further comprise the step of washing the longitudinally aligned nanotube(s) after guided deposition, for example by exposure of the longitudinally aligned nanotubes to a solvent such as methanol, acetone or water capable of removing solution components, such as surfactants and/or other additives, from the nanotubes and/or nanotube array. Optionally, methods of these embodiments may further comprise the step of transferring the longitudinally aligned nanotube(s) from the guided deposition substrate to another substrate, such as a flexible substrate, for example using contact printing transfer techniques. Methods of the present invention include transfer steps wherein a plurality longitudinally aligned nanotubes are transferred to another substrate in a manner retaining, at least in part, the relative spatial orientations and positions of longitudinally aligned nanotubes. Useful transfer methods include, but are not limited to, soft lithography techniques such as dry transfer contact printing.

Guided deposition substrates have a composition, structure and/or morphology that provides for selective alignment and positioning of solution deposited nanotubes, including providing for parallel longitudinal alignment of solution deposited nanotubes. Guided deposition substrates useful in the present methods include guided growth substrates, as described above. Exemplary guided deposition substrates include single crystalline quartz crystal substrates, such as single crystalline Y-cut quartz substrates having a cut angle selected over the range of about 0 degrees to about 42.75 degrees, single crystalline 0-Y cut quartz substrates (0 degree mis-cut), AT cut quartz substrates (35.15 degree mis-cut), ST cut quartz substrates (42.75 degree mis-cut). Guided deposition substrates useful in the present invention include materials other than quartz substrates such as miscut single crystalline sapphire substrates.

Contact between the solution containing nanotubes and the guided deposition substrate may be carried by any means capable of establishing physical contact between the solution and at least one receiving surface of the substrate. In some methods, the entire receiving surface of the guided deposition substrate is contacted with the nanotube containing solution. Alternatively, the present invention includes methods wherein the nanotube containing solution is contacted with only selected regions, rather than all, of the receiving surface. The present methods include use of solution patterning deposition techniques capable of providing a preselected pattern of solvent or carrier liquid containing nanotubes (e.g., droplets of solvent or carrier liquid) to the guided deposition substrate. Exemplary means of providing contact between the nanotube solution and guided deposition substrates include, but are not limited to, solution printing and fluidic delivery techniques wherein solution is delivered to the guided growth substrate, optionally to selected regions of the guided deposition substrate. Solution printing techniques useful in the present invention include, but are not limited to, ink jet printing, thermal transfer printing, and screen printing. Fluidic delivery techniques useful in the present invention include methods and systems whereby solution is flowed, dispersed or provide dropwise onto the receiving surface of the guided deposition substrate, and include, but are not limited to, microfluidic methods and systems, nanofluidic methods and systems, spin coating, capillary action printing/deposition technique, drop drying, bar coating, and spray coating. Other useful methods for applying and/or patterning solution containing nanotubes include substrate surface masking techniques, for example via photolithographic methods.

Methods of this aspect of the present invention may further comprise purification, washing and material removal processing of longitudinally aligned nanotubes so as to provide longitudinally aligned nanotubes having selected chemical and/or physical properties, such as purified longitudinally aligned nanotubes, longitudinally aligned nanotubes having a selected size distributions or selected other physical dimensions or longitudinally aligned nanotubes having selected electronic properties (e.g., semiconducting nanotubes). In one embodiment, for example, longitudinally aligned nanotubes are washed after guided deposition to remove unwanted materials, such as residual surfactants. Washing to remove unwanted materials may be carried out using any technique that does not substantially disrupt the longitudinal alignment of the deposited nanotubes and includes processing steps wherein longitudinally aligned nanotubes are contacted with a solvent capable of dissolving residual surfactant, such as acetone, methanol, ethanol, iso-propanol, or water. In this aspect, contact been the nanotubes and solvent may be achieved by flowing solvent onto the longitudinally aligned nanotubes or dipping the longitudinally aligned nanotubes in solvent. In other useful embodiments, unwanted materials, such as residual surfactants, incomplete nanotubes, nanotubes have undesired physical dimensions and carbonaceous impurities (e.g. fullerenes, graphene and amorphous carbon), are thermally removed (e.g. burned off or oxidized) or evaporated. In an embodiment useful for making semiconductor devices and device arrays, the methods of the present invention may optionally comprise the step of selectively removing metallic nanotubes, for example using pyrolytic methods.

In some embodiments, the composition of the nanotube containing solution is selected so as to enhance the extent of guided deposition achieved by the present methods, to optimize longitudinal alignment and positioning for desired applications and/or to control the number and density of longitudinally aligned nanotubes deposited on the guided deposition substrate. Solutions useful in the guided deposition methods of the present invention may comprise single walled nanotubes, multiwalled nanotubes or a mixture of both single walled nanotubes, multiwalled nanotubes. The present invention includes, for example, methods wherein the concentration of nanotubes in the solution contacted with the guided deposition substrate is selected over the range from 1 nanogram $cm^{-3}$ to 1 gram $cm^{-3}$. Selection of the concentration of nanotubes in the solution controls, at least in part, the density and/or extent of parallelism of longitudinally aligned nanotubes deposited on the guided deposition substrate. In some embodiments, for example, the number of the misaligned nanotubes deposited on the guided growth substrate increases statistically with the nanotube density of the nanotube containing solution. In some embodiments, the size distribution of the nanotubes in the solution contacted with the guided deposition substrate is selected to enhance guided deposition, for example by selection of nanotubes having lengths selected over the range of 100 nanometers to 10 microns and having diameters range from 1 nanometers to 100 nanometers.

Nanotube containing solutions useful in the present methods may further comprise a carrier liquid or solvent, including, but not limited to, aqueous and nonaqueous solvents and carrier liquids. In some embodiments, the nanotube solution comprises a water solvent or carrier liquid. Optionally, nanotube solutions useful in the present methods further comprise one or more additional solution components or additives providing solution phase properties beneficial for guided deposition, such as surfactants, stabilizing agents, preservatives, diluents and/or antiagglomeration agents.

In one embodiment, for example, the nanotube containing solution further comprises a surfactant component, such as poly-oxyethylene octyl phenyl ether (also known as Triton X) surfactant. Use of surfactants in nanotube solutions in the present methods is important in some embodiments for preventing nanotube-nanotube interactions that can disrupt alignment via guided deposition, such as nanotube-nanotube interactions resulting in nanotube aggregation into bundles.

Surfactants useful in the present guided deposition methods include, but are not limited to, poly-oxyethylene octyl phenyl ether, polyethylene glycol dodecyl ether, polyethylene glycol sorbitan monolaurate, polyvinylpyrrolidone, PEO(polyethyleneoxide)-PBO(polybutyleneoxide)-PEO triblock polymer, and PEO-PPO(polypropyleneoxide)-PEO triblock polymer. For homogeneous dispersion of individual nanotubes in solution phase, for example, the concentration of surfactant in the nanotube containing solution should be higher than the critical micelle concentration (CMC). When the surfactant concentration is lower than CMC, nanotubes are aggregated and form bundles. In the bundles, the nanotubes are entangled randomly and, therefore, the guided deposition can be disrupted. Each surfactant has specific CMC value, for example CMC of sodium dodecyl sulfate (SDS) surfactant in water is 8 mM (See e.g., Nanotechnology, vol. 15, 1450-1454). Typically, the CMC values of surfactants are over the range of 0.5 to 100 mM. However, the values can be variable, dependent on molecular structures of surfactants, counter ions, pH, temperature, and other conditions (See e.g., "Surfaces, Interfaces, and Colloids", Drew Myers, Wiley-VCH, 1999).

In some embodiments, the surfactants chosen for nanotube solutions in guided deposition methods of the present invention have selected chemical and physical properties. For example, the present methods include use of surfactants capable of adsorption to carbon nanotubes in selected orientations that promote or enhance guided deposition, such as adsorption of nantoubes with surfactant alignment along the length of the nanotubes. Some surfactant molecules in solution adsorb the sidewalls of a carbon nanotube. The nature of the mechanism of surfactant-nanotube side wall adsorption condition is important under some processing conditions for providing guided deposition of carbon nanotubes to a guided deposition substrate. For example, it has been reported that sodium dodecyl sulfate (SDS) surfactant molecules randomly adsorb on a carbon nanotube (See e.g., Journal of American Chemistry Society, vol. 126, 9902-9903 (2004)), while polyoxyethylene octyl phenyl ether (Triton-X) surfactant molecules adsorb with selective alignment along the length of the nanotubes (See e.g., Nano Letters, vol. 3, 269-273 (2003)). When the SDS or sodium dodecyl bezensulfonate (SDBS) is tested as the surfactant in an aqueous carbon nanotube containing solution, exposure to the guided deposition substrate results in a larger number of the carbon nanotubes that are randomly oriented than that observed for nanotube solutions having the Triton-X surfactant, which shows very good alignment. Therefore, surfactants that exhibit selective alignment upon adsorption to nanotube sidewalls, for example surfactant alignment along the length of the nanotube, are particularly useful for guided deposition methods of the present invention.

Nanotube solutions used in guided deposition methods of the present invention may comprise antiagglomeration agents and/or additives other than or in addition to surfactants. For example, DNA or other polymers, such as poly(vinylpyrrolidone) and polystyrene sulfonate, comprise useful antiagglomeration additives for suspending individual nanotubes in solution [See, e.g., (i) Nano Letters, vol. 3, 1379-1382 (2003), (ii) Nano Letters, vol. 4, 543-550 (2004)]. These polymeric solution additives wrap the sidewalls of carbon nanotubes to prevent the aggregation of tubes, similar to the adsorption of surfactants. Therefore, DNA and other polymers exhibiting this functionality are also useful as solution additives providing for guided deposition.

Guided growth and deposition methods of the present invention may further comprise a number of optional steps. In one embodiment, a method of the present invention further comprises the step of annealing the guided growth or deposition substrate to a temperature equal to or greater than 900 degrees Celsius for an annealing time equal to or greater than 8 hours prior to nanotube growth or deposition. In one embodiment, the method further comprises the step of oxidizing the carbon nanotube growth catalyst and/or reducing the carbon nanotube growth catalyst. In one embodiment, the method further comprises the step of immobilizing the longitudinally aligned carbon nanotubes on the substrate, for example, by applying a laminating layer or other coating on top of the nanotubes. In one embodiment, the method further comprises the step of providing one or more electrodes in contact with at least a portion of the longitudinally aligned carbon nanotubes in the array.

In one embodiment, the present method further comprises the step of purifying the nanotube array. In one embodiment, for example, the methods of the present invention further comprise the step of removing at least a portion of the catalyst particles on the receiving surface and/or catalyst particles physically associated with the nanotube array, for example by dissolution. In some embodiments, the present invention further comprises the step of removing carbonaceous impurities, such as incomplete and/or damage nanotubes, fullerenes, graphite and/or grapheme layers, for example using pyrolytic purification methods known in the art. In some embodiments, the present methods further comprise the step of selectively removing some, but not all, of the nanotubes in the array, for example removing nanotubes in the array having specific electrical (e.g. according to bandgap), geometrical (e.g. diameter or length or orientation or placement), thermal (e.g. according to heat flow props) or optical (e.g. absorption cross section) properties. This aspect of the present methods is useful for providing nanotube arrays having overall chemical, physical, optical, thermal and/or electrical properties useful for a selected device application.

In another embodiment, methods of the present invention further comprise the step of transferring at least a portion of an array of longitudinally aligned carbon nanotubes from the receiving surface of the guided growth or guided deposition substrate to a receiving surface of a different substrate. The present methods are capable of transferring arrays and portions of arrays of longitudinally aligned carbon nanotubes to a very wide variety of substrates including, but not limited to, transfer of nanotube arrays to a flexible substrate such as a polymer substrate, or transfer of nanotube arrays to a substrate prepatterned with functional device components such as electrodes, metal layers, dielectric layers, semiconductor layers, diodes, insulators, other nanotube layers or any combinations of these device components. Transfer of the nanotube array from one substrate to another may be accomplished using soft lithography techniques, such as contact printing methods, optionally using elastomeric stamps, or using solution assisted transfer techniques, such as solution printing methods. Use of soft lithographic transfer methods, such as contact printing, is beneficial for some device fabrication applications because these methods are capable of maintaining the relative spatial orientations of nanotubes in the array during transfer of nanotube arrays and capable of achieving good placement accuracy with respect to transfer to specific positions or regions on a substrate surface.

Guided growth and guided deposition methods of the present invention are capable of generating longitudinally aligned carbon nanotubes and arrays of longitudinally aligned carbon nanotubes that exhibit a high degree of parallelism. In some embodiments, for example, guided growth and guided deposition methods produce an array of longitudinally aligned carbon nanotubes that are parallel to each other and/or or parallel to a principle guided growth or deposition axis of a guide growth or deposition substrate with deviations from absolute parallelism equal to or less than 20 degrees, preferably equal to or less than 10 degrees for some applications, and more preferably equal to or less than 2 degrees for some applications. The present invention provides nanotube arrays and related methods of making nanotube arrays wherein at least 95% of the nanotubes in the array extend lengths that are parallel to each other and/or parallel to a principle guided growth or deposition axis of a guide growth or deposition substrate with deviations from absolute parallelism of less than or equal to 20 degrees.

Guided growth and guided deposition methods of the present invention are also capable of generating longitudinally aligned carbon nanotubes and arrays of longitudinally aligned carbon nanotubes that exhibit a high degree of linearity. In the context of this description, the expression "degree of linearity" refers to a characteristic of a carbon nanotube that reflects the deviations in the center positions of the tube along its length as compared to a perfectly straight line that best approximates the shape of the nanotube. Carbon nanotubes exhibiting a high degree of linearity have a conformation that approximates a perfectly straight line. The expression high degree of linearity is intended, however, to include nanotube conformations having some deviations from a perfectly straight line that best approximates the shape of the nanotube. In some embodiments, nanotubes exhibiting a high degree of linearity have deviations from perfect linearity along their entire lengths that are less than or equal to about 50 nanometers, and in embodiments useful for some applications have deviations from perfect linearity along their entire lengths that are less than or equal to about 10 nanometers. In some embodiments, nanotubes exhibiting a high degree of linearity have deviations from perfect linearity that are less than or equal to about 50 nanometers per micron of length, and in embodiments useful for some applications have deviations from perfect linearity that are less than or equal to about 2 nanometers per micron of length. Guided growth and guided deposition methods of the present invention are capable of making nanotube arrays wherein at least 95% of the nanotubes in the array exhibit a high degree of linearity.

In another aspect, the present invention provides arrays of longitudinally aligned carbon nanotubes and patterns of a plurality of nanotube arrays having selected relative orientations. The present nanotube arrays, and nanotubes therein, may have a wide range of physical dimensions, spatial alignments and nanotube densities useful for many device applications. In one embodiment, longitudinally aligned nanotubes of the array have lengths that are parallel to within 20 degrees of each other, preferably for some applications within 10 degrees of each other, and more preferably for some applications within 1 degree of each other, and/or parallel to within 20 degrees of a principle guided growth or deposition axis of the guided growth or deposition substrate, preferably for some applications within 10 degrees of a principle guided growth or deposition axis of the guided growth or deposition substrate, and more preferably for some applications within 1 degree of a principle guided growth or deposition axis of the guided growth or deposition substrate. The present invention provides nanotube arrays wherein most nanotubes in the array are longitudinally aligned and extend lengths parallel to each other. In one embodiment, for example, the invention provides nanotube arrays wherein at least 95% of the longitudinally aligned nanotubes in the array extend lengths that are parallel to each other and/or parallel to a principle guided growth or deposition axis of the guided growth or deposition substrate with deviations from absolute parallelism of less than or equal to 20 degrees. The present invention provides nanotube arrays wherein at least 95% of the nanotubes in the array exhibit a high degree of linearity.

In one embodiment, the present invention provides dense nanotube arrays having a density of longitudinally aligned carbon nanotubes greater than or equal to about 1 nanotubes $\mu m^{-1}$, preferably for some applications greater than or equal to about 5 nanotubes $\mu m^{-1}$, and more preferably for some applications greater than or equal to about 10 nanotubes $\mu m^{-1}$. In the context of this description, the unit of density of nanotubes per micron for refers to the number of tubes that intersect a 1 micron segment of an axis oriented perpendicular to the longitudinal axis of the nanotubes (See, FIG. 1I). Dense nanotube arrays provided by the present invention have surface concentrations of nanotubes greater than or equal to about 1 nanotube $\mu m^{-2}$, preferably for some applications greater than of equal to about 5 nanotube $\mu m^{-2}$, and more preferably for some applications greater than or equal to about 10 nanotube $\mu m^{-2}$ for some applications.

Under some processing conditions there is an interplay between the density of the nanotube array and the extent of parallelism of the longitudinally aligned nanotubes achieved via guided growth or guided deposition. At high densities (e.g. greater than about 50 nanotubes $\mu m^{-1}$), for example, interactions between nanotubes in the array may lead to disruption of their parallel alignment and/or bundling of nanotubes in the array. Such nanotube-nanotube interactions, including Van der Waals interactions between nanotubes, may decrease the impact of the guided growth or deposition substrate on growth or deposition conditions of the nanotubes in the array. In addition, processing conditions employing very high catalyst surface concentrations (e.g. greater than about 10,000 particles $\mu m^{-2}$) may result in disruptive nanotube growth or movement out of the plane of the receiving surface of the substrate. This problem can be at least partially mitigated by using very narrow bands of catalyst, such as bands having widths less than about 1 micron. For many guided growth or guided deposition processing conditions, parallelism to within 1 degree between longitudinally aligned nanotubes can be achieved for nanotube densities equal to or less than about 10 tubes $\mu m^{-1}$, and parallelism to within 10 degrees between longitudinally aligned nanotubes can be achieved for nanotube densities greater than or equal to about 10 tubes $\mu m^{-1}$.

In an embodiment, longitudinally aligned carbon nanotubes and arrays of longitudinally aligned carbon nanotubes of the present invention exhibit a high degree of linearity. This attribute of the present invention is beneficial because kinks or bends in a nanotube may affect significantly their electronic and optical properties. Thus, longitudinally aligned carbon nanotubes having a high degree of linearity tend to exhibit uniform and well characterized electronic and optical characteristics.

In one embodiment, longitudinally aligned carbon nanotubes in an array of the present invention have diameters selected over the range of about 0.5 nanometer to about 4 nanometers and have lengths that extend distances selected from the range of about 100 nanometers to 500 microns. Nanotube arrays of this aspect of the present invention include large area nanotube arrays having areas selected over the range of about 100 $nm^2$ to 10 $cm^2$. The composition of matter of this aspect may further comprise additional functional components in physical, thermal and/or electrical contact with the nanotube array, such as electrodes, dielectric layers, insulators, source, drain and/or gate electrodes, semiconductor layers, diodes, other nanotube structures or any combination of these.

Nanotube arrays of the present invention include printable nanotube arrays. In this context, "printable" refers to a nanotube array that can be transferred from a mother substrate to the receiving surface(s) of a receiving substrate. Transfer of printable nanotube arrays of the present invention may be carried out by soft lithographic techniques, such as contact printing methods, optionally using elastomeric stamps, and via other transfer methods, such as solution printing methods. Printable nanotube arrays of the present invention are capable of being transferred to a receiving substrate with good placement accuracy. Nanotubes in printable arrays of the present invention and patterns of printable nanotube arrays are capable of transferred with good fidelity.

Nanotube arrays of this aspect of the present invention may be supported by a range of substrates having compositions and morphologies useful for selected device applications. In one embodiment, an array of longitudinally aligned carbon nanotubes is provided on (i.e. supported by) a guided growth or deposition substrate, wherein nanotubes in the array are parallel to within 10 degrees of a principle guided growth or deposition axis of the guided growth or deposition substrate, preferably parallel to within 1 degree of a principle guided growth or deposition axis of the guided growth or deposition substrate. Use of guided growth or deposition substrates in compositions of the present invention is beneficial because nanotube arrays having a high degree of parallelism with respect to the longitudinal orientation of nanotubes may be grown by guided growth and/or guided deposition methods on such substrate materials. The present invention includes, however, arrays of longitudinally aligned carbon nanotubes provided on substrates other than guided growth or deposition substrates. Useful substrates for supporting nanotube arrays of the present invention include but are not limited to polymer substrates, such as flexible plastic substrates, dielectric substrates, metal substrates, ceramic substrates, glass substrates and semiconductor substrates. The present invention also includes nanotube arrays provided on (i.e. supported by) contoured substrates, including curved substrates, curved rigid substrates, concave substrates, and convex substrates. The present invention also includes nanotube arrays provided on (i.e. supported by) more unusual substrate materials, such as paper, wood and rubber.

A significant benefit of the nanotube arrays of this aspect is that they are compatible with transfer, integration and/or assembly processing steps at temperatures that are compatible with most flexible substrates, including polymer materials such as thermoplastic materials, thermoset materials, reinforced polymer materials and composite polymer materials. The present nanotube array compositions are equally applicable, however, to transfer, assembly and/or integration on rigid and/or brittle substrates including ceramic materials, glasses, dielectric materials, conductors, metals and semiconductor materials. The applicability of these nanotube array compositions to transfer to and/or device fabrication on brittle materials arises from the very low force imparted to substrates using the transfer methods of the present invention, such as contact printing methods using elastomeric stamps.

Carbon nanotubes of arrays of the present invention are preferably SWNTs for some applications and, optionally are provided in non-overlapping, parallel spatial orientations. Carbon nanotubes of the array may be free standing (i.e. not affixed or adhered to the receiving surface) on a substrate, or, alternatively, may be immobilized on a substrate, for example by the presence of a laminating, adhesive or coating layer. Arrays comprising free standing longitudinally aligned nanotubes are beneficial for some applications as they can be manipulated, purified or transferred to other substrates in a manner retaining the longitudinal spatial alignments of individual nanotubes.

In one embodiment, a nanotube array of the present invention is supported by a guided growth substrate and further comprises first and second bands of carbon nanotube growth catalyst patterned on the receiving surface of the guided growth substrate. In this embodiment, first and second bands of catalyst are separated from each other and are longitudinal oriented along longitudinal catalyst alignment axes oriented perpendicular to the principle guided growth axis of the guided growth substrate. In one embodiment, a least a portion of the nanotubes of the array are in contact with first and second bands and extend from the first band to the second band. Optionally, first and second bands of catalyst are separated by a region of the receiving surface having substantially no catalyst. Compositions of this embodiment include nanotube arrays positioned between first and second catalyst bands.

In another aspect the present invention provides mechanical, electronic, optical and thermal devices, and components thereof, comprising an array of longitudinally aligned nanotubes or a plurality of such nanotube arrays. Device of this aspect of the present invention include passive nanotube devices and active nanotube devices. Exemplary nanotube devices of the present invention include, but are not limited to, (1) nanotube transistors, such as thin film nanotube transistors; (2) passive or tunable nanotube optical devices, such as polarizers and transparent conductors, (3) nanotube sensors based on measured changes in physical (e.g. optical, electrical, etc) responses of the nanotubes and/or arrays of nanotubes, (4) electronic, mechanical, thermal or optical systems wherein the arrays provide enhanced or different mechanical properties, (5) nanotube mechanical devices, such as MEMS (microelectromechanical systems) or NEMS (nanoelectromechanical systems) wherein nanotubes and/or arrays of nanotubes move either together or independently, (6) devices wherein the nanotube arrays provide enhanced or different thermal properties (e.g. heat sinking or dissipation layers), or where the nanotube arrays generate heat due to optical or electrical stimulation, (7) devices wherein nanotube arrays provide control over the wetting properties or surface energies of a substrate (either in a static configuration, or one in which the surface properties are tuned), (8) nanotube based light emitting diode based systems or lasers, in which the arrays generate light either through electrical stimulation of electrons and holes or through blackbody radiation associated with current flow through them, and (9) passive or active RF devices using aligned carbon nanotubes In one aspect, an electrical device of the present invention further comprises one or more electrodes that are in contact (e.g. physical contact, electrical contact etc.) with one or more nanotube arrays such that at least a portion of the nanotubes of the array are responsive to an electric potential applied to the electrodes. In one embodiment, for example, first and second electrodes are provided, wherein the electrodes are separated from each other and are in electrical contact with at least a portion of the longitudinally aligned nanotubes of the array. For some embodiments, it is useful that electrodes are positioned a distance of at least at least 1 micron from any bands of catalyst on the receiving surface. First and second electrodes may comprise source and drain electrodes of a transistor, which may optional further include a gate electrode. Alternatively, first and second electrodes may comprise electrical contacts of a sensor, photovoltaic device, diode, microelectromechanical or nanoelectromechanical systems and light emitting systems (e.g. light emitting diodes and lasers).

In some embodiments, electronic devices of the present invention comprising nanotube arrays provide mechanically flexible systems.

The present invention also includes device arrays comprising spatially organized arrays of longitudinally aligned nanotubes in contact with one or more electrodes. Device arrays of the present invention may provide large area, electronic systems and/or mechanically flexible systems. An advantage of printable nanotube arrays of the present invention is that they may be fabricated in patterns on a mother substrate and subsequently patterned, for example using contact printing techniques, over large areas of a receiving substrate with good placement accuracy and high fidelity.

Guided growth and guided deposition methods of the present invention have their own benefits and limitations which make them suitable for a range of different device fabrication applications. For example, guided growth methods do not generally require exposure of longitudinally aligned nanotubes to surfactants, solvents, carrier liquids and/or other solution additives, which in some cases changes in the physical, optical and/or mechanical properties of the nanotubes. Guided deposition methods on the other hand, separate nanotube synthesis and alignment/orientation processing steps, therefore, allowing processing conditions for these steps to be independently selected, adjusted and/or optimized. Both guided deposition and growth methods are capable of generating highly dense arrays of longitudinally aligned nanotubes. This functional capability of guided growth methods of the present invention is beneficial for many device fabrication applications as the sheer number of and density of nanotubes in the array provides good electronic behavior (and/or optical properties) despite the existence of electronic (and/or optical) heterogeneity.

In another embodiment, the present invention provides a method for making an array of longitudinally aligned carbon nanotubes on a substrate comprising the steps of: (1) providing a guided growth substrate having a receiving surface; (2) patterning the receiving surface with carbon nanotube growth catalyst, thereby generating a two dimensional pattern of catalyst-containing regions of the receiving surface and regions of the receiving surface having substantially no catalyst present; and (3) growing nanotubes on the substrate via guided growth, wherein the nanotubes grow along nanotube growth axes parallel to a principle guided growth axis of the guided growth substrate, and wherein nanotubes grow from the catalyst-containing regions to the regions of the receiving surface having substantially no catalyst present, thereby making the array of longitudinally aligned carbon nanotubes on the substrate.

In another embodiment, the present invention provides a method for assembling a longitudinally aligned carbon nanotube on a substrate; comprising the steps of: (1) providing a solution containing said carbon nanotube; (2) providing a guided deposition substrate having a receiving surface; (3) contacting said solution containing said carbon nanotube with said receiving surface of said guided deposition substrate; wherein said nanotube longitudinally aligns along an alignment axis parallel to a principle guided deposition axis of said guided deposition substrate, thereby assembling said longitudinally aligned carbon nanotube on said substrate.

In another embodiment, the present invention provides a method for making an array of longitudinally aligned carbon nanotubes on a substrate comprising the steps of: (1) providing a solution containing said carbon nanotubes; (2) providing a guided deposition substrate having a receiving surface; and (3) contacting said solution containing said carbon nanotubes with said receiving surface of said guided deposition substrate; wherein at least a portion of said nanotubes longitudinal align along alignment axes parallel to a principle guided deposition axis of said guided deposition substrate, thereby making said array longitudinally aligned carbon nanotubes on said substrate.

In another aspect the present invention provides a method for making an array of longitudinally aligned carbon nanotubes on a substrate comprising the steps of: (1) providing said carbon nanotubes in the gas phase; (2) providing a guided deposition substrate having a receiving surface; and (3) contacting said carbon nanotubes in the gas phase with said receiving surface of said guided deposition substrate; wherein at least a portion of said nanotubes longitudinal align along alignment axes parallel to a principle guided deposition axis of said guided deposition substrate, thereby making said array longitudinally aligned carbon nanotubes on said substrate.

BRIEF DESCRIPTION OF THE DRAWINGS

FIGS. 1A-1E provides a schematic drawing illustrating a method for making an array of longitudinally aligned carbon nanotubes on a guided growth substrate. FIGS. 1A-1E provide schematic diagrams of individual steps in the present methods.

FIGS. 1G and 1H provides schematic diagrams of nanotube array electrical devices of the present invention wherein carbon nanotube network electrode-catalyst bands are patterned in a manner such that arrays of longitudinally aligned carbon nanotubes grow between the bands. FIG. 1G provides a schematic diagram illustrating an electrical device having two parallel carbon nanotube network electrode-catalyst bands and FIG. 1F provides a schematic diagram illustrating an electrical device wherein carbon nanotube network electrode-catalyst bands are provided in a finger electrode configuration.

FIG. 1I provides a schematic drawing illustrating the concept of nanotube density as used in the present description.

FIG. 10 FIG. 10a provides a schematic illustration of the crystallographic planes in right-handed α-quartz and the orientation of a Y-cut wafer. FIG. 10b provides a Cross section of an AT-cut quartz wafer and the 011 planes; the miscut angle is 2° 58'. FIG. 10c provides a Schematic illustration of atomic steps and alignment direction on the surface. FIG. 10d provides a AFM image of terraced surface structures after thermal annealing.

FIG. 11 FIG. 11a shows an AFM image of SWNTs grown on single-crystal quartz substrates. The inset of FIG. 11a shows a high-magnification view of a pair of tubes (scale bar is 75 nm). Arrows in the main image highlight "kinks" in the tubes. FIG. 11b shows a large-area SEM image of aligned tubes. FIG. 11c shows an AFM image of aligned and unaligned SWNTs. FIG. 11d provides a scatter plot of the tube orientation versus the tube diameter.

FIGS. 12a-12c show SEM images of SWNTs grown on quartz annealed at 900° C. for different times: Fig. a:10 min, Fig. b: 4 h, and Fig. c: 7 h.

FIG. 13a provides a Raman spectrum of the tangential mode (G line) of an individual SWNT for various angles α between the polarization direction of the incident laser beam and the tube axis. FIG. 13b provides a plot showing the angular dependence of the Raman intensity at 1614 cm$^{-1}$. The solid line corresponds to a $\cos^2 \alpha$ form. The Raman signal reaches a maximum when the laser beam is polarized along the tube.

FIG. 14a-14c provide AFM images of aligned SWNTs grown on single-crystal quartz substrates using different densities of catalyst particles (2000, 100, and 20 times dilution, respectively). FIGS. 14d-14f provide large-area SEM images of tubes grown in this fashion.

FIGS. 15a-15c provide SEM images of high-density aligned tubes at different magnifications. These images show that aligned SWNTs are homogeneous over large areas.

FIGS. 16a and 16b provide SEM images of channel regions of TFT devices that have their channels (5-μm channel lengths) aligned parallel and perpendicular to the orientation of the aligned SWNTs, respectively. FIG. 16c provides a plot of current-voltage response of TFTs with 100-μm channel length and 250-μm channel width, oriented parallel and perpendicular to the direction of alignment in arrays of SWNTs.

FIG. 21: FIG. 21A shows that the nanotubes have sharp corners, and the orientation histogram in FIG. 21 B shows three main angles.

As shown in FIG. 24A, thousands of solution deposited SWNTs are aligned parallel to the principle guided deposition axis within 15° angular deviation. FIG. 24D shows atomic force microscopy (AFM) images of SWNTs deposited on an annealed quartz guided deposition substrate having a (aminopropyl)triethoxysilane (APTS) coated outer surface. FIG. 24D(1) shows a center region of the dried droplet and FIG. 24D(2) shows an edge area of the dried droplet.

DETAILED DESCRIPTION OF THE INVENTION

Figure 1D:
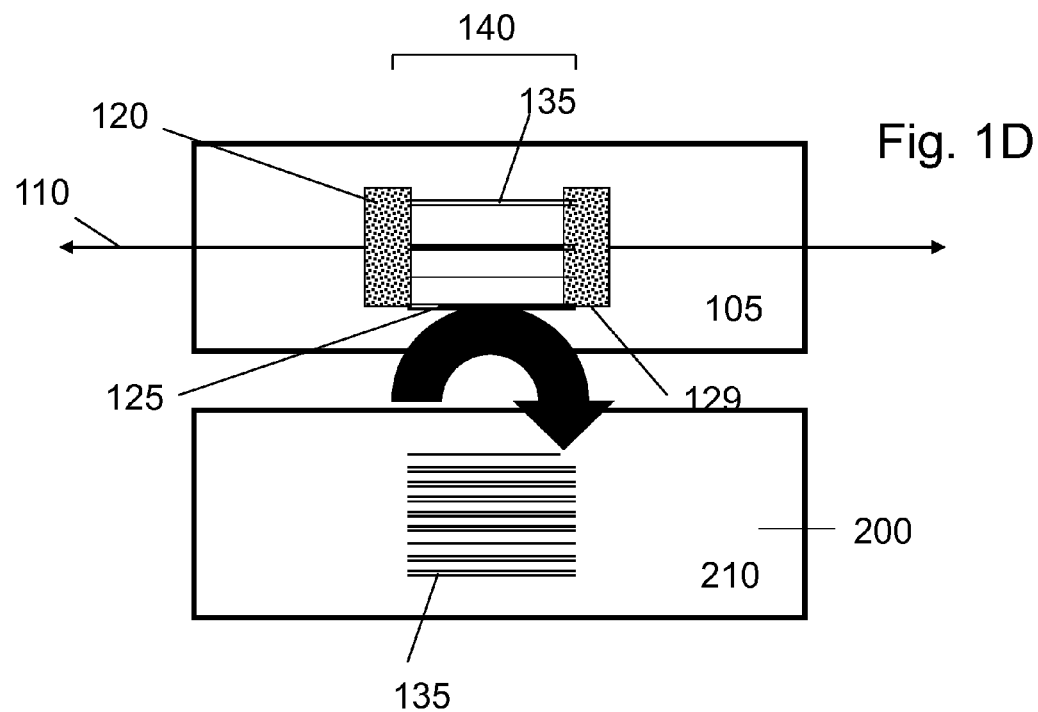

Referring to the drawings, like numerals indicate like elements and the same number appearing in more than one drawing refers to the same element. In addition, hereinafter, the following definitions apply:

"Carbon nanotube" and "nanotube" are used synonymously refers to allotropes of carbon comprising one or more cylindrically configured graphene sheets. Carbon nanotubes include single walled carbon nanotubes (SWNTs) and multiwalled carbon nanotubes (MWNTs Carbon nanotubes typically have small diameters (≈1-10 nanometers) and large lengths (up to several microns), and therefore may exhibit very large aspect ratios (length to diameter ratio≈10$^3$ to about 10$^5$). The longitudinal dimension of a nanotube is its length and the cross sectional dimension of a nanotube is its diameter (or radius).

"Longitudinally aligned nanotubes" have lengths extending in longitudinal directions that are parallel. In some embodiments, longitudinally aligned nanotubes have a linear geometry wherein their lengths assume a substantially straight configuration (i.e. with deviations from linearity equal to or less than about 20%). As used in this context, the term "parallel" refers to a geometry in which the lengths of carbon nanotubes are substantially equidistant from each other for at least a portion of the points along their respective lengths and have the same direction or curvature. The term parallel is intended to encompass some deviation from absolute parallelism. In one embodiment, for example longitudinally aligned nanotubes have parallel spatial orientations relative to each other with deviations from absolute parallelism that are less than 20 degrees, preferably for some applications deviations from absolute parallelism that are less than 10 degrees, and more preferably for some applications deviations from absolute parallelism that are less than 1 degrees.

"Parallel to a principle guided growth axis" refers to a spatial configuration of one or more carbon nanotubes wherein the length of the carbon nanotube is substantially equidistant to the principle guided growth axis of a guided growth substrate for at least some points along the length of the nanotube. "Parallel to a principle guided deposition axis" refers to a spatial configuration of one or more carbon nanotubes wherein the length of the carbon nanotube is substantially equidistant to the principle guided deposition axis of a guided deposition substrate for at least some points along the length of the nanotube. As used in this context, the term parallel is intended to encompass some deviation from absolute parallelism. Nanotubes parallel to a principle guided growth or deposition axis may have parallel spatial orientations with deviations from absolute parallelism that are less than or equal to 20 degrees, preferably deviations from absolute parallelism that are less than or equal to 10 degrees for some applications, and preferably deviations from absolute parallelism that are less than 1 degrees for some applications. The present invention provides nanotube arrays and related methods of making nanotube arrays wherein at least 95% of the nanotubes in the array extend lengths that are parallel to each other and/or parallel to a principle guided growth or deposition axis with deviations from absolute parallelism of less than or equal to 20 degrees.

"Array of nanotubes" refers to a plurality of nanotubes having a spatial configuration wherein individual nanotubes in the array have selected relative positions and relative spatially orientations. The present invention provides arrays of longitudinally aligned nanotubes.

"Nanotube precursors" refers to materials that are used to generate carbon nanotubes, for example by chemical vapor deposition processes, electrochemical synthesis process and pyrolytic processes. In some embodiments, nanotube precursors interact with carbon nanotube growth catalyst to generate carbon nanotubes. Exemplary nanotube precursors include hydrocarbons such as methane, carbon monoxide, ethylene, benzene, and ethyl alcohol.

"Nanotube growth catalysts" are materials that catalyze the formation and growth of carbon nanotubes. Useful nanotube growth catalysts for the methods of the present invention include, but are not limited to, ferritin, nickel, molybdenum, palladium, yttrium, iron, copper, molybdenum, cobalt.

"Band of catalyst" refers to spatially localized regions of a surface having relatively high surface concentrations of catalyst, for example surface concentrations greater than over equal to about 1000 particles $\mu m^{-2}$. Bands of catalyst may have any two dimensional shape, position and spatial orientation providing useful nanotube arrays.

"Printable" relates to materials, structures, device components and/or integrated functional devices that are capable of transfer, assembly, patterning, organizing and/or integrating onto or into substrates. In one embodiment of the present invention, printable materials, elements, device components and devices are capable of transfer, assembly, patterning, organizing and/or integrating onto or into substrates via solution printing or dry transfer contact printing.

"Solution printing" is intended to refer to processes whereby one or more structures, such as printable nanotube arrays, are dispersed into a carrier medium and delivered in a concerted manner to selected regions of a substrate surface. In an exemplary solution printing method, delivery of structures to selected regions of a substrate surface is achieved by methods that are independent of the morphology and/or physical characteristics of the substrate surface undergoing patterning. Solution printing methods useable in the present invention include, but are not limited to, ink jet printing, thermal transfer printing, and capillary action printing.

"Supported by a substrate" refers to a structure that is present at least partially on a substrate surface or present at least partially on one or more intermediate structures positioned between the structure and the substrate surface. The term "supported by a substrate" may also refer to structures partially or fully embedded in a substrate, structures partially or fully immobilized on a substrate surface and structures partially or fully laminated on a substrate surface.

"Supported by a nanotube array" and "supported by a nanotube array layer" are used synonymously and refer to a structure, such as another nanotube array or nanotube array layer, that is present at least partially on a nanotube array (or nanotube array layer) surface or present at least partially on one or more intermediate structures positioned between the structure and the nanotube array (or nanotube array layer) surface. The term ""supported by a nanotube array" may also refer to structures partially or fully immobilized on a nanotube array surface, structures partially or fully laminated on a nanotube array surface, and structures provide on an adhesive layer provided on a nanotube array surface.

"Placement accuracy" refers to the ability of a transfer method or device to transfer a printable element, such as a printable nanotube array, to a selected position, either relative to the position of other device components, such as electrodes, or relative to a selected region of a receiving surface. "Good placement" accuracy refers to methods and devices capable of transferring a printable element to a selected position relative to another device or device component or relative to a selected region of a receiving surface with spatial deviations from the absolutely correct position less than or equal to 50 microns, more preferably less than or equal to 20 microns for some applications and even more preferably less than or equal to 5 microns for some applications. The present invention provides devices comprising at least one printable element transferred with good placement accuracy.

"Fidelity" refers to a measure of how well a selected pattern of elements, such as an array of nanotubes or a pattern of nanotube arrays, is transferred to a receiving surface of a substrate. Good fidelity refers to transfer of a selected pattern of elements wherein the relative positions and orientations of individual elements are preserved during transfer, for example wherein spatial deviations of individual elements from their positions in the selected pattern are less than or equal to 500 nanometers, more preferably less than or equal to 100 nanometers.

The term "flexible" refer to the ability of a material, structure, device or device component to be deformed into a curved shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to about 5%, preferably for some applications larger than or equal to about 1%, and more preferably for some applications larger than or equal to about 0.5%. The present invention provides arrays of longitudinally aligned nanotubes and electronic nanotube devices on flexible substrates, such as polymer substrates.

The expression "degree of linearity" refers to a characteristic of a carbon nanotube that reflects deviations in the center positions of the tube along its length as compared to a perfectly straight line that best approximates the shape of the nanotube. Carbon nanotubes exhibiting a high degree of linearity have a conformation that approximates a perfectly straight line. The expression high degree of linearity is intended to include, however, nanotube conformations having some deviations from a perfectly straight line that best approximates the shape of the nanotube. In some embodiments, nanotubes exhibiting a high degree of linearity have deviations from perfect linearity along their entire lengths that are less than or equal to about 50 nanometers, and in embodiments useful for some applications have deviations from perfect linearity along their entire lengths that are less than or equal to about 10 nanometers. In some embodiments, nanotubes exhibiting a high degree of linearity have deviations from perfect linearity that are less than or equal to about 50 nanometers per micron of length, and in embodiments useful for some applications have deviations from perfect linearity that are less than or equal to about 5 nanometers per micron of length. The present invention provides nanotube arrays and related methods of making nanotube arrays wherein at least 95% of the nanotubes in the array exhibit a high degree of linearity.

The present invention provides arrays of longitudinally aligned carbon nanotubes having specified positions, nanotube densities and orientations, and corresponding methods of making nanotube arrays using guided growth substrates, optionally patterned with nanotube growth catalyst, or guided deposition substrates. Also provided are electronic devices and device arrays comprising one or more arrays of longitudinally aligned carbon nanotubes in contact with one or more electrodes.

FIGS. 1A-1E provides a schematic drawing illustrating a method for making an array of longitudinally aligned carbon nanotubes on a guided growth substrate. As shown in FIG. 1A, a guided growth substrate 100 is provided, such as a single crystal substrate of sapphire or quartz, having a receiving surface 105. The lattice orientation of the guided growth substrate and/or surface features (e.g. step edges, microfacets, nanofacets etc.) of the receiving surface define a principle guided growth axis 110 that at least partially mediates nanotube growth on receiving surface 105. Useful guided growth substrates include single crystal quartz having a Y-cut with a cut angle ranging from about 0 degrees to about 41.75 degrees, such as AT cut quartz substrates having a cut angle of 35.15 degrees. Optionally, guided growth substrate 100 is annealed to a temperature greater than or equal to about 900 degrees Celsius for a anneal time greater than or equal to about 8 hours to enhance guided growth functionality of the substrate (i.e. ability of the guided growth substrate 100 to promote growth of longitudinally aligned nanotubes having a longitudinal spatially alignment parallel to principle guided growth axis 110).

As shown in FIG. 1B, the receiving surface 105 is selectively patterned with nanotube growth catalyst. The receiving surface is patterned in a manner generating two dimensional pattern of catalyst-containing regions 120 having selected physical dimensions and positions on the receiving surface. In the example shown in FIG. 1B, catalyst-containing regions 120 are bands of catalyst separated by a region of the receiving surface having substantially no catalyst present 125. Patterning of receiving surface 105 can be carried out, for example, using photolithographic masking techniques in combination with spin coating deposition of catalyst, soft lithographic techniques such as contact printing, optionally using elastomeric stamps, electrochemical patterning and/or solution printing or deposition methods.

As shown in FIG. 1C, the receiving surface 105 having catalyst-containing regions 120 and regions of said receiving surface having substantially no catalyst present 125 is exposed to carbon nanotube precursors (for the sake of illustration exposure to carbon nanotube precursors is schematically represented by arrows 130), thereby resulting in guided growth of longitudinal aligned carbon nanotubes 135, such as single walled carbon nanotubes. Exemplary methods of growing carbon nanotubes in this aspect of the present invention include chemical vapor deposition methods, which are known to make high quality nanotubes. As shown in FIG. 1c, carbon nanotubes grow along growth axes that are parallel to principle guided growth axis 110, thereby resulting in an array 140 of longitudinal aligned carbon nanotubes 135 having a longitudinal spatial orientation that is parallel at least some of the other nanotubes in the array (preferably at least 90%) and is parallel to the principle guided growth axis 110. Longitudinal aligned carbon nanotubes 135 may be free standing on guided growth substrate 100 or, alternatively, may be immobilized or affixed to guided growth substrate 100. The present methods may further comprise applying a laminating or coating layer (not shown in FIG. 1) to array 140 for the purpose of immobilizing or affixing the array to guided growth substrate 100.

Optionally, the present method may further comprise the step of transferring at least a portion of array 140 of longitudinal aligned carbon nanotubes 135 to another substrate. This optional step is schematically illustrated in FIG. 1D, wherein a portion of longitudinal aligned carbon nanotubes 135 in array 140 is transferred to a selected region of a receiving surface 200 new substrate 210. New substrate 210 may be, for example, a flexible polymer device substrate. In some embodiments, substrate 210 is a functional substrate having a pattern of integrated device components such as electrodes, insulators, semiconductor layers and combinations of these, and nanotubes 135 are transferred in a manner that assembles and/or integrates the transferred nanotubes into selected device configurations. For some applications transfer of carbon nanotubes 135 is carried out in a manner that at least partially retains the relative alignment of individual nanotubes and/or in a manner that transfers nanotubes to selected regions of receiving surface 200. Exemplary transfer means having this functionality include contact printing techniques using stamps, such as elastomeric stamps.

Figure 1E:
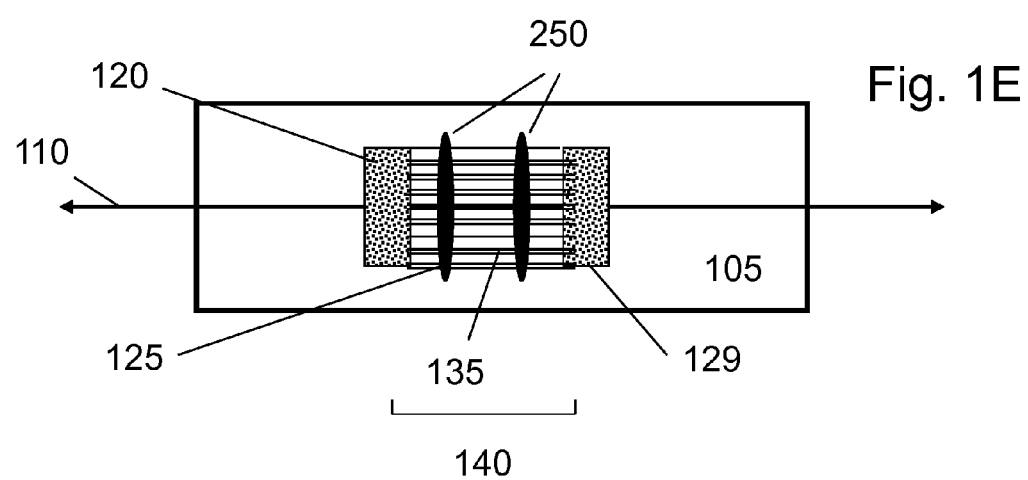

Optionally, the present method may further comprise the step of providing one or more electrical contacts in contact (physical and/or electrical contact) with at least a portion of longitudinal aligned carbon nanotubes 135 in an array 140. This optional step is schematically illustrated in FIG. 1E, where electrodes 250 are provided in physical and electrical contact with longitudinal aligned carbon nanotubes 135. Electrodes may be provided, for example, by a combination of photolithographic and vapor deposition methods, by soft lithographic methods or any equivalent methods known in the art. In the embodiment schematically shown in FIG. 1E, electrodes 250 are provided such that they do not contact catalyst-containing regions 120, and optionally are positioned a selected distance away from contact catalyst-containing regions 120.

Figure 1F:
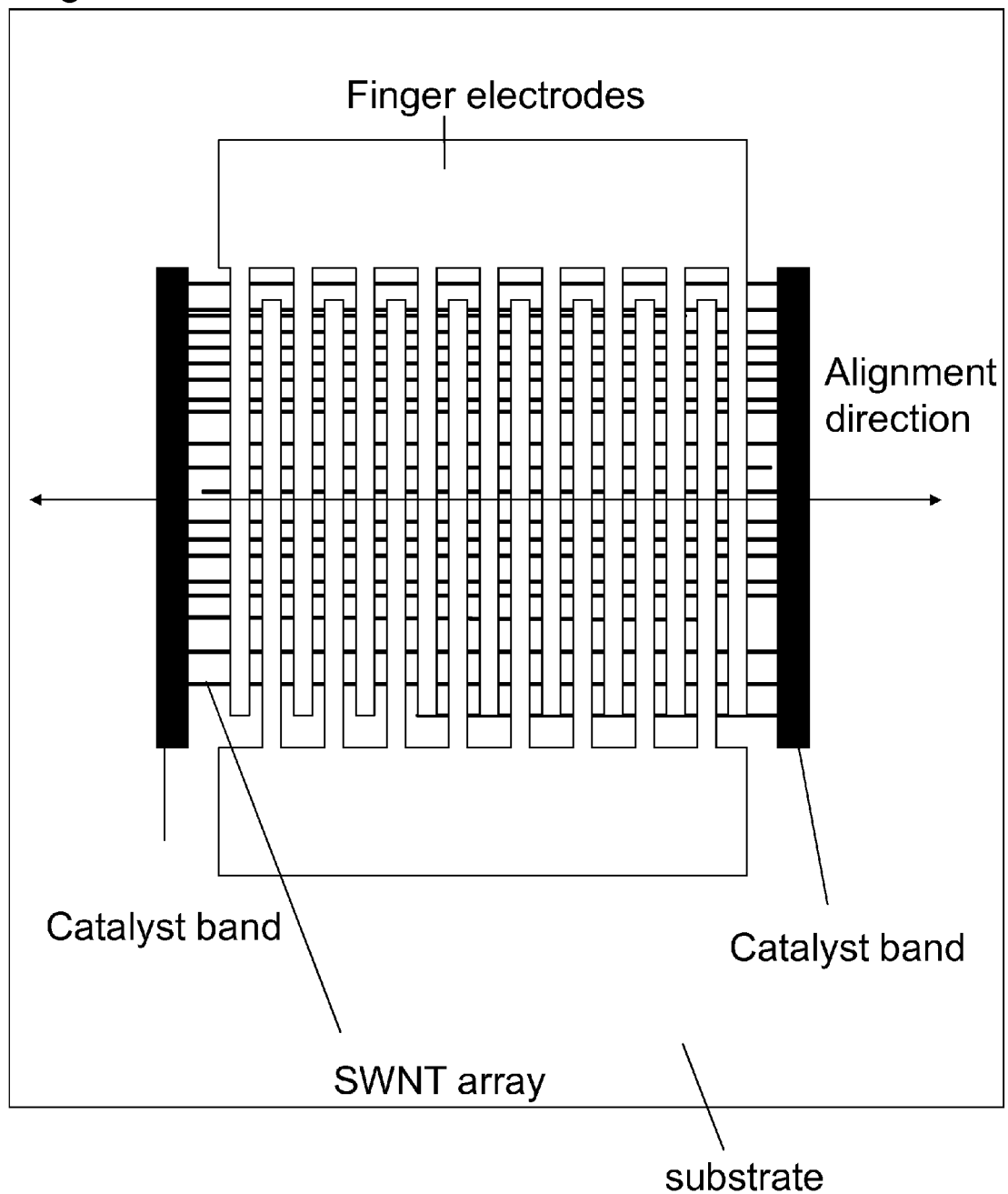
FIG. 1F provides a schematic diagram of an exemplary electronic device having finger electrodes in electrical contact with an array of longitudinally aligned carbon nanotubes.

FIG. 1F provides a schematic diagram of an exemplary electronic device having finger electrodes in electrical contact with an array of longitudinally aligned carbon nanotubes. As shown in FIG. 1F, bands of catalysts comprising islands are provided on a receiving surface of a substrate. The catalyst islands extend along axes that are perpendicular to the nanotube alignment direction indicated in FIG. 1F. Longitudinally aligned carbon nanotubes extend between the two islands of catalyst and are in electrical contact with two sets of finger electrodes. As shown in FIG. 1F, this device configuration allows a single nanotube in the array to provide an electrical connection between a large number of electrodes, and is useful for nanotube sensors, high power devices and light emitting devices.

In a useful embodiment of the present invention, catalyst islands provided on the substrate surface provide electrodes of a nanotube array electrical device of the present invention. FIGS. 1G and 1H provides schematic diagrams of nanotube array electrical devices of the present invention wherein carbon nanotube network electrode-catalyst bands are patterned in a manner such that arrays of longitudinally aligned carbon nanotubes grow between the bands. As used in this description, the expression "carbon nanotube network electrode-catalyst bands" refers to catalyst bands provided on a substrate that serve dual functions of: (i) providing a starting point for guided growth of nanotubes and (ii) functioning as an electrode in an electrical device. As shown in the Figure, nanotubes in the array are aligned parallel to a longitudinal alignment axis. Catalyst bands are also patterned such that they function as electrodes in the electrical devices. FIG. 1G provides a schematic diagram illustrating an electrical device having two parallel carbon nanotube network electrode-catalyst bands and FIG. 1F provides a schematic diagram illustrating an electrical device wherein carbon nanotube network electrode-catalyst bands are provided in a finger electrode configuration.

FIG. 1I provides a schematic drawing illustrating the concept of nanotube density as used in the present description. As shown in this drawing, longitudinally aligned nanotubes of any array extend away from a catalyst band and intersect a nanotube spacing axis that is positioned orthogonal to the longitudinal alignment axis of the nanotube array. In the schematic drawing, 7 nanotubes intersect the nanotube spacing axis in a 1 micron segment, thereby resulting in a nanotube density equal to 7 $\mu m^{-1}$.

STATEMENTS REGARDING INCORPORATION BY REFERENCE AND VARIATIONS

All references cited throughout this application, for example patent documents including issued or granted patents or equivalents; patent application publications; and non-patent literature documents or other source material are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, materials, reagents, synthetic methods, purification methods, analytical methods, assay methods, and methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

Example 1

Spatially Selective Guided Growth of High Coverage Arrays of Single Walled Carbon Nanotubes and their Integration into Electronic Devices Thin films of single-walled carbon nanotubes (SWNTs) can provide semiconducting and/or conducting components of passive and active (e.g. transistors) electronic devices. Potential applications range from large area, mechanically flexible systems, where semiconducting SWNT films could provide advantages over conventional small molecule or polymer semiconductors, to high performance devices, where they could provide alternatives to large grained polysilicon or even single crystal silicon. For the former class of application, random networks of SWNT might offer sufficient performance. For the latter, densely packed aligned arrays of SWNT are preferred. Forming such arrays, patterning their coverage and, possibly, interfacing them with SWNT networks represent significant experimental challenges. Modest degrees of alignment and coverage can be achieved by controlled deposition of SWNTs from solution suspensions or by specialized growth methods.

A new technique for generating arrays uses chemical vapor deposition (CVD) of SWNTs on single crystal substrates of sapphire or quartz. Optimized CVD growth on quartz can yield well aligned arrays over large areas and with coverages up to 1 SWNTs/micron. The coverage can be increased beyond this level, but only at the expense of degraded alignment, due possibly to detrimental effects of interactions between growing SWNTs and unreacted catalyst particles. In this example, we report a method that avoids these problems by spatially patterning the catalyst. The strategy yields aligned, high coverage arrays of SWNTs, in well defined geometries; it can also, in the same growth step, produce dense, random networks of SWNTs self-aligned and electrically interfaced to these arrays. The geometries of these SWNT films enable their easy integration into high performance, planar devices.

Figure 2:
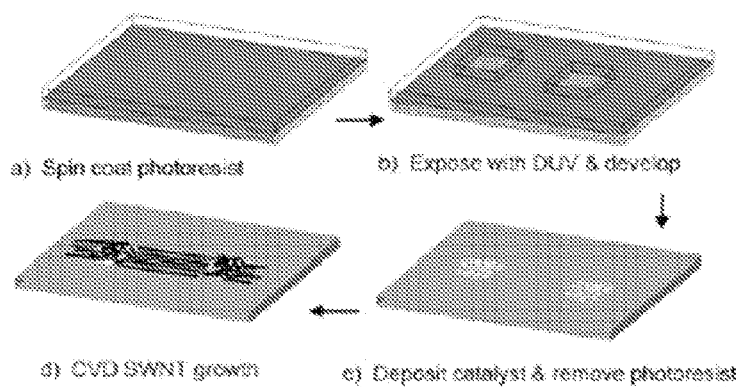
FIG. 2 provides a schematic illustration of the steps for generating self aligned patterns of dense arrays and random networks of single walled carbon nanotubes. The approach uses CVD growth on ST cut quartz with patterned ferritin catalyst.

FIG. 2 provides a schematic illustration of the steps for generating self aligned patterns of dense arrays and random networks of single walled carbon nanotubes. The approach uses CVD growth on ST cut quartz with patterned ferritin catalyst. The substrates were ST-cut quartz obtained from Hoffman Materials Inc. and subsequently annealed for 8 hours at 900° C. in air. Deep ultraviolet photolithography defined openings (e.g. two square regions as in FIG. 1) in 400 nm thick polymethylmethacrylate (PMMA) photoresist (MicroChem, 495PMMA). Spin casting ferritin diluted 1:20 (v/v) with deionized water deposited catalyst on the PMMA and the exposed regions of the quartz. Washing with acetone, isopropyl alcohol and DI water removed the PMMA and produced a bare quartz substrate with catalyst located in regions corresponding to the patterned openings in the PMMA. The ferritin was sufficiently well adhered to the quartz that most or all of it remained during the steps to remove the PMMA. The deposition conditions (i.e. catalyst concentrations and spin speeds) defined the number of catalyst per unit area in these regions. (The deposition conditions will lead to some degree of non-uniformity in the distribution of catalyst within the patterned regions.) Heating the substrate at 900° C. for 10 min oxidized the catalyst. Cooling to room temperature and then heating to 900° C. in a hydrogen environment reduced the catalyst. Purging with hydrogen at 900° C. for 1 min and then introducing a flow of methane (2500 standard cubic centimeters per minute (sccm)) and hydrogen (75 sccm) at 900° C. for 10 min led to the growth of SWNTs. High density random networks of SWNTs formed in the regions of the catalyst, which is present at high coverage for the cases examined here. Nearly perfectly aligned SWNT emerged from these regions along directions of preferred growth on the quartz, as illustrated schematically in FIG. 2 and described in more detail below.

Figure 3:
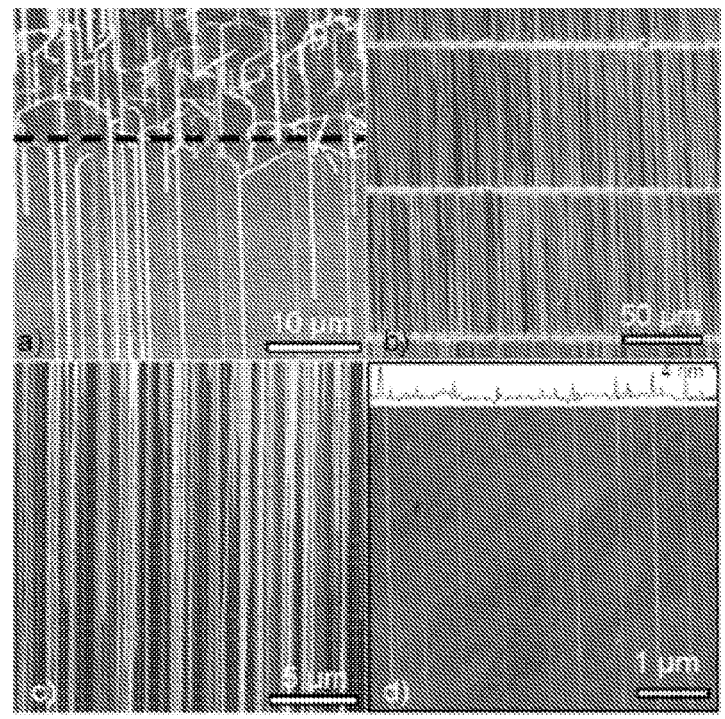
FIG. 3 provides images of SWNTs grown using patterned ferritin catalysts on ST-cut quartz substrates. Panel a of FIG. 3 provides a SEM image (scanning electron micrograph) collected near an edge (dashed white line) between a region with (top) and without (bottom) catalyst. Panel b of FIG. 3 shows nearly perfectly aligned arrays of SWNT with high coverage formed using patterned stripes of catalyst oriented perpendicular to the preferred growth direction. Panels c and d of FIG. 3 provide SEM and AFM (atomic force micrograph) images, respectively, of aligned tubes from this same substrate.

FIG. 3 provides images of SWNTs grown using patterned ferritin catalysts on ST-cut quartz substrates. Panel a of FIG. 3 provides a SEM image (scanning electron micrograph) collected near an edge (dashed white line) between a region with (top) and without (bottom) catalyst. Panel b of FIG. 3 shows nearly perfectly aligned arrays of SWNT with high coverage formed using patterned stripes of catalyst oriented perpendicular to the preferred growth direction. Panels c and d of FIG. 3 provide SEM (scanning electron micrography) and AFM (atomic force micrography) images, respectively, of aligned tubes from this same substrate. presents scanning electron and atomic force micrographs (SEMs and AFMs, respectively) of representative results. In the regions with catalyst, the SWNTs (diameters in the range between 0.5 and 3 nm) adopt a nearly random network geometry, consistent with our previous results with uniformly deposited catalyst at comparable coverages. The low degree of alignment in this case is likely due to adverse effects of unreacted catalyst particles (~90% of the catalyst does not react to form SWNTs) that coat the growth surface. In the absence of these particles, the SWNTs prefer to grow in an aligned geometry.

The results of growth with patterned catalyst, as illustrated in FIG. 3, are consistent with this expectation. In particular, nearly perfectly aligned, high coverage arrays of SWNTs emerge, at angles along the preferred growth direction, from the edges of random networks in the patterned regions. FIG. 3(a) provides an SEM image of an edge (dashed line) between a region of the substrate with (top) and without (bottom) catalyst. This effect can be exploited to obtain large area, high coverage aligned arrays of tubes: stripes of high coverage regions of ferritin are patterned with orientations perpendicular to the SWNT growth direction. FIG. 3(b-d) illustrate the results of this approach. These levels of coverage (~4 SWNT/micron) and alignment (99% of the SWNTs between the catalyst stripes lie within ~1 degree of the preferred growth direction) significantly exceeded those able to be obtained with unpatterned catalyst.

Patterned catalyst on quartz substrates also enables formation, in a single step, of high coverage random networks of SWNTs self-aligned with, and electrically interfaced to, the arrays. Such arrangements of SWNTs are important for classes of transistors and other devices that use networks and arrays for the conducting and semiconducting elements, respectively.

Figure 4:
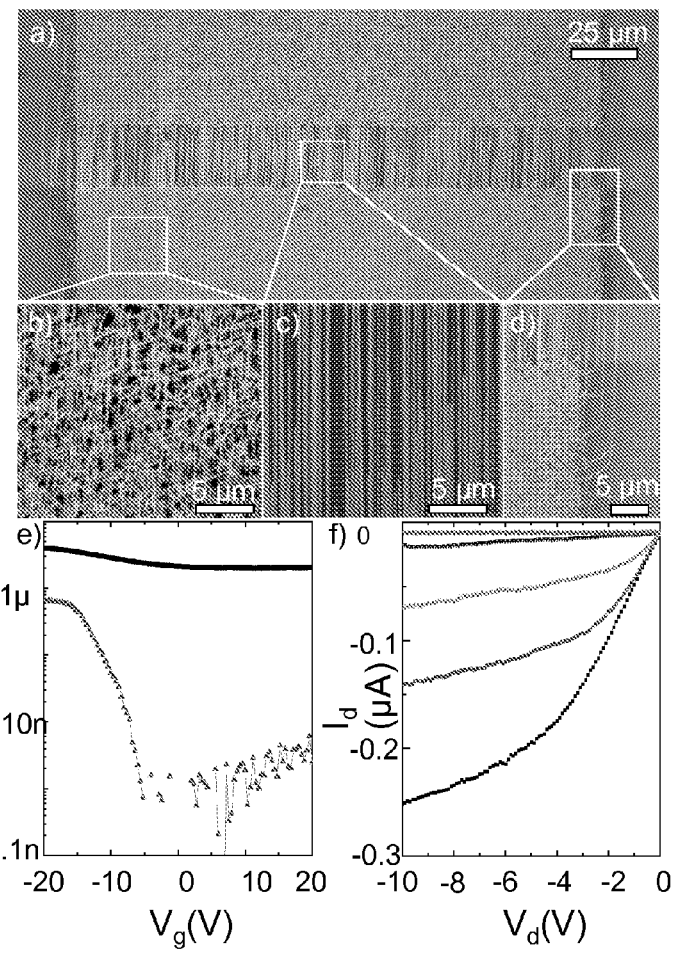
FIG. 4 provides SEM images of SWNT grown using catalyst particles patterned in two square regions to form an arrangement of SWNTs suitable for use in a thin film type transistor. Panel a of FIG. 4 shows SWNT network 'electrodes' connected by a 'channel' of aligned SWNTs. Panels b and c of FIG. 4 show electrode and channel regions, respectively. Panel d of FIG. 4 shows the corner of an electrode illustrating the preferential growth. Panels e and f of FIG. 4 show transfer (e) and output (f) characteristics, respectively, of transistors that use random networks of SWNTs as the source and drain electrodes and aligned arrays of SWNTs as the semiconducting channel.

FIG. 4 provides SEM images of SWNT grown using catalyst particles patterned in two square regions to form an arrangement of SWNTs suitable for use in a thin film type transistor. FIG. 4 presents SEMs that illustrate this type of growth capability, in which aligned SWNTs bridge the gap between large pads of random networks. Panel a of FIG. 4 shows SWNT network 'electrodes' connected by a 'channel' of aligned SWNTs. Panels b and c of FIG. 4 show electrode and channel regions, respectively. Panel d of FIG. 4 shows the corner of an electrode illustrating the preferential growth. Panels e and f of FIG. 4 show transfer (e) and output (f) characteristics, respectively, of transistors that use random networks of SWNTs as the source and drain electrodes and aligned arrays of SWNTs as the semiconducting channel. Relatively few SWNTs emerge from edges of the pads that lie along the direction of preferred growth (FIG. 4(d)), consistent with a strong driving force for alignment. Even more geometrically elaborate structures of aligned and network SWNTs are possible and included in the scope of the present invention.

To demonstrate the possibility of using such arrangements of SWNTs for transistors, we deposited 1 μm thick layer of a photodefinable benzocyclobutene (BCB, Dow Chemical) on top of SWNTs in geometries similar to those in FIG. 4 to form a gate dielectric, followed by 2/50 nm of Ti/Au to form a gate electrode. The resulting devices behave like transistors in which the networks form the source/drain electrodes and the arrays form the channel, when the gate electrode overlaps only the channel region. FIG. 4(e) shows transfer of characteristics for devices with channel lengths and widths of 100 and 200 μm, respectively; the gates in these cases overlap both the channel and parts of the network electrodes. Because metallic SWNTs are present, the ratios of on and off currents are less than 10 (black curve in FIG. 4(e)). High on/off ration ~1000 can be obtained using a low density SWNT electrode (red curve in FIG. 4(e) and curves in FIG. 4(f), although in this case gate modulation of the network based electrodes contribute to the response. Selective removal of metallic tubes in the channel, by procedures such as electrical burnout or chemical functionalization, can be used to improve these types of devices.

Figure 5:
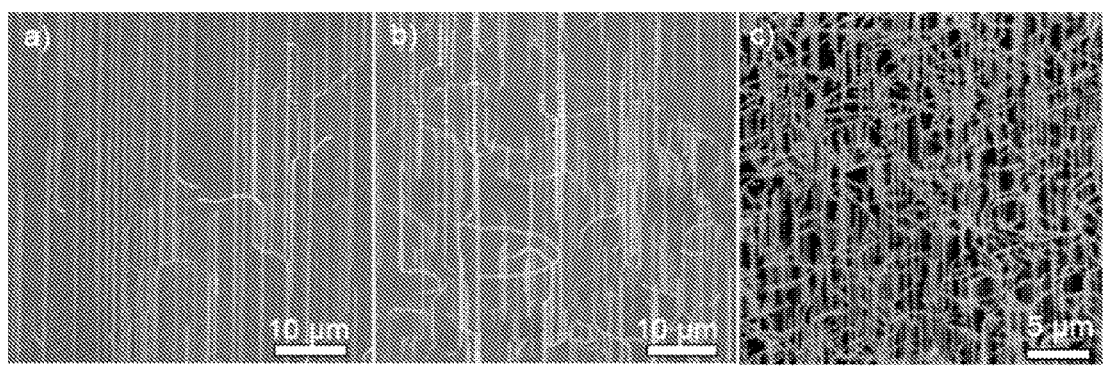
FIG. 5 provides SEM images of SWNTs grown on quartz substrates using ferritin catalyst spin cast from low panel (a), medium panel (b) and high panel (c) concentration solutions.

FIG. 5 provides SEM images of SWNTs grown on quartz substrates using ferritin catalyst spin cast from low panel (a), medium panel (b) and high panel (c) concentration solutions. As the catalyst concentration increases, the coverage of SWNTs increases while the degree of alignment decreases.

Figure 6:
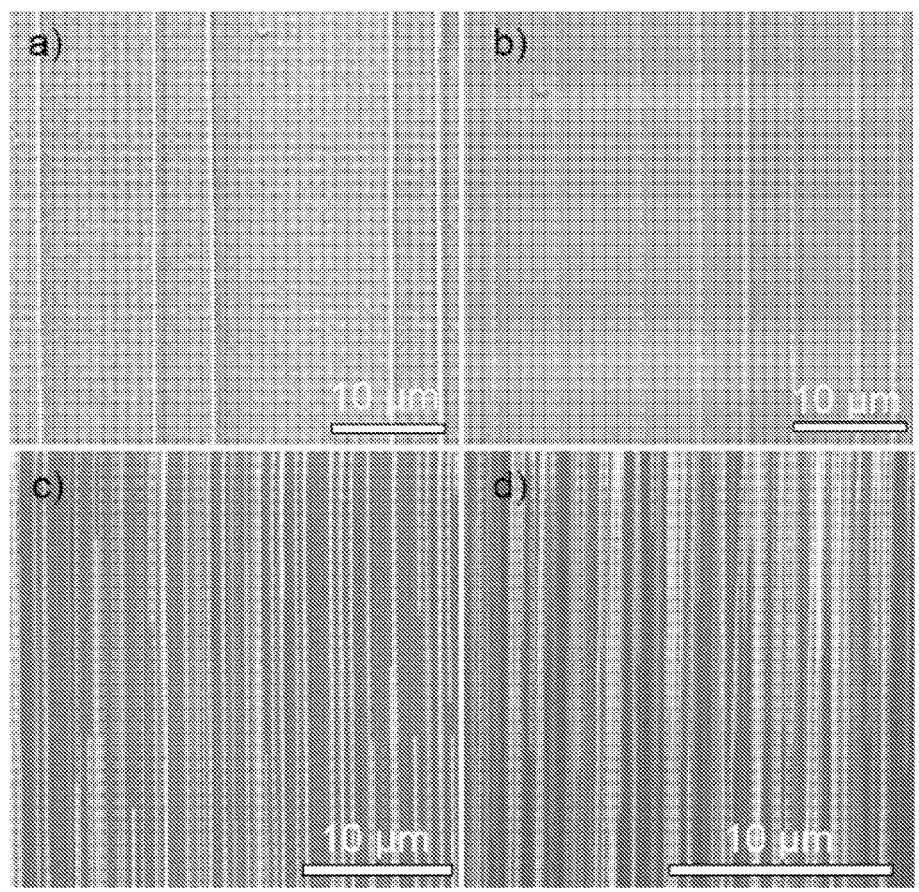
FIG. 6 provides SEM images of aligned SWNTs grown on quartz substrates by use of patterned ferritin catalysts. These images were collected away from the regions of catalyst for cases of low panel (a), moderate panel (b), high panel (c) and very high panel (d) concentrations of catalyst.

FIG. 6 provides SEM images of aligned SWNTs grown on quartz substrates by use of patterned ferritin catalysts. These images were collected away from the regions of catalyst for cases of low panel (a), moderate panel (b), high panel (c) and very high panel (d) concentrations of catalyst. In this case, unlike the case of unpatterned catalyst, the degree of alignment does not depend (or depends only very weakly) on the coverage of the catalyst or the SWNTs.

Figure 7:
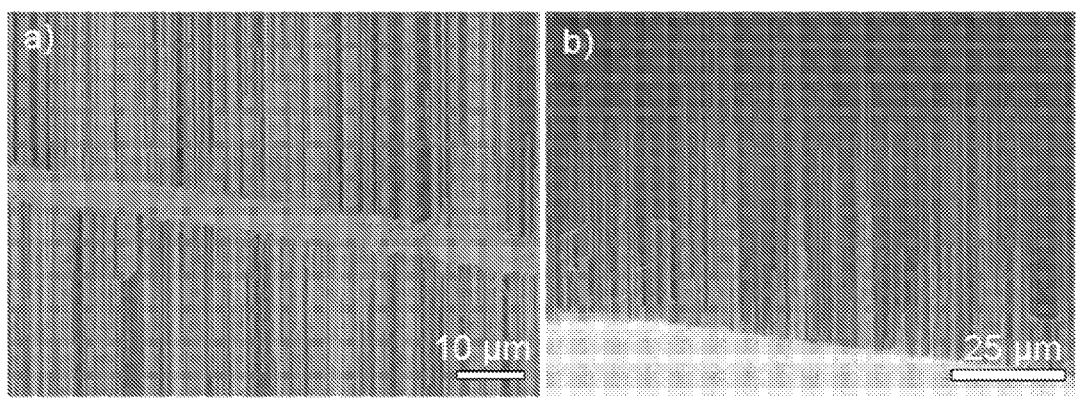
FIG. 7 provides a SEM image of SWNTs grown on a quartz substrate using a stripe pattern of ferritin catalyst oriented at a shallow angle relative to the preferred growth direction.

FIG. 7 provides a SEM image of SWNTs grown on a quartz substrate using a stripe pattern of ferritin catalyst oriented at a shallow angle relative to the preferred growth direction. The SWNTs emerge from the patterned catalyst with orientations along this preferred direction.

Figure 8:
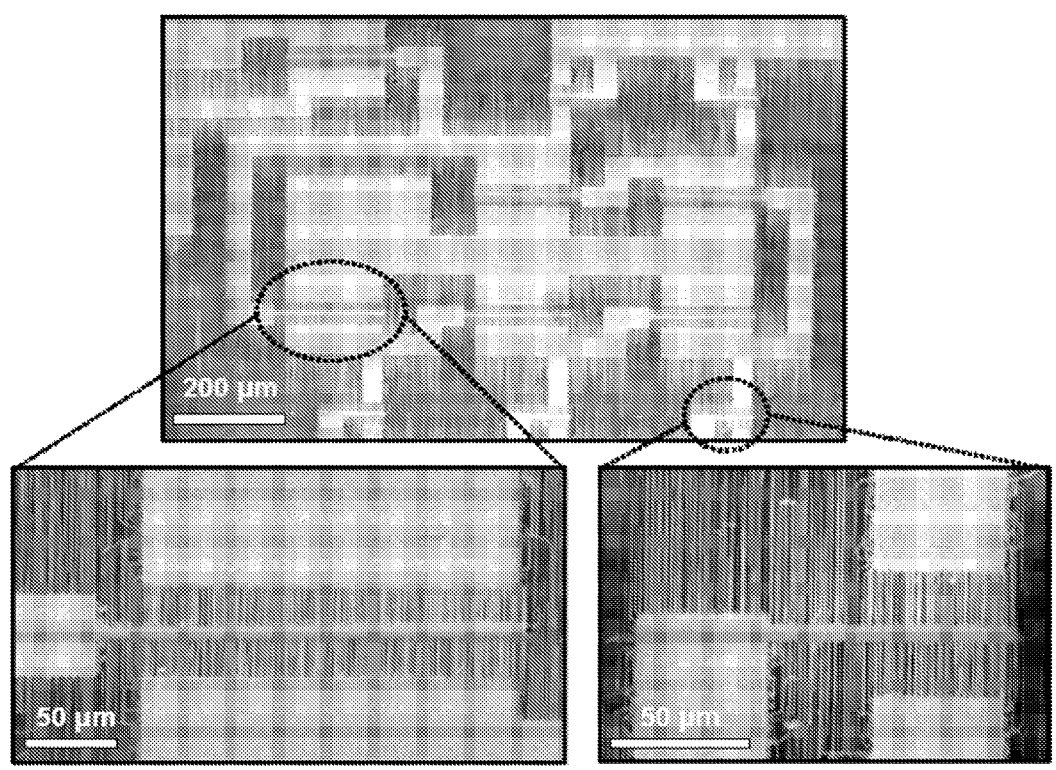
FIG. 8 provides SEM images of a complex arrangement of random networks and aligned arrays of SWNTs, formed by using patterned ferritin catalyst and CVD growth on a quartz substrate. The bright white regions correspond to high coverage random networks of SWNTs.

FIG. 8 provides SEM images of a complex arrangement of random networks and aligned arrays of SWNTs, formed by using patterned ferritin catalyst and CVD growth on a quartz substrate. The bright white regions correspond to high coverage random networks of SWNTs.

In summary, this example demonstrates capabilities of the present methods and compositions for creating arrangements of SWNTs that are useful for application in thin film electronics. These techniques complement other reported approaches, and may facilitate the use of SWNTs in practical devices.

Example 2

Guided Growth of Large-Scale, Horizontally Aligned Arrays of Single-Walled Carbon Nanotubes and their Use in Thin-Film Transistors 1. Introduction In this example we describe use of large-scale arrays of longitudinally aligned carbon nanotubes as effective semiconductor "thin films" for TFTs. The effective device mobilities (up to 125 cm2V-1 s-1) are substantially higher than those that we have been able to achieve in random networks of SWNTs grown using similar techniques (=5 0 cm2V-1 s-1). The results presented here indicate that low-cost quartz substrates can be used to generate high-quality aligned arrays of SWNTs for a range of applications in electronics and sensing.

2. Results and Discussion

Figure 9:
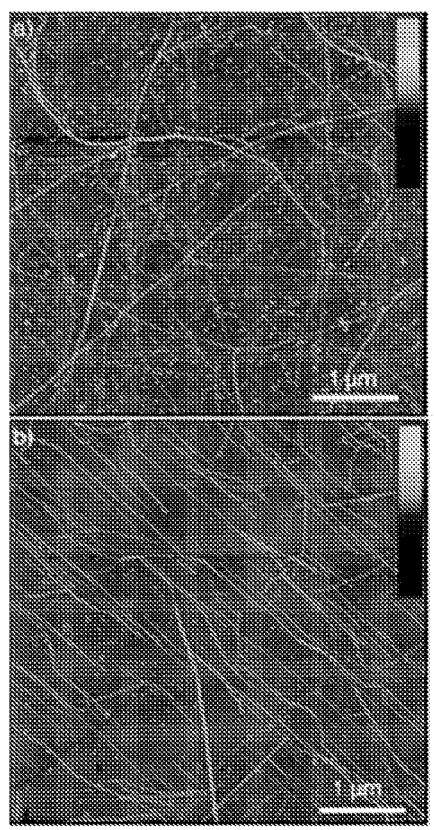
FIG. 9 provides AFM images of random panel (a) and aligned panel (b) SWNTs grown on SiO2 and single-crystal quartz, respectively. Histograms are also presented in FIG. 9 of the orientation, panel (c), and diameter, panel (d), of the aligned SWNTs.
Figure 9:
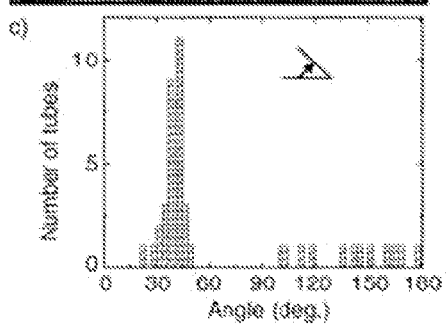
Figure 9:
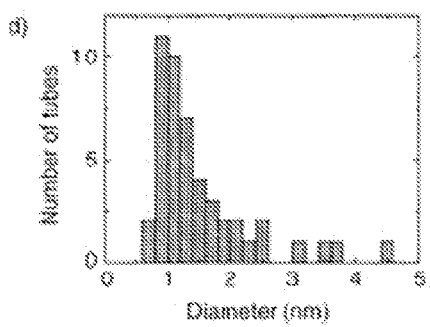

FIG. 9 provides AFM images of random panel (a) and aligned panel (b) SWNTs grown on SiO2 and single-crystal quartz, respectively. Histograms are also presented in FIG. 9 of the orientation, panel (c), and diameter, panel (d), of the aligned SWNTs. These data suggest that most of the aligned tubes are individual tubes. In FIG. 9 (a, b) the color bar represents 10 nm height. The atomic force microscope (AFM) images in FIG. 9 of SWNTs grown on SiO$_2$/Si using the procedures described in the Experimental Section. The distributions of the tubes on quartz (FIG. 9b) involve aligned arrays and few tube-tube crossings; they are very different to those observed on amorphous substrates, including SiO$_2$ and fused quartz. Panels c and d of FIG. 9 presents histograms of the tube orientations and diameters for the region of the substrate shown in FIG. 9, panel b, respectively. The AFM images are consistent with tubes that are mainly individual single-walled with diameter 1±0.5 nm. The structures with diameters larger than 2 nm could be small bundles. The diameter distribution is similar to that of tubes grown on SiO$_2$/Si.

Figure 10:
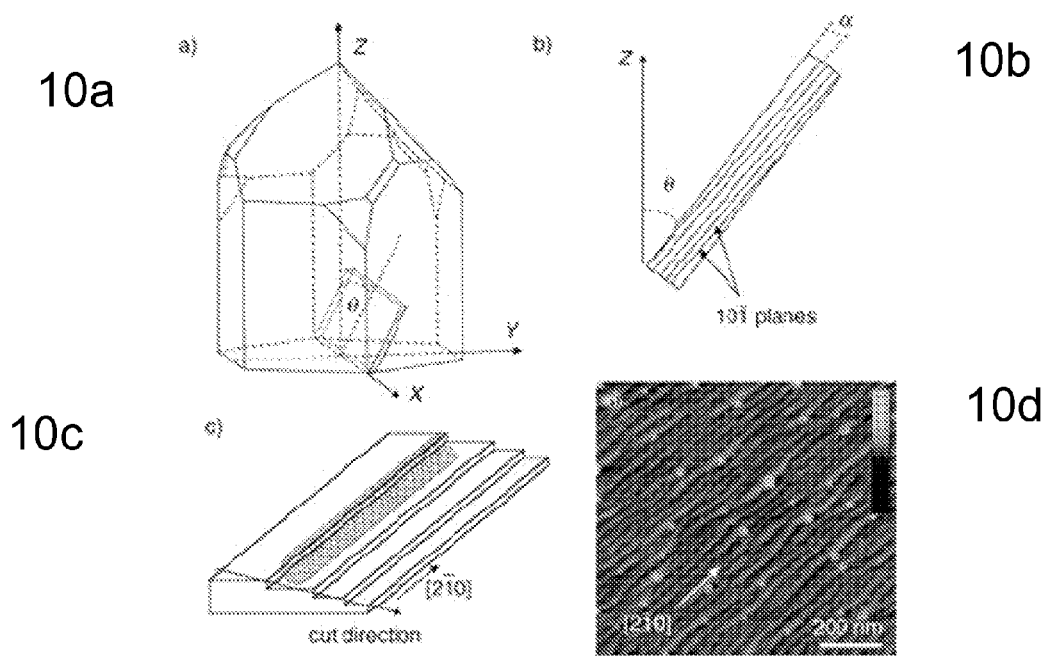

FIG. 10a provides a schematic illustration of the crystallographic planes in right-handed α-quartz and the orientation of a Y-cut wafer. FIG. 10b provides a Cross section of an AT-cut quartz wafer and the 011 planes; the miscut angle is 2° 58'. FIG. 10c provides a Schematic illustration of atomic steps and alignment direction on the surface. FIG. 10d provides a AFM image of terraced surface structures after thermal annealing. The steps in this case are 0.7-1-nm high with 30-35-nm spacing. The small particles are ferritin catalyst; the bar represents 5 nm height.

FIG. 10a shows schematically a quartz crystal (trigonal symmetry) and the orientation of a Y-cut wafer. Most of the results illustrated herein use the AT cut, which is a type of rotated Y cut that has a cut angle of 35° 15'. This type of wafer is often used in surface acoustic wave devices, microbalances, and resonators. We observed similar tube distributions on quartz with slightly different Y-cut angles such as 36 or 38°. FIG. 10b shows a cross section of the quartz wafer and the 011 atomic planes. The wafers have some degree of miscut with respect to these planes. This miscut can lead to steps on the surface, as shown schematically in FIG. 10c. These types of steps have been observed directly on other quartz planes. It is likely that similar steps exist on the Y-cut wafers, although we are unaware of similar direct measurements of them. We did not observe these steps in AFM images of the as-received wafers due, possibly, to the small distances between them. Nevertheless, long thermal annealing (7 h, 900° C.) generated, in some cases, steps spaced sufficiently far apart to allow imaging by AFM (FIG. 10d).

Figure 11:
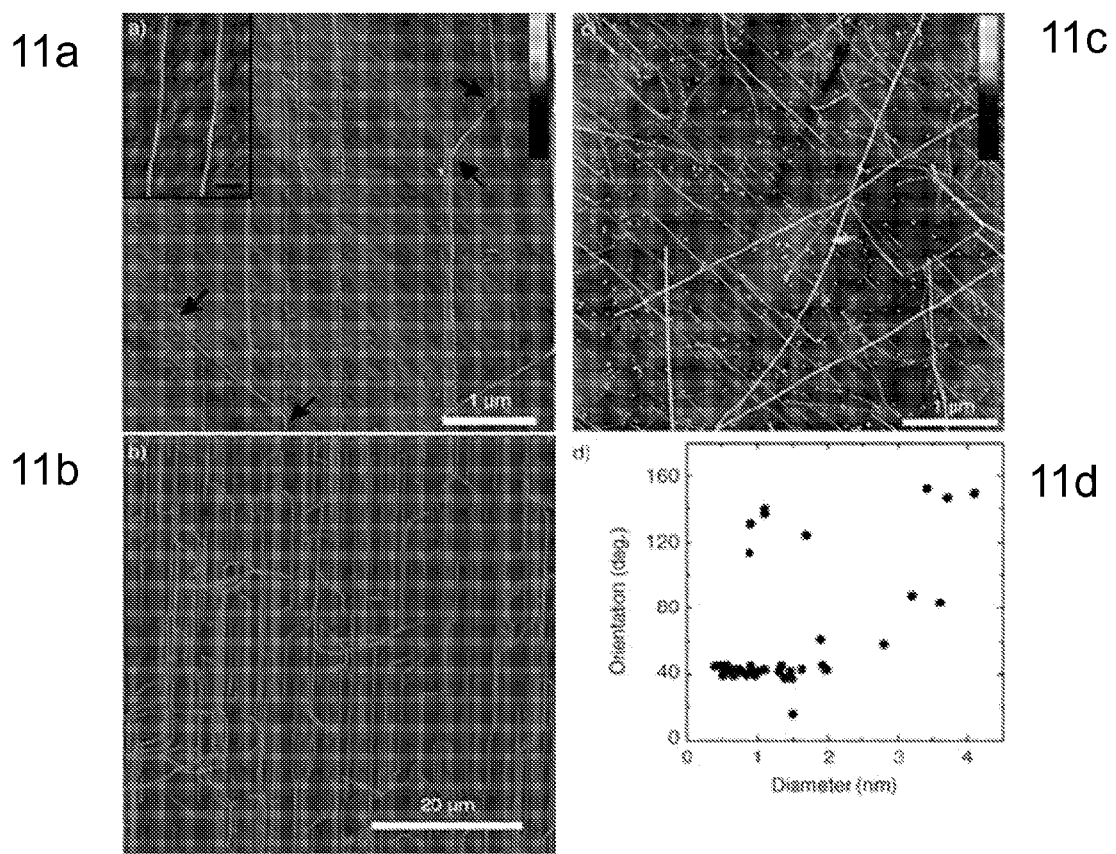

The alignment of tubes grown on these substrates is always parallel to the direction of the features in FIG. 10d. It is independent of the direction of gas flow, for the growth conditions explored here. FIG. 11a shows an AFM image of SWNTs grown on single-crystal quartz substrates. The inset of FIG. 11a shows a high-magnification view of a pair of tubes (scale bar is 75 nm). Arrows in the main image highlight "kinks" in the tubes. FIG. 11b shows a large-area SEM image of aligned tubes. FIG. 11c shows an AFM image of aligned and unaligned SWNTs. FIG. 11d provides a scatter plot of the tube orientation versus the tube diameter. Large-diameter (>1.5 nm) tubes, which may be small bundles, are more likely to be unaligned than small-diameter (<1.5 nm) tubes. In (FIGS. 11 a-c) the color bar represents 10 nm height. FIG. 11a shows a collection of well-aligned tubes. The inset shows that the tubes are not perfectly straight; they have shapes that are similar to those observed in the step edges of FIG. 10d. FIGS. 11a and 11b shows that the tubes also occasionally exhibit large, abrupt changes in their alignment. The shapes of these "kinks" are similar to those in step edges that are often observed in quartz and other single-crystal substrates such as Al$_2$O$_3$, MgO, and MgAl$_2$O$_4$ that have some small degree of miscut. FIG. 11c presents an AFM image of aligned and unaligned SWNTs, and a scatter plot of orientation versus diameter appears in FIG. 11d. Small diameter tubes (<1.5 nm) are mainly aligned; as the tube diameter increases above this value, the degree of orientation decreases.

Figure 12:
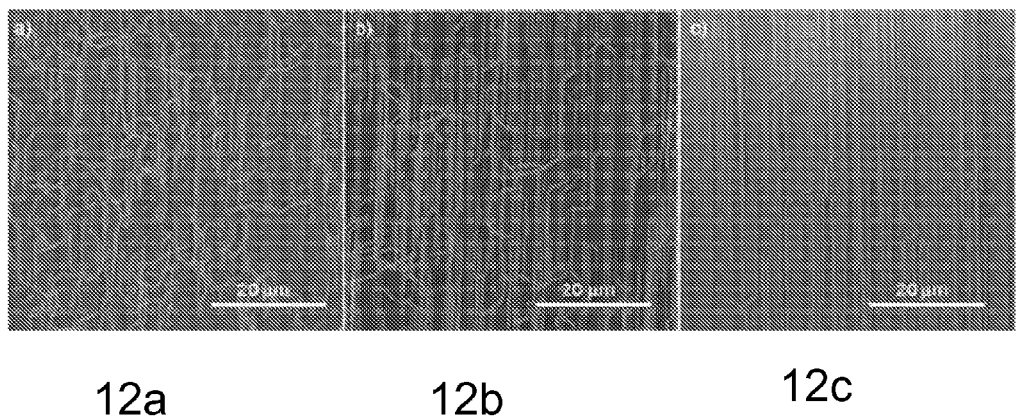
FIG. 12.

The degree of alignment is also influenced by annealing of the quartz before tube growth. FIGS. 12a-12 c show SEM images of SWNTs grown on quartz annealed at 900° C. for different times: Fig. a:10 min, Fig. b: 4 h, and Fig. c: 7 h. Increasing the annealing time, which may increase the degree of order in the crystal lattice near the surface as well as the lengths and order of the steps, improves the alignment.

To further characterize the aligned tubes, we measured the Raman spectra (micro-Raman setup) of individual tubes in the arrays. The spectrometer (Jobin-Yvon confocal) used a 100× microscope objective to focus a He—Ne excitation laser (632 nm wavelength; ≈1-μm spot size; 5×105 W cm$^{-2}$ power density) and to collect the backscattered Raman signal through a 50-μm pinhole.

Figure 13:
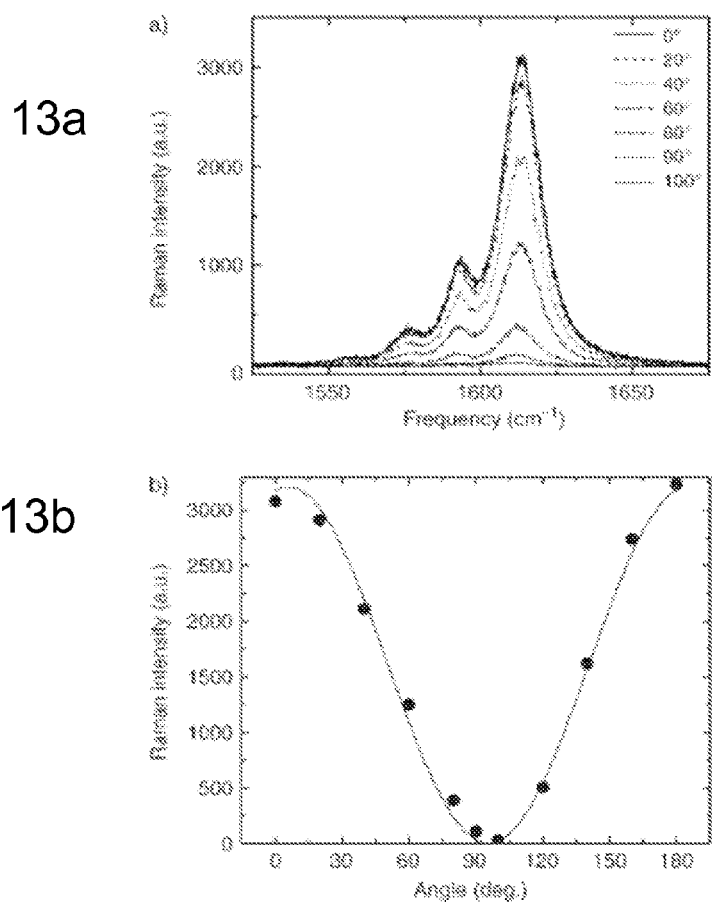
FIG. 13.

FIG. 13a provides a Raman spectrum of the tangential mode (G line) of an individual SWNT for various angles α between the polarization direction of the incident laser beam and the tube axis. FIG. 13b provides a plot showing the angular dependence of the Raman intensity at 1614 cm$^{-1}$. The solid line corresponds to a $\cos^2 \alpha$ form. The Raman signal reaches a maximum when the laser beam is polarized along the tube. As shown in FIGS. 13a and 13b, the one-dimensional nature of carbon nanotubes gives rise to highly anisotropic optical properties. The data are accurately described with an approximate $\cos^2 \alpha$ functional form, where α is the angle between the polarization direction of incident light and the tube axis. The radial breathing mode (RBM) could not be measured because of the intense Raman signal from the single-crystal quartz substrate. The thin film consists of an aligned array of SWNTs and shows high optical anisotropy, which could find some application for optical devices. In all other respects, the tubes on quartz have Raman signatures that are similar to those of tubes grown on SiO$_2$/Si. This spectroscopic information and the growth studies summarized in FIGS. 11 and 12 are consistent with an alignment mechanism that relies on energetically favorable van der Waals interactions of the tubes and/or catalyst particles with the SiO$_2$ lattice along certain crystallographic directions and/or with the step edges (or micro/nanofacets).

Figure 14:
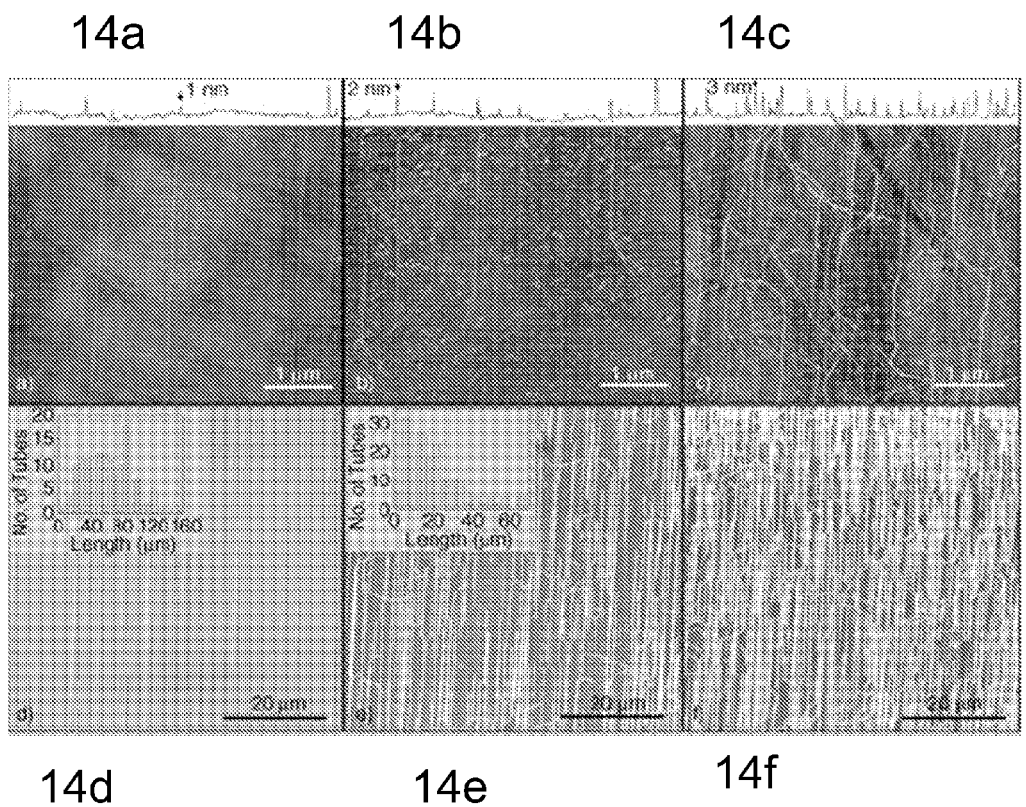
FIG. 14.

High-performance TFTs and other devices benefit from closely packed, aligned arrays of SWNTs. The coverage can be controlled by changing the concentration of the catalyst particles. FIG. 14a-14c provide AFM images of aligned SWNTs grown on single-crystal quartz substrates using different densities of catalyst particles (2000, 100, and 20 times dilution, respectively). FIGS. 14d-14f provide large-area SEM images of tubes grown in this fashion. These results indicate a decreasing degree of alignment with increasing tube density. With the growth conditions used here, there is a trade-off between coverage and alignment. In particular, the degree of alignment decreases with an increasing number of large tubes and bundles, both of which tend to form at high coverage. FIG. 14d-14f shows large areas imaged by SEM. For low densities (≈1 tube μm$^{-1}$), nearly perfect alignment can be achieved. The distributions of the lengths of the tubes appear as insets in FIGS. 14d and 14e. Generally, as the coverage increases, the average length of the tubes decreases. For the lowest densities, the average tube length can be ≈100 μm.

Figure 15:
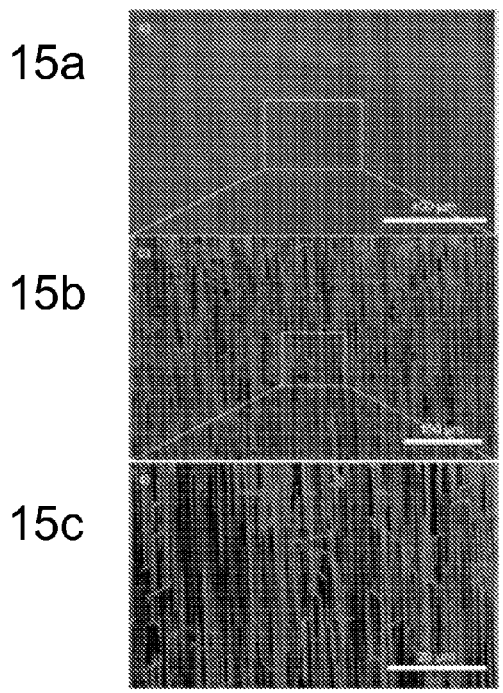
FIG. 15.

FIGS. 15a-15c provide SEM images of high-density aligned tubes at different magnifications. These images show that aligned SWNTs are homogeneous over large areas. The large-area images illustrate the remarkable homogeneity of these aligned, submonolayer coatings of SWNTs.

Figure 16:
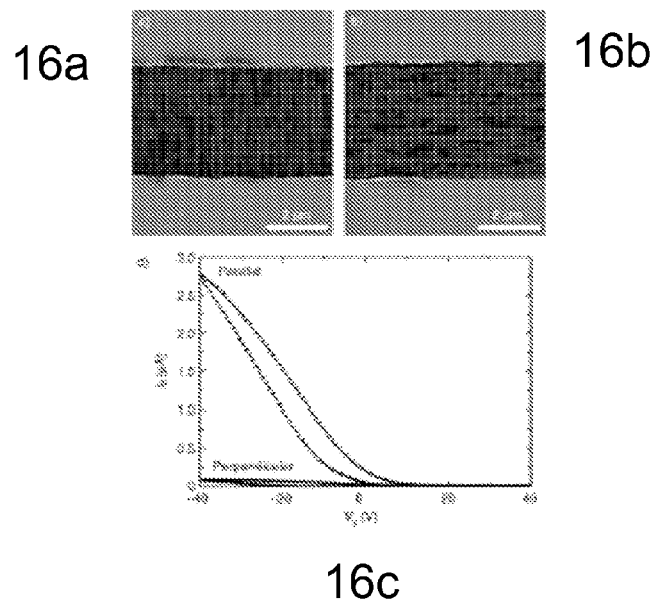
FIG. 16.

To demonstrate one possible application of these arrays, we built TFTs by first fabricating source/drain contacts of Ti/Au (3- and 25-nm-thick) on the SWNTs by electron beam evaporation followed by liftoff of a layer of photolithographically patterned resist (Shipley 1805). A layer of epoxy (SU-8; 1.6 μm thick) spin-cast and photopatterned on top of this structure formed a dielectric layer for a gate electrode (25-nm-thick Au) deposited by electron-beam evaporation through a shadow mask. FIGS. 16a and 16b provide SEM images of channel regions of TFT devices that have their channels (5-μm channel lengths) aligned parallel and perpendicular to the orientation of the aligned SWNTs, respectively. FIG. 16c provides a plot of current-voltage response of TFTs with 100-μm channel length and 250-μm channel width, oriented parallel and perpendicular to the direction of alignment in arrays of SWNTs. The bias voltage VD is 0.5 V. The aligned SWNTs behave like a highly anisotropic thin film. Device mobilities as high as 125 cm$^2$Vs$^{-1}$, corresponding to "per tube" mobilities of ≈9000 cm$^2$Vs$^{-1}$, can be observed in devices of this type. FIG. 16c shows the transfer characteristics collected from devices similar to those shown in FIGS. 16a and 16b, but with much longer channel lengths (100 mm). The measurement results clearly show the expected anisotropic response. In the perpendicular configuration, the residual current is due to a small network effect generated by the small number of unaligned tubes. The effective device mobility is given by:

$$\mu_d = \frac{\partial I_D}{\partial V_G} \frac{L}{WCV_D}$$

where $I_D$ is the drain current, $V_G$ is the gate voltage, L is the channel length, W is the channel width, and $V_D$ is the drain voltage. We estimate the gate capacitance C to be 2.3×10$^{-5}$ Fm$^{-2}$ from the relation $$C = \frac{\varepsilon \varepsilon_0}{t},$$

where $\in$ is the dielectric constant of the gate dielectric SU-8 (4.0), $\in_0$ is the vacuum permittivity, and t is the thickness of the gate dielectric. For the parallel configuration, the device mobilities (evaluated in the linear regime using standard procedures) can reach ≈125 cm$^2$V$^{-1}$ s$^{-1}$ at channel lengths of 10 μm. This value is obtained with aligned SWNT arrays that have ≈10 tubes μm$^{-1}$. A simple geometrical calculation yields a "per tube" mobility of ≈9000 cm$^2$V$^{-1}$ s$^{-1}$, which is comparable to that often observed in pristine single-tube devices. It is possible that increases in the coverage of the aligned SWNT arrays will lead to improved device mobilities. Achieving this goal is a central focus of our current work. (We note that short channel lengths yield low on/off ratios, due to the presence of metallic SWNTs that span the source/drain gap. These tubes can be selectively eliminated through electrical breakdown or chemical functionalization.)

3. Conclusions

In summary, we show that Y-cut single-crystal quartz can be used to generate well-aligned, densely packed, horizontal arrays of pristine SWNTs over large areas. Many of the features of the arrays and their dependence on growth conditions are consistent with either alignment along step edges or micro/nanofacets on the surface of the quartz or preferential interactions along certain directions associated with the quartz lattice. The low cost and commercial availability of Y-cut quartz and the ability to grow dense arrays of tubes represent attractive features of the approach introduced here. The format of these arrays (i.e., lying horizontally on a flat substrate) allows easy integration into devices, as demonstrated by high-performance TFTs. We believe that these types of arrays and the means for growing them will be valuable for a range of emerging applications that use large collections of SWNTs.

4. Experimental Section

Conventional CVD growth procedures are most well-established for use with $SiO_2$/Si substrates. Tubes were grown on this type of substrate to serve as a comparison for results on AT-cut quartz. Ferritin catalyst (Aldrich) diluted 1:200 (v/v) with deionized water was cast onto the substrate, followed by heating at 900° C. for 10 min to oxidize the catalyst and cooling to room temperature. Heating to 900° C. in a hydrogen environment reduced the catalyst. Purging with hydrogen at 900° C. for 1 min and then introducing a flow of methane (2500 standard cubic centimeters per minute (sccm)) and hydrogen (75 sccm) at 900° C. for 10 min led to the growth of SWNTs. The quartz substrates were placed on polished Si wafers in the growth chamber to enhance the homogeneity of the temperature distribution on their surfaces. After growth, the samples were cooled slowly (<5° Cmin-1) to avoid cracking in the quartz.

Example 3

Transfer of Arrays of Longitudinally Aligned Nanotubes Grown on Guided Growth Substrates to Device Substrates The present invention provides printable arrays of longitudinally aligned nanotubes fabricated on a guided growth substrate patterned with catalyst that are capable of subsequent transfer to a device substrate, such as a flexible polymer substrate or a substrate prepatterned with device components (e.g. electrodes, insulators, semiconductors etc.). Printable nanotube arrays of the present invention are capable of efficient transfer (e.g. at least 90% of the nanotubes are transferred) and are capable of transfer in a manner that preserves the relative orientations and positions of nanotubes in the array.

Figure 17:
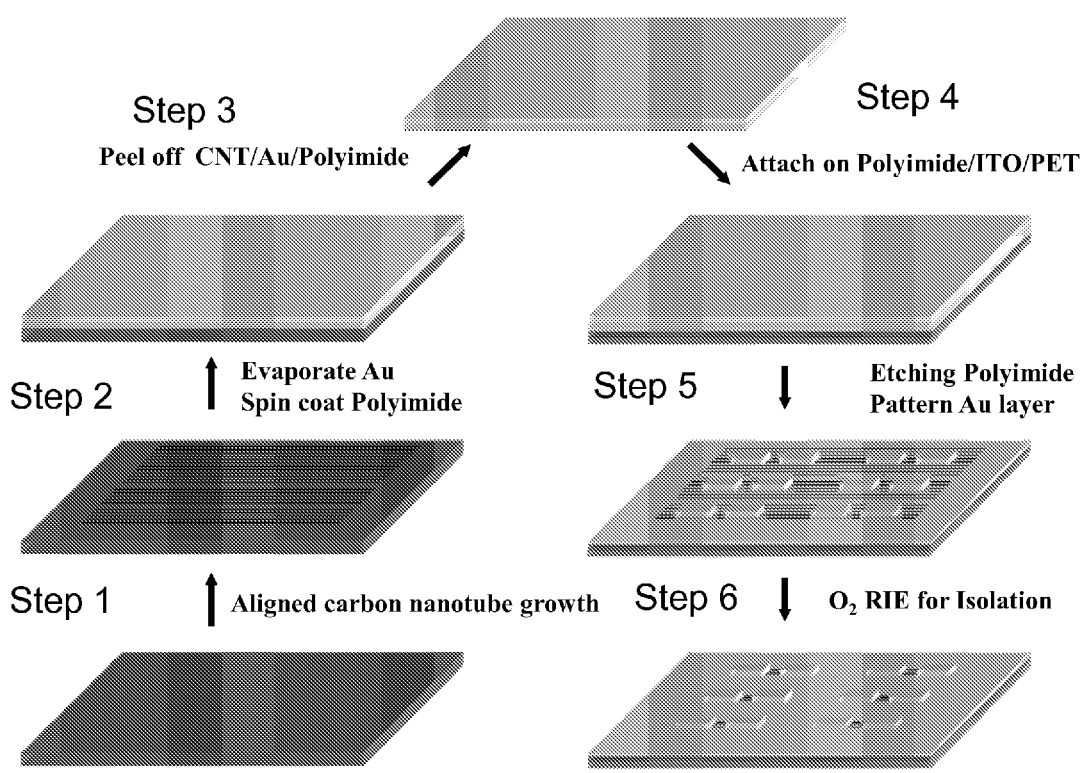
FIG. 17 shows a process flow diagram illustrating an exemplary method of the present invention for transferring one or more arrays of longitudinally aligned nanotubes from a guided grow substrate and assembling the transferred nanotubes into a functional device on a polyimide/ITO/PET substrate.

FIG. 17 shows a process flow diagram illustrating an exemplary method of the present invention for transferring one or more arrays of longitudinally aligned nanotubes from a guided grow substrate and assembling the transferred nanotubes into a functional device on a polyimide/ITO/PET substrate. As shown in process Step 1, a guided growth substrate is provided and an array of longitudinally aligned nanotubes is grown on a receiving surface of the guided growth substrate, for example using methods involving patterning of nanotube growth catalyst and chemical vapor deposition. As shown in Step 2, a thin layer of gold is deposited onto the external surface of the carbon nanotube array and a layer of polyimide is spin coated onto the deposited gold layer. As shown in Step 3, associated layers of the carbon nanotube array, deposited gold layer and polyimide spin coated layer are separated from the guided growth layer via peel off, thereby generating a separated carbon nanotube array/gold/polyimide multilayer structure. As shown in Step 4, the separated carbon nanotube array/gold/polyimide multilayer structure is brought into contact and attached to a polyimide/indium tin oxide (ITO)/polyethylene terephthalate (PET) substrate layer. As shown in Step 5, the polyimide layer of the nanotube array/gold/polyimide multilayer structure is patterned and etched in a manner generating gold electrodes having selected physical dimensions (lengths and widths), positions and spatial orientations. As shown in Step 6, reactive ion etching is used for isolating the electrodes, for example using an oxygen plasma.

Figure 18:
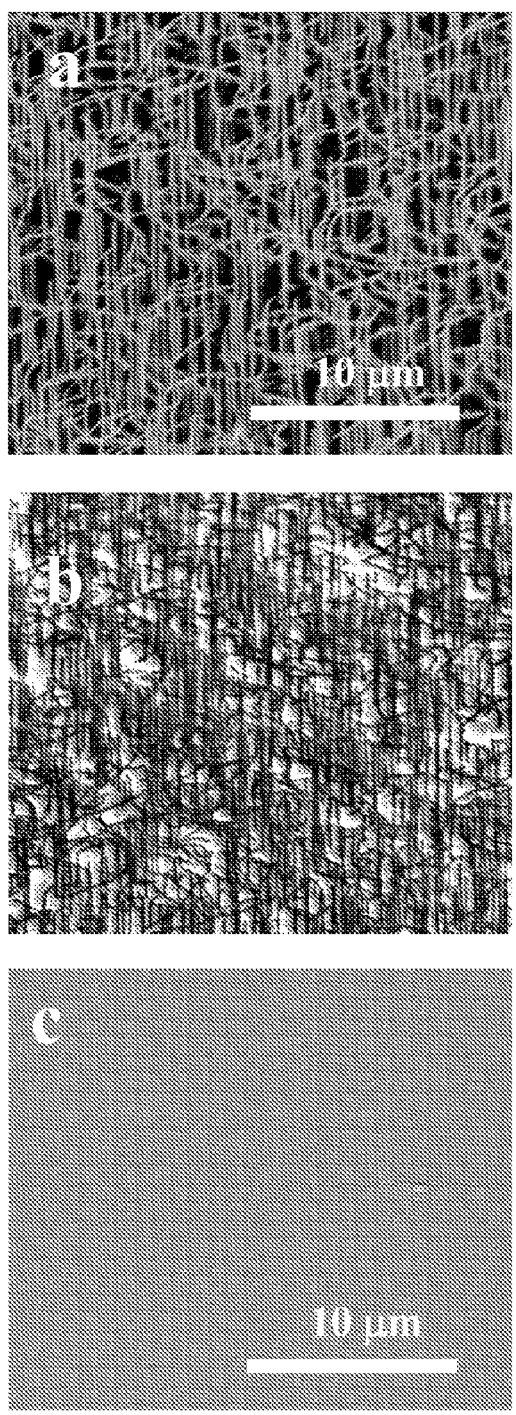
FIG. 18 shows a series of SEM (scanning electron microscopy) images demonstrating the capability of carbon nanotubes and nanotube arrays of the present invention to be transferred from a quartz guided growth substrate to an ITO/PET substrate. Panel a of FIG. 18 shows an image of array of nanotubes provided on a quartz guided growth substrate. Panel b of FIG. 18 shows an image of the nanotubes shown in panel a after transfer to a ITO/PET substrate. Panel c of FIG. 18 shows an image the region of the quartz guided growth substrate from which nanotubes were removed and transferred.

FIG. 18 shows a series of SEM (scanning electron microscopy) images demonstrating the capability of carbon nanotubes and nanotube arrays of the present invention to be transferred from a quartz guided growth substrate to an ITO/PET substrate. Panel a of FIG. 18 shows an image of array of nanotubes provided on a quartz guided growth substrate. Panel b of FIG. 18 shows an image of the nanotubes shown in panel a after transfer to a ITO/PET substrate. Panel c of FIG. 18 shows an image the region of the quartz guided growth substrate from which nanotubes we removed and transferred. A comparison of the images in panels a, b and c of FIG. 18 indicate that the present nanotube arrays and transfer methods provide efficient transfer of carbon nanotube arrays from a guided growth substrate to a different substrate.

Example 4

Guided Growth Substrates

In some embodiment, methods of making nanotube arrays of the present invention use guided growth substrates that are capable of mediating nanotube growth in a manner providing longitudinal alignment of carbon nanotubes of the array. Useful guided growth substrates include Y-cut quartz substrates having a cut angle selected over the range of about 0 degrees to about 42.75 degrees.

Figure 19:
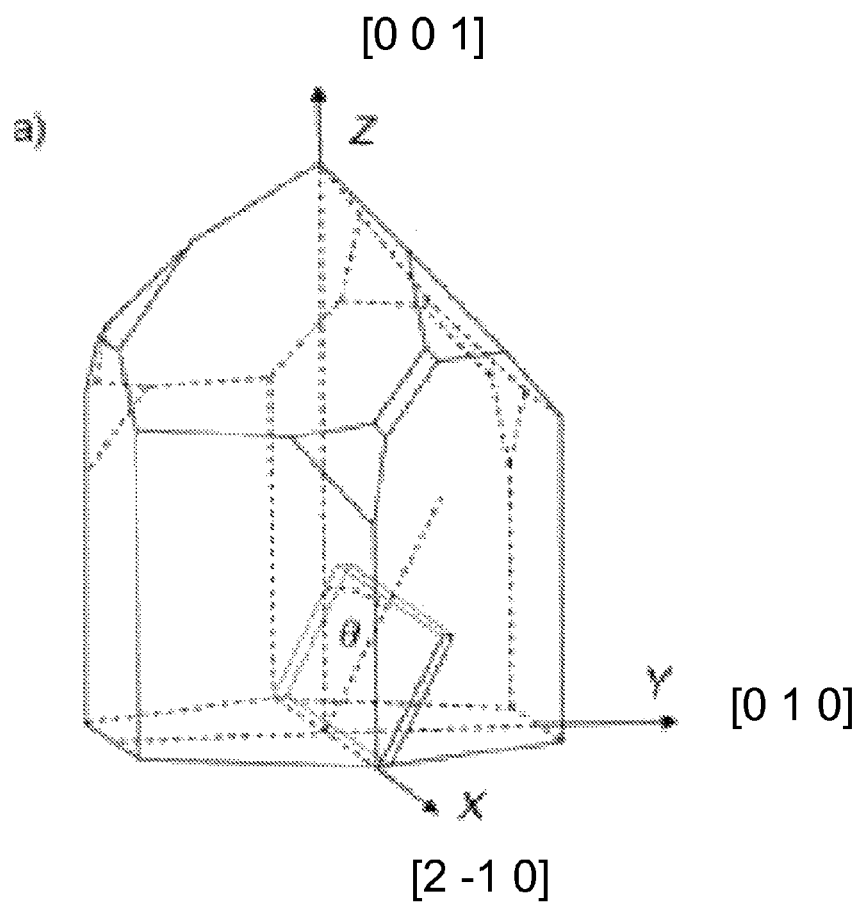
FIG. 19 provides a schematic diagram illustrating the cryptographic planes of quartz and rotated Y cut quartz wafer.
Figure 20:
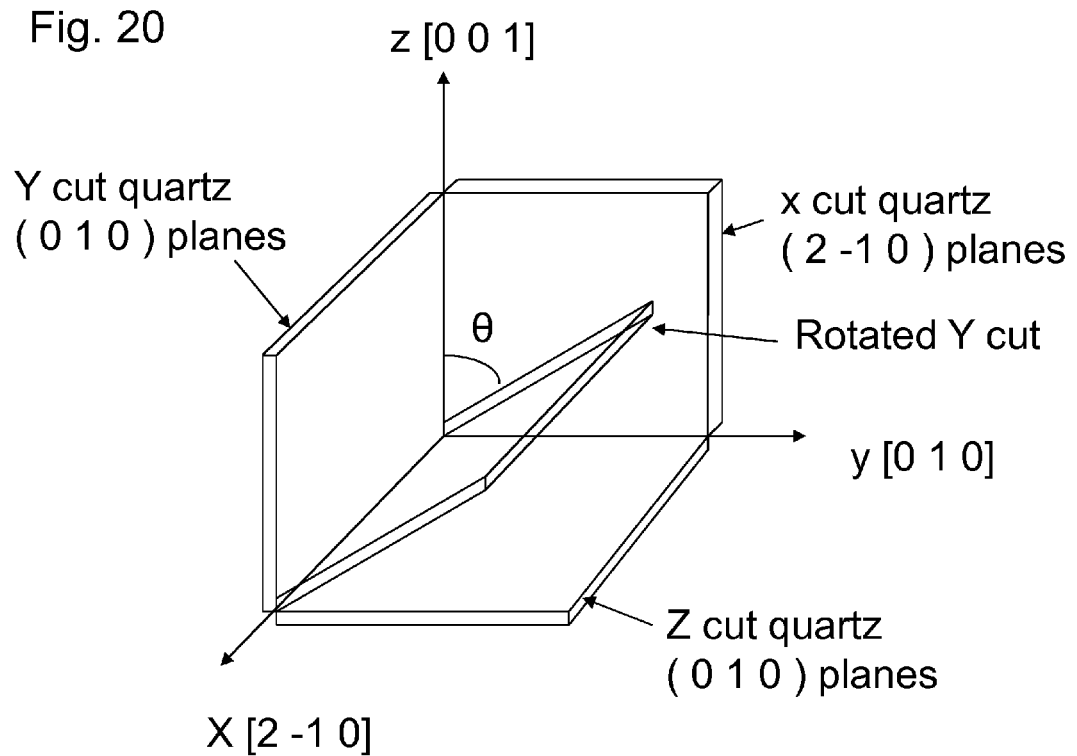
FIG. 20 provides another schematic diagram illustrating the cryptographic planes of quartz and rotated Y quartz cut wafer.

FIGS. 19 and 20 provide schematic diagrams illustrating the cryptographic planes of quartz and rotated Y cut wafer. Quartz has 3 fold symmetry in Z cut wafers there are 3 X axis on 001 planes.

In one embodiment, the nanotubes are aligned in X direction [2 −1 0, See FIG. 20].

Alignment of nanotubes is observed for Y cut wafer and rotated (x axis) y cut wafers.

Figure 21A:
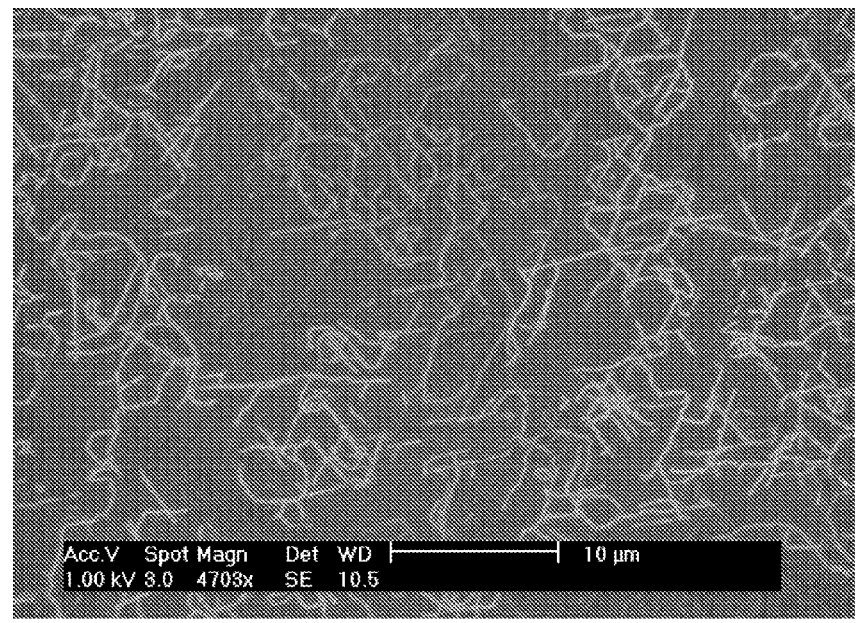
FIG. 21A shows an SEM image of SWNTs on Z cut wafer.
Figure 21B:
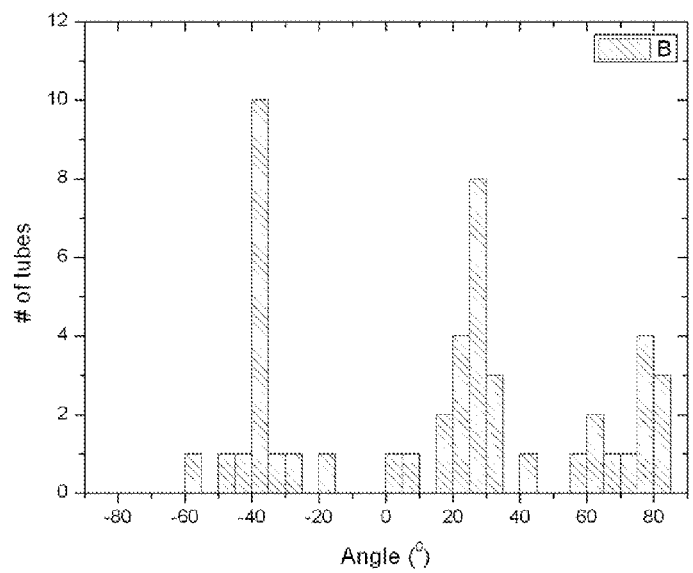
FIG. 21B shows a histogram of number of tubes and angular orientation.
Figure 21C:
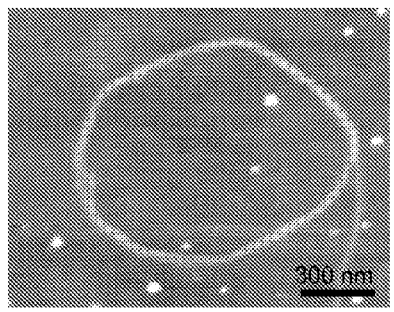
FIG. 21C shows an AFM image of one nanotube on Z cut wafer which forms a hexagonal-like shape.

Three fold symmetric alignment of carbon nanotubes is observed for Z cut wafers. FIG. 21A shows an SEM image of SWNTs on Z cut quartz wafer. There is 3 fold crystal symmetry. FIG. 21B shows a histogram of number of tubes and angular orientation. FIG. 21A shows that the nanotubes have sharp corners, and the orientation histogram in FIG. 21B shows three main angles. FIG. 21C shows an AFM image of one nanotube on Z cut quartz wafer which forms a hexagonal-like shape.

Figure 22:
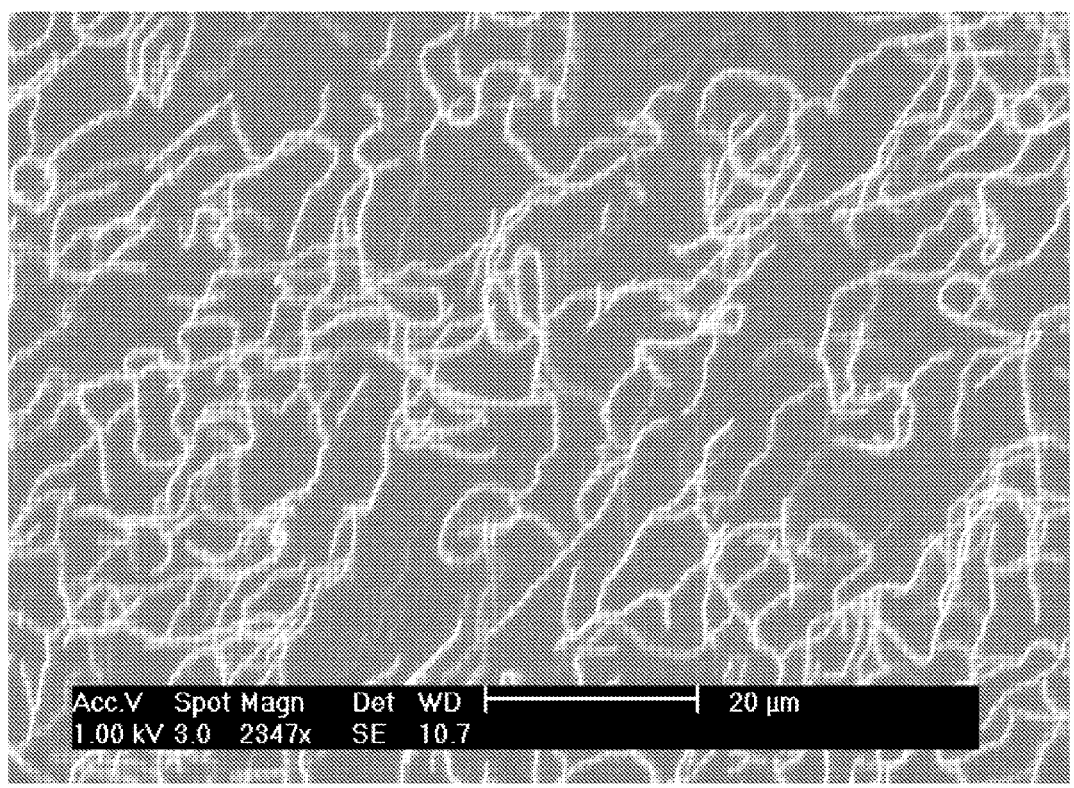
FIG. 22 shows an SEM image of SWNTs grown on X-cut quartz wafer indicating that there is no substantial alignment on X cut quartz wafers.

Alignment of nanotubes is not observed for X cut quartz wafers. FIG. 22 shows an SEM image of SWNTs grown on X-cut quartz wafer indicating that there is no substantial alignment on X cut quartz wafers.

Figure 23:
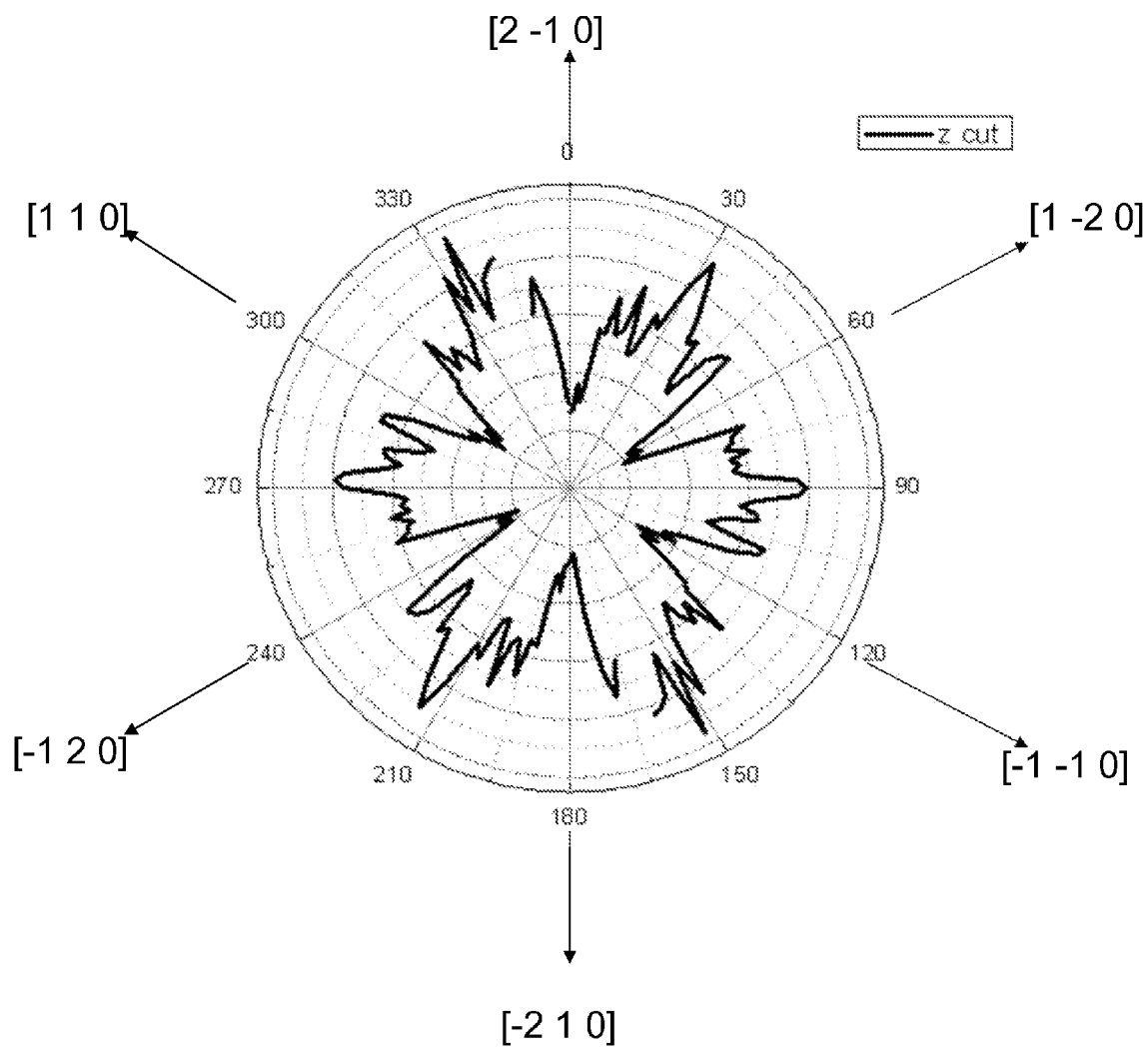
FIG. 23 provides computer simulation results relating to Z-cut quartz.

FIG. 23 provides computer simulation results relating to Z-cut quartz. This figures indicates that Z cut Quartz has 3 fold crystal symmetry, meaning that there are 3 X axis (which is alignment direction). We calculated energy between SWNT and Z cut quartz surface. Polar graph show energy vs. angle. At specific directions energy is minimum, which means that these directions are energetically favorable.

Example 5

Assembly of Longitudinally Aligned Nanotubes Via Guided Deposition

The present invention includes methods wherein a guided deposition substrate is used to assemble nanotubes into longitudinally aligned spatial orientations and/or into arrays of longitudinally aligned nanotubes. In these methods, a solution containing nanotubes, and optionally solution additives such as surfactants, is provided to the guided deposition substrate via solution deposition. Interactions between the guided deposition substrate and nanotubes in the deposited solution provide for nanotube alignment such that the lengths of the nanotubes are parallel to a guided growth axes of the substrate. Optionally, guided deposition methods of the present invention include solution/solution component (e.g., surfactant) removal steps, nanotube/nanotube array purification processing, and/or nanotube/nanotube array transfer steps (e.g., transfer to another substrate in a manner retaining the relative orientations of aligned nanotubes).

To evaluate the degree of alignment and density of aligned nanotubes achievable using these methods, a solution of single walled nanotubes was contacted with single crystalline quartz guided deposition substrates, and the resulting assembly of longitudinally aligned nanotubes was imaged and analyzed using atomic force microscopy. These results demonstrate that the present methods may be used to achieve longitudinal alignment of solution deposited nanotubes that are parallel to the principle guided deposition axis to within about 15 degrees.

5.a. Materials

Single-walled carbon nanotubes (SWNTs) produced by HiPco process or laser vaporization method are suspended in water with 2 wt. % of the surfactant, poly-oxyethylene octyl phenyl ether (Triton X-405). The concentration of the SWNT solution is typically 5~7 mg ml$^{-1}$. Diameter and length of the SWNTs are 1~5 nm and 300~3 µm (average length: 500 nm), respectively.

The molecular structure of the Triton X-405 is shown below:

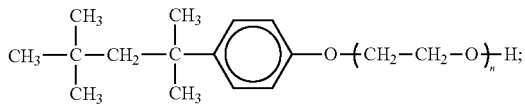

wherein n is equal to 40 The following references describe the interaction of SWNTs with various surfactants and are hereby incorporated by reference: (1) *Nano Letters*, vol. 3 (No. 10), 1379-1382 (2003) and (2) *Science*, vol. 297 (No. 26), 593-596 (2002); and *Nano Letters*, vol. 3 (No. 2), 269-273 (2003). In the case of Triton X-405 surfactant in a solution of carbon nanotubes, the benzene ring of the surfactant participates in strong binding onto the SWNT surface, and it is considered that the alkyl chain of the surfactant is selectively aligned such that it lies along the length of the nanotubes.

5.b. Deposition Method

A drop of the SWNT solution (~20 µl) is provided onto a quartz guided deposition substrate. The composition and cut angle of the quartz substrates examined included: Y-cut quartz substrate having a cut angle selected over the range of about 0 degrees to about 42.75 degrees such as 0-Y cut quartz substrate (0 degree mis-cut), AT cut quartz substrate (35.15 degree mis-cut), and a ST cut quartz substrate (42.75 degree mis-cut). The quartz wafer is annealed for the change from α-phase to β-phase at 900° C. for 30 minutes prior to use. Surface roughness of the quartz substrate is typically less than about 3 ∈.

After drying of the SWNT solution drop on the guided growth substrate in air, a mixture of SWNTs and the surfactant remains. Finally, the surfactant residue is wash out by dipping the sample in methanol (ethanol, acetone or water can be also used) with no agitation.

Figure 24A:
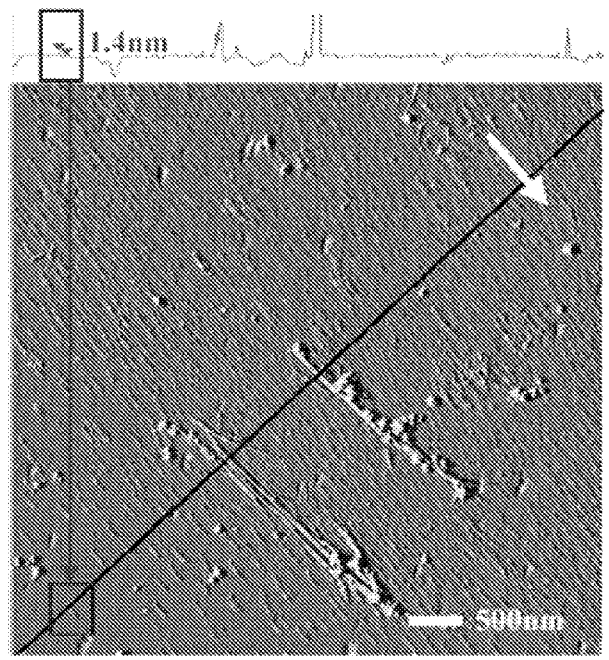
FIG. 24A shows an atomic force microscopy (AFM) image of the SWNTs deposited on a quartz guided deposition substrate after the washing step. The white arrow shows the guided growth direction of the quartz substrate.

FIG. 24A shows an atomic force microscopy (AFM) image of the SWNTs deposited on a quartz guided deposition substrate after the washing step for a SWNT solution containing Triton X-405 surfactant. Carbon nanotubes are observed as small parallel lines in this figure. The inset shown in FIG. 24 plots the height cross-section of scan shown by black line. The white arrow indicates the principle guided deposition axis of the quartz substrate. As shown in FIG. 24A, thousands of solution deposited SWNTs are present in a longitudinally aligned orientation wherein their lengths extend parallel to the principle guided deposition axis within a 15° angular deviation. Two large nanotube bundles are also present in the image shown in FIG. 24A. As shown in FIG. 24A, the bundles also exhibit a degree of parallel longitudinal alignment with respect to the principle guided deposition axis of the quartz substrate.

Figure 24B:
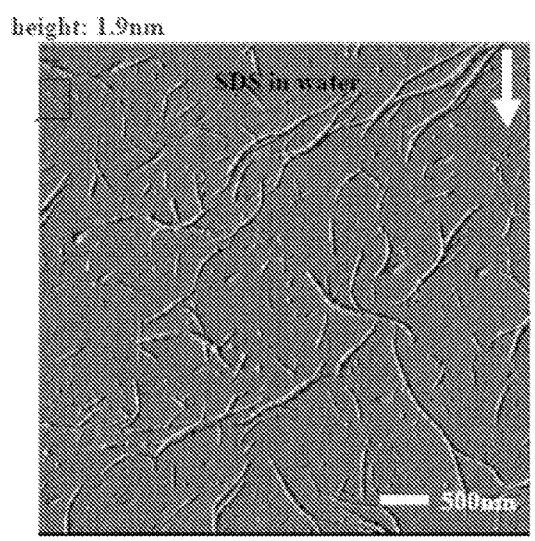
FIG. 24B shows an atomic force microscopy (AFM) image of the SWNTs deposited on a quartz guided deposition substrate for a nanotube solution containing sodium dodecyl sulfate (SDS) surfactant.
Figure 24C:
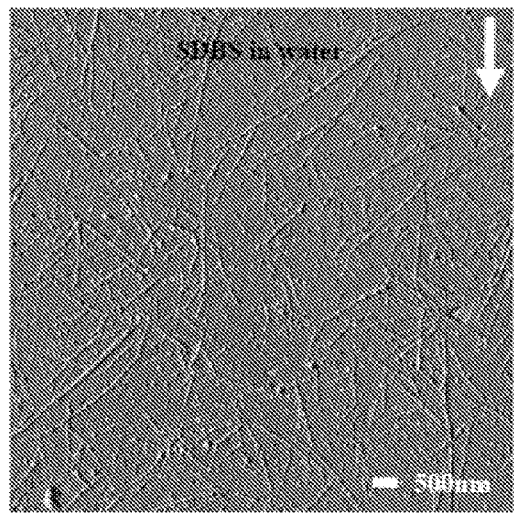
FIG. 24C shows an atomic force microscopy (AFM) image of the SWNTs deposited on a quartz guided deposition substrate for a nanotube solution containing sodium dodecylbenzenesulfonate (SDBS) surfactant.

The effect of surfactant on nanotube alignment via guided deposition was also characterized. FIG. 24B shows an atomic force microscopy (AFM) image of the SWNTs deposited on a quartz guided deposition substrate for a nanotube solution containing sodium dodecyl sulfate (SDS) surfactant. FIG. 24C shows an atomic force microscopy (AFM) image of the SWNTs deposited on a quartz guided deposition substrate for a nanotube solution containing sodium dodecylbenzenesulfonate (SDBS) surfactant. The white arrows indicate the principle guided deposition axis of the quartz substrate and carbon nanotubes are observed as small lines in these figures. As shown in FIGS. 24A and 24C, the deposited nanotubes are provided in random orientations. These results indicate that the composition of surfactant is an important factor in achieving longitudinal alignment of nanotubes deposited via guided growth methods.

Figure 24E:
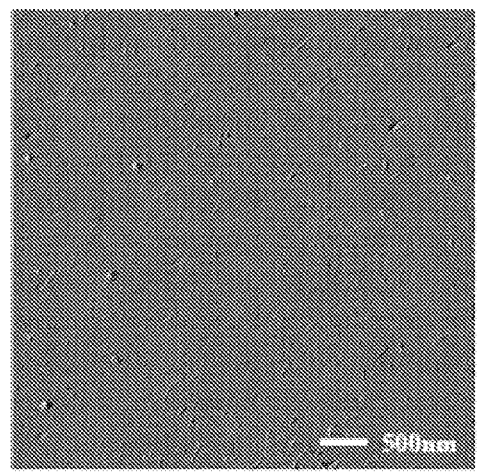
FIG. 24E shows atomic force microscopy (AFM) images of SWNTs deposited on an annealed quartz guided deposition substrate having a perfluorosilane: ((Tridecafluoro-1,1,2,2-tetrahydrooctyl)trichlorosilane) layer on its outer surface.

The effect of the presence of surface layers on the quartz guided deposition substrate on nanotube deposition and alignment via guided deposition was also characterized. FIG. 24D shows atomic force microscopy (AFM) images of SWNTs deposited on an annealed quartz guided deposition substrate having a (aminopropyl)triethoxysilane (APTS) coated outer surface and subsequently washed. In this experiment 20 microliters SWNT solution was provided on the APTS coated quartz surface, thereby forming a droplet with a contact angle of 30 degrees. FIG. 24D(1) shows a center region of the dried droplet and FIG. 24D(2) shows an edge area of the dried droplet. As shown in these figures the deposited SWNTs are randomly oriented and a large amount of surfactant still remains associated with the SWNTS even after washing. The coverage of SWNTs on the coated quartz surface is high due to the interaction between the APTS and surfactant associated with the nanotubes. FIG. 24E shows atomic force microscopy (AFM) images of SWNTs deposited on an annealed quartz guided deposition substrate having a perfluorosilane ((Tridecafluoro-1,1,2,2-tetrahydrooctyl)trichlorosilane) layer on its outer surface and subsequently washed. In this experiment a 20 microliters SWNT solution was provided on the APTS coated quartz surface, thereby forming a droplet with a contact angle of 90 degrees. Most SWNTs are desorbed from the perfluorinated layer during the washing step and the nanotubes that remain on the surface are randomly aligned.

Example 6

High Performance Electronics Based on Longitudinally Aligned Dense Arrays of Single Walled Carbon Nanotubes The methods of the present invention provide a processing pathway useful for making high performance electronics that uses dense, longitudinally aligned arrays of individual single walled carbon nanotubes (SWNTs) as semiconductors in thin film type transistors. The large numbers of SWNTs enable excellent device level performance characteristics and good device-to-device uniformity, even with SWNTs that are electronically heterogeneous. Measurements on p- and n-channel transistors that involve as many as ~1000 SWNTs reveal device level mobilities, scaled transconductances and current outputs as high as ~1200 cm2/Vs, ~700 S/m and ?? A, respectively. Analysis using rigorous models of electrostatic field effect coupling to these arrays suggests that the devices retain the attractive electronic properties of the individual SWNTs. Simple PMOS and CMOS logic gates provide examples of some simple circuit building blocks that can be achieved. Collectively, these results demonstrate a realistic path to high performance SWNT based thin film electronic circuits, light emitters, photodetectors, sensors and other related systems Fundamental studies of charge transport through individual single walled carbon nanotubes (SWNTs) reveal remarkable room temperature properties, including mobilities more than ten times larger than silicon, current carrying capacities as high as $10^9$ A/cm$^2$ and ideal subthreshold characteristics in single tube transistors. The implications of these behaviors could be significant for many applications in electronics, optoelectronics, sensing and other areas. Many believe, however, that devices that use single SWNTs as functional elements are difficult to implement, due in part to their small current outputs and active areas. More important, their integration into scalable integrated circuits requires a solution to the very difficult problem of synthesizing and accurately positioning large numbers of individual, electrically homogeneous tubes with linear geometries. The use of densely packed, longitudinally aligned horizontal arrays of non-overlapping linear SWNTs as an effective thin film electronic material has the potential to avoid these problems while retaining the attractive properties of the individual tubes. This approach is compatible with large scale integrated systems, provided that the tube lengths and separations are large and small, respectively, compared to critical device feature sizes. The multiple, parallel transport pathways in these arrays can provide large current outputs and active areas, together with a statistical averaging effect leads to small device-to-device variations in properties, even with tubes that individually have widely different transport characteristics.

Although theoretical work has examined some of the anticipated electrical properties of such arrays, little experimental work has been done, due to difficulties associated with generating large scale, aligned SWNTs at the extremely high levels of degrees of alignment and linearity needed to avoid percolating transport pathways and tube/tube overlap junctions and non-ideal electrical properties. This example presents high performance p and n channel transistors and unipolar and complementary logic gates that use aligned arrays of pristine, individual SWNTs linear geometries formed by an optimized guided growth procedure. The excellent properties of the devices, even when compared to well developed inorganic technologies at similar dimensional scaling, their ability to provide both n and p type operation, their compatibility with a range of substrates, including flexible plastic, and the potential for further improvements in performance collectively demonstrate that these approaches provide a fabrication platform for making realistic SWNT based electronic, sensing and optoelectronic technologies.

Figure 25:
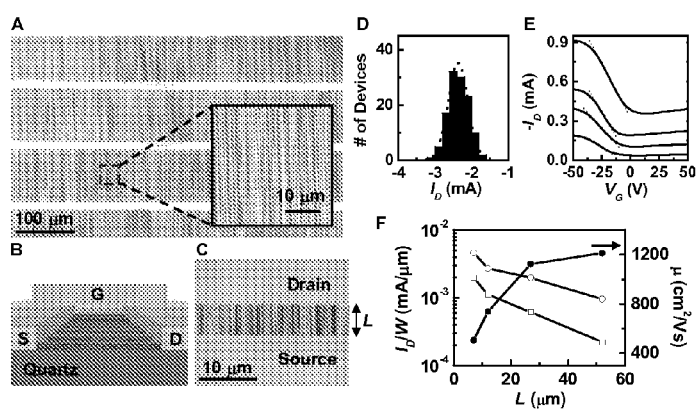
FIG. 25. (A) Scanning electron microscope (SEM) image of a pattern of aligned SWNTs formed by chemical vapor deposition growth on a quartz substrate. The bright horizontal stripes correspond to the regions of iron catalyst. The inset provides a magnified view. These arrays contain ~5 SWNTs/μm. (B) Schematic illustration of the layout of a type of transistor that incorporates aligned SWNTs as the semiconductor. The device uses source, drain and gate electrodes and a dielectric layer formed sequentially on top of the SWNTs on quartz. (C) SEM image of the channel region of such a device. The distance between the source and drain electrodes defines the channel length (L). (D) Output current ($I_D$) measured on more than one hundred two terminal test structures, using electrodes with widths, W, of 200 μm separated by distances (i.e. channel lengths), L, of 7 μm, evaluated with an applied potential, $V_D$, of 10V. (E) Transfer curves (i.e. $I_D$ as a function of gate voltage, $V_G$) measured from transistors with L=7, 12, 27, and 52 μm, from top to bottom, and W=200 μm at $V_D$=−0.5V. These devices used polymer gate dielectrics, with thicknesses of ~1.5 μm. (F) Width normalized 'on' and 'off' currents (open circles and squares, respectively) and linear regime mobilities (solid circles) as a function of L.
Figure 29:
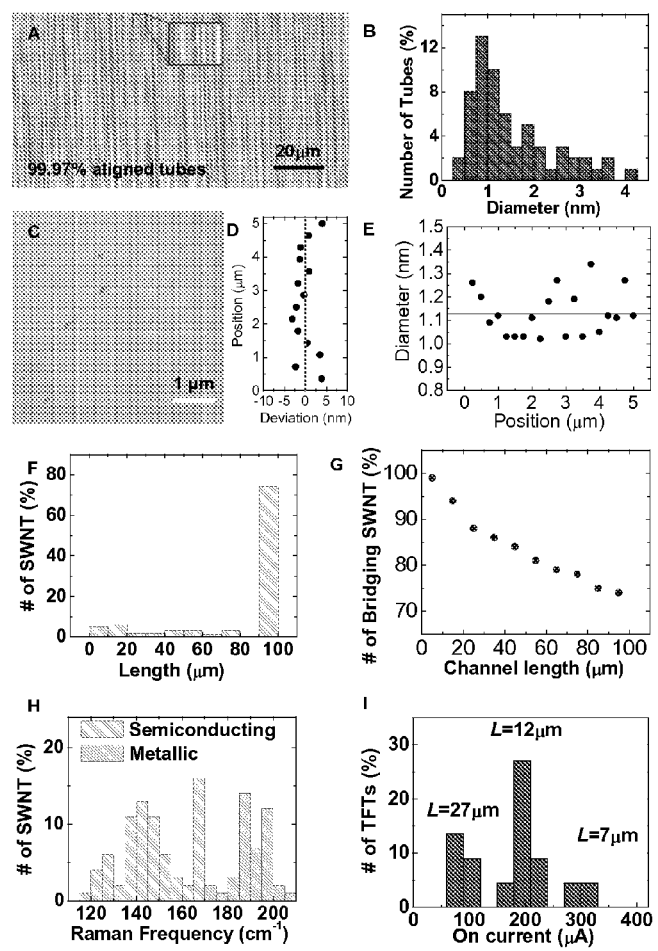
FIG. 29: (A) SEM of an array of SWNTs showing 99.97% alignment. The inset shows a small segment of a tube that is misaligned. (C) AFM image of an array of SWNTs showing excellent parallelism. (D) Plot of deviation in the position of a SWNT as a function of position along its length, measured relative to a perfect linear shape. To within the uncertainties of the AFM instrument, the SWNT is linear in its shape. (B) Distribution of SWNT diameters measured from an array like that shown in (A). (E) Diameters of SWNT measured as a function of position across an array. (F) Distribution of SWNT lengths in an array similar to that shown in FIG. 25(A) of the main text. (H) Distribution of radial breathing mode frequencies as measured by Raman scattering from individual tubes in an array. (G) Measured numbers of SWNTs that bridge the gap between source and drain electrodes spaced by some distance (i.e. the channel length). (I) Measured on currents in transistors (TFTs) with different channel lengths (L).

FIG. 25 shows scanning electron microscope (SEM) images of representative arrays of SWNTs, SEM images and schematics of their integration into transistors and some electrical properties. Chemical vapor deposition (CVD) growth on ST cut quartz wafers using patterned stripes of iron catalyst (submonolayer films with ~0.3 nm nominal thicknesses) and methane feed gas produced the arrays. The arrays formed in this manner consist of individual SWNTs with average diameters of ~1 nm, average lengths of up to 300 µm, and densities (D) as high as 5 SWNTs/µm. More than 99.9% of the SWNTs lie along the $[2,\bar{1},0]$ direction of the quartz, to within <0.01 degree, with linear configurations, to within the measurement resolution of an atomic force microscope (i.e. ~10 nm, over lengths of a few microns). (FIG. 25A, and FIG. 29). This nearly ideal layout, especially as obtained at high D, represents a significant advance that is important to the device results presented here. The present liftoff and iron thin film catalyst processing results in very good control of the position, density and alignment of nanotubes of the array. Another related way to pattern the catalyst on the receiving surface of the guided growth (or guided deposition) substrate is to do patterned material removal (e.g., etching) of a film of iron on the guided growth substrate. In this embodiment, a film of catalyst, optionally having uniform thickness, is provided on the receiving surface of the guide growth (or deposition) substrate and material is removed from the film in selected regions, for example via etching or desorbtion techniques, thereby making a pattern of catalyst-containing regions and regions having substantially no catalyst present.

The simplest method to integrate these arrays into transistors begins with photolithography to define source and drain electrodes (Ti; 1 nm/Pd; 20 nm) on the SWNT/quartz substrates in regions between the catalyst stripes. Oxygen reactive ion etching through photolithographically patterned masks removes SWNTs everywhere except in the channel regions. Spin casting a uniform epoxy gate dielectric (1.5 µm; SUB, Microchem Corp.) and photolithographically defining top gate electrodes (Ti; 1 nm/Au; 20 nm) aligned to the channel regions yields arrays of electrically isolated transistors. FIG. 25B shows an angled view schematic illustration of a device with this layout. FIG. 25C presents an SEM image collected after patterning the source and drain electrodes. The devices had channel lengths (L) between 7 and 52 µm, all with widths (W) of 200 µm. For these geometries, each device incorporates ~1000 linear, parallel SWNTs in the channel, most (e.g. >80%, even for L=52 µm) of which span the source/drain electrodes. This large number of active tubes per device provides high current outputs and good statistics for uniform, reproducible properties. FIG. 25D presents measurements that show a ~10% standard deviation in source/drain currents, $I_D$, measured in more than one hundred two terminal test structures (source/drain voltage, $V_D$=10 V; L=7 µm; W=200 µm). The statistics associated with the large numbers of tubes in these devices and the long tube lengths (compared to L) suggest that even much better uniformity in the properties is possible. The width of the distribution in FIG. 25D are likely dominated by processing related effects (e.g. even single crystal silicon devices that we fabricate in the same cleanroom facility exhibit comparable levels of variation).

FIG. 25E shows typical transfer characteristics measured from a set of devices (L=7, 12, 27, and 52 µm; W=200 µm). The responses indicate p channel behavior, consistent with observations in undoped single tube devices that use similar materials and designs. The large current outputs, even at these small source/drain biases ($V_D$=−0.5 V) and low capacitance dielectrics, are consistent with the high channel conductance provided by the multiple tubes.

Both the on and off currents vary, approximately linearly, with the channel length, indicating diffusive transport for this range of L. The ratios of these currents are in a range (between 3 and 7), consistent with the population of metallic SWNTs expected from CVD growth and as verified by Raman measurements, with a moderate, but systematic, increase in on/off ratio with channel length. Extrapolations of device resistances to zero channel lengths suggest the presence of non-negligible effects of contacts, consistent with observations in single tube devices. Per tube resistances (i.e. inverse of the average per tube conductances) associated with transport through the metallic tubes and the semiconducting tubes in their 'on' state (i.e. biased to the largest gate voltages $V_G$), can be determined by multiplying the corresponding device level resistances by the estimated number of (semiconducting or metallic) tubes that span the source and drain electrodes. We find that the latter quantity is, for example, 36+/−10 kΩ□/μm for L=52 μm, where the effects of contacts are least significant, assuming that ~⅔ of the SWNTs are semiconducting and ~80% of them span the source/drain electrodes. (Similar values are obtained at L=27 μm, with ~1.5-2 times higher values at shorter channel lengths.) To compare to single tube device results, we computed an expected value using reported diameter dependent resistances and diameter distributions measured from these arrays. The resulting resistance is ~21 KΩ□/μm, which is somewhat lower but in the same range as that inferred from the measurements reported here. The metallic tubes, on the other hand, show characteristic resistances between ~35 and ~55 kΩ□/μm, depending on channel length and methods used to separate the metallic currents from the slight ambipolar operation that is observed in these devices. Although we have observed, in other devices, resistances as low as ~20 kΩ□/μm, these values are all substantially higher than the best reported values from measurements on single metallic tubes: ~6 kΩ/μm. This observation suggests that the likelihood for growth or processing related defects in the metallic tubes (whose chemical reactivity is relatively high) is higher than that for semiconducting tubes.

The low on state resistances of the semiconducting tubes translate into good device level transistor properties. FIG. 25F presents linear regime device mobilities as a function of channel length, computed using slopes measured from the transfer curves (e.g. representative line in FIG. 25E), channel widths defined by the physical widths of the source/drain electrodes (W=200 μm), and a parallel plate model for the capacitance, C, according to $$\mu_{dev} = \frac{L}{WC} \frac{1}{V_d} \frac{\partial I_d}{\partial V_g}.$$

The results indicate device level mobilities as high as ~1200 cm²/Vs for L>27 μm, with decreasing values at smaller L, likely due to effects of the contacts (19-20). The validity of this simple parallel plate model for the capacitance and, more generally, the nature of electrostatic coupling of the tubes to the gate, can be explored through measurements of devices with different D.

FIGS. 26A and 26B present SEM images of SWNT arrays with D=0.2 SWNTs/μm and 5 SWNTs/μm, obtained by controlling the growth conditions. The responses of devices built with these arrays are qualitatively similar to those illustrated in FIG. 25. The currents that increase with D. The nature of this scaling depends on the influence of fringing fields and partial electrostatic screening by the tubes on the capacitance, C, especially for this case where the average tube spacings (i.e. between ~200 nm to 5 μm) are in a range that brackets the thickness (1.5 μm) of the gate dielectric.

FIGS. 26C and 26D present the results of calculations that include these effects as well as the quantum nature of the tubes and their intrinsic capacitance. FIG. 26E shows measurements on devices with four values of D. The dashed curve presents the expected dependence of currents in the 'on' state (i.e., Vd=−0.5 V; VG=−50 V) on D, as determined using rigorous calculations of C. The nonlinear variation results from changes in the electrostatic coupling efficiency to the gate. For D=5 SWNTs/μm, the average separation between the tubes (~200 nm) is substantially smaller than the thickness of the dielectric (1.5 μm), which results in efficient screening of the gate field and a correspondingly small contribution from fringing fields to the capacitance. In this regime, the calculated C differs, only by ~10%, from that determined by a simple parallel plate model, thereby validating the device level mobility analysis in the previous paragraph. The 'off' currents are expected to show an approximately linear variation with D, since transport through the metallic tubes is independent of electrostatic coupling to the gate. The trends are qualitatively consistent with the model. An interesting prediction is that once D is large enough that C is approximately equal to the parallel plate value, there is little additional increase in the device level mobility with further increases in D. In other words, the experimentally achieved D=5 SWNTs/μm, with the relatively thick dielectric used here, yields a mobility that is near the maximum achievable with this system.

These models for capacitance can also be used to infer the average per tube mobilities, which we denote $\langle \mu_t \rangle$, from the measured device responses. In this calculation, we use $$\langle \mu_t \rangle = \frac{L}{WC_tD_s} \frac{1}{V_d} \frac{\partial I_d}{\partial V_g}$$

where $C_t$ is the capacitance per unit length for a semiconducting tube in the array, and $D_s$ is the number of active semiconducting tubes (i.e. those that span the source/drain electrodes) per unit length along the width of the device. For the long channel devices (L=52 μm) with D=5 SWNTs/μm, this value is ~2200±200 cm²/Vs, if we assume that ~⅔ of the SWNTs in the channel are semiconducting and that ~80% of them span the source and drain electrodes, such that $D_s$ is ~3 SWNTs/μm. As with the device mobility, the per tube mobility decreases with channel length (e.g. ~800 cm²/Vs, L=7 μm), which is qualitatively consistent with expectations based on contact effects reported in single tube devices. The mobilities obtained at long channel lengths, therefore, provide the best estimates of the intrinsic values. Averaging the diameter dependent mobilities inferred from single tube devices, weighted by the measured distribution of tube diameters in the arrays (FIG. 29), yields a value of ~4300 cm²/Vs if the large diameter tubes (3-4 nm) in the arrays are included in the calculation, and ~3000 cm²/Vs if these tubes are assumed to be small bundles and, for this reason, not included. These values are somewhat higher than the results determined from measurements on the array devices, although the latter is only moderately so. An analysis of per tube mobilities in devices with various tube densities (D=0.2, 0.5, 1, 5 SWNTs/μm, with L=12 μm) yields ~1100±100 cm²/Vs, with a weak or negligible dependence on D. Collectively, these results provide further validation of the analysis approach and the models for the capacitance, and they indicate that the electronic properties computed for individual semiconducting tubes in the arrays are not dissimilar from those observed in single tube devices.

Figure 26:
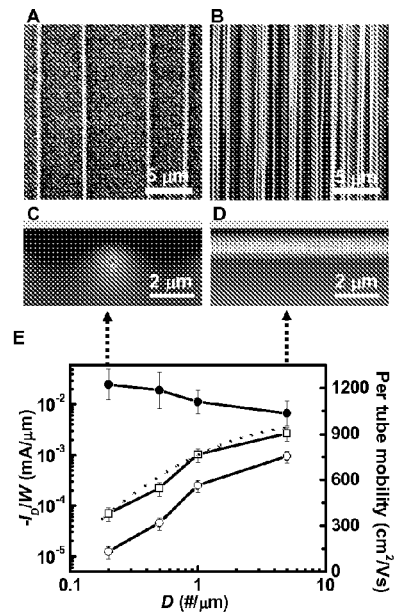
FIG. 26. (A) Scanning electron microscope (SEM) images of an array of aligned SWNTs with density ~0.2 SWNTs/μm and (B) SEM image of a similar array, but with ~5 SWNTs/ (C) Color contour plots and equipotential lines for the computed electrostatic coupling of a gate electrode (top yellow plate) through a dielectric layer to an array of SWNTs with low density (i.e. average spacing between the SWNTs is larger than the gate dielectric) and (D) with high density array (i.e. average spacing between the SWNTs is smaller than the gate dielectric). The former and latter results show field distributions that are similar to those associated with a single tube and a parallel plate, respectively. (E) On and off currents (open squares and circles, respectively) measured in transistors built with arrays of SWNTs with different densities, D. The thickness of the gate dielectric was ~1.5 μm. The red dashed line shows the variation in the on current determined by computed capacitance coupling. The plot also shows the average per tube mobilities computed from transfer curves measured from these devices.
Figure 27:
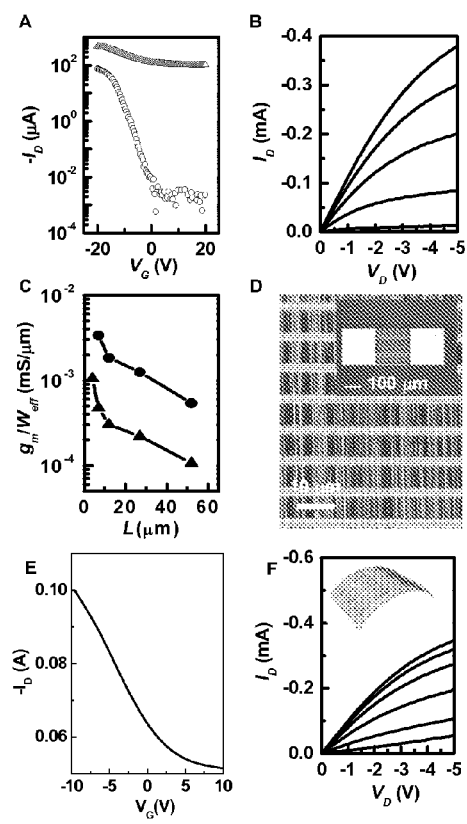
FIG. 27. (A) Transfer curves from a transistor that uses aligned arrays of SWNT (D=4 SWNTs/μm) transferred from their quartz growth substrate to doped silicon substrate with a bilayer dielectric of epoxy (150 nm)/SiO$_2$ (100 nm). The data correspond to measurements on the device before (open triangles) and after (open circles) an electrical breakdown process that eliminates metallic transport pathways from source to drain. This process improves the on/off ratio by more than 10,000 times. (B) Full current-voltage characteristics of the same device, measured after breakdown, illustrating well behaved response. The gate voltage varies from −5 V to 5 V (top to bottom). (C) Transconductance per unit effective width (gm/Weff) as a function of channel length (L), for devices (D=2 SWNTs/μm) that use PEO electrolyte (solid circles; VD=−0.1 V) and 10 nm HfO2 (solid triangles; VD=−0.5 V) for the gate dielectric, respectively. ((D) Scanning electron micrograph (SEM) of a device that uses interdigitated source/drain electrodes. The inset shows an optical micrograph. (E) Transfer curve measured from such a device. (F) Current-voltage measurements on device formed on a flexible plastic substrate (PET), with D=3 SWNTs/μm, a gate dielectric of polyimide (1.6 μm thick) and indium tin oxide (150 nm thick) as the gate, with L=27 μm and W=200 μm. The linear regime field effect mobility was ~480 cm$^2$/Vs, representing the highest p channel mobility observed for a device on plastic. The inset provides a schematic illustration.

Although the devices of FIGS. 25 and 26 have high mobilities, their on/off ratios are modest, due to the presence of metallic tubes, and their transconductances are low, due to the use of low capacitance gate dielectrics. The on/off ratios can be improved by destroying the metallic tubes in a breakdown procedure that involves slowly increasing $V_D$, while holding $V_G$ at a large positive value. This process is similar to that previously described for devices based on single multiwalled tube devices and on random networks of SWNTs (FIG. 27A and FIG. 31A). To implement it here, the SWNT arrays were first transferred from their quartz growth substrate onto a substrate of epoxy (150 nm)/$SiO_2$ (100 nm)/Si. The epoxy/$SiO_2$ bilayer and Si provided the gate dielectric and gate, respectively, in a backgate geometry that leaves the SWNTs exposed to air to facilitate the breakdown process. Transfer curves in FIG. 27A, collected before and after this process for a typical case D=4 SWNTs/μm, demonstrate that the on/off ratios can be increased by four orders of magnitude, or more. FIG. 27B shows full current/voltage characteristics recorded after breakdown. The response is consistent with a well-behaved device (i.e. saturated and linear current outputs for $V_D \gg V_G$ and $V_D \ll V_G$, respectively), offering large current output even with low operating voltages (selected to avoid hysteresis) and low capacitance dielectrics.

Increasing the capacitance of the gate dielectric improves the transconductance, as expected. FIG. 27D shows channel length scaling of the width normalized transconductances measured in devices (D=2 SWNTs/μm) with either a 10 nm layer of $HfO_2$ (at $V_D=-0.5$ V) or a polymer electrolyte (at $V_D=-0.1$ V) as the gate dielectric. Using an effective width determined by the summed widths of the SWNTs in the channel (in a manner analogous to similar analyses of single tube devices) we find scaled transconductances ($g_m/W_{eff}$) as high as 700 S/m (at $V_D=-0.1$ V) for electrolyte gating and 440 S/m (at $V_D=-0.5$ V) for $HfO_2$. We note that the transconductances, as scaled by the physical widths of the transistor channels in these cases, are much lower. Large absolute values of transconductance, and correspondingly high levels of current output, are possible by increasing $W_{eff}$ through the use of interdigitated source/drain electrodes. In this approach, each SWNT in the array is active in the device at multiple separate segments along its length, in a manner analogous to related demonstrations in single tube systems. FIGS. 27E and F present images and transfer curves from such an interdigitated SWNT transistor, in which current outputs could approach up to 0.1 A (due to the measurement limit of Agilent 4155C, we could not measure higher current).

The transfer process used to build these devices enables integration on a wide range of substrates, including flexible plastics. As an example, FIG. 27C shows a schematic illustration and electrical characteristics of a device (D=3 SWNTs/μm) on a sheet of polyethylene terephthalate), where polyimide (1.6 μm thick) and indium tin oxide (150 nm thick) provide the gate dielectric and gate, respectively, with L=27 μm and W=200 μm. The linear regime mobility, computed using a parallel plate approximation for the capacitance, is ~480 $cm^2/Vs$, which represents the highest value achieved in a p channel device on plastic.

Figure 28:
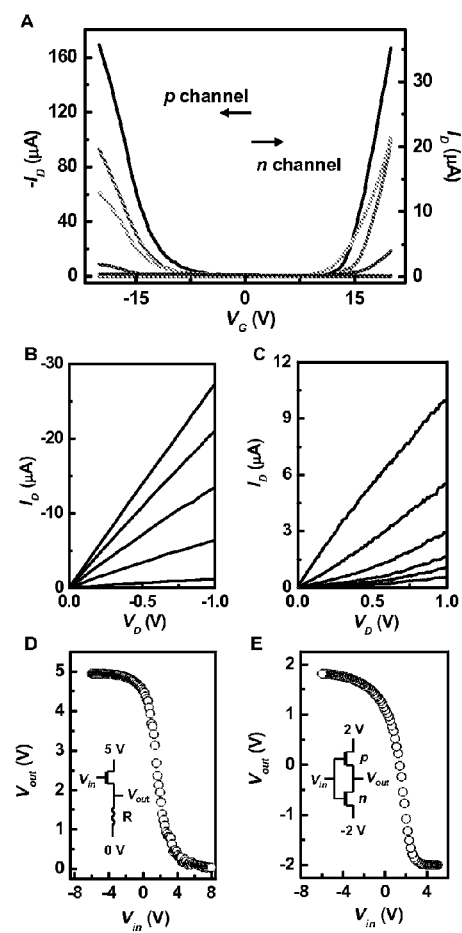
FIG. 28. (A) Transfer curves of n- and p-channel transistors that use aligned arrays of PEI coated and uncoated arrays of SWNTs, respectively. All devices were processed using the electrical breakdown process to achieve high on/off ratios. In the case of the n channel devices, this process was performed before PEI coating. (B) Current-voltage response of a typical p channel device in a regime of small $V_D$. (C) Similar results from an n channel device. (D) Transfer curve from a PMOS inverter that uses a SWNT array transistor for the drive, and a two terminal device with SWNT arrays for the resistive load. The inset provides a circuit schematic. (E) Similar information for a CMOS inverter that combines p- and n-channel SWNT array transistors.

Doping approaches based on polymer coatings, as previously described with single tube devices, enable n-channel operation with the arrays. In particular, coating with poly (ethyleneimine) (PEI, Sigma Aldrich) affects a change from unipolar p-channel operation to unipolar n-channel operation, as illustrated in FIG. 28A. These devices used SWNTs transferred onto $SiO_2$ (100 nm)/Si and have L=4, 7, 12, and 27 μm all with W=200 μm and processed by electrical breakdown procedures to eliminate metallic tubes. FIGS. 28B (L=12 μm; W=200 μm) and 4C (L=4 μm; W=200 μm) show current/voltage characteristics of devices without and with PEI coatings measured at small $V_D$. The reduced currents in the n-channel mode are similar to observations in single tube and random network devices. These and the other results provide straightforward means to form circuits based on SWNT-array devices. Complementary and unipolar logic gates (i.e. inverters) provide simple illustrations of this possibility. FIG. 28D shows a PMOS inverter which uses an SWNT array based p-channel transistor (response shown in FIG. 28B) as the drive and an array of SWNTs, partially processed by electrical breakdown, as the load. Combining n- and p-channel devices formed CMOS inverters, as illustrated in FIG. 28E, where the n-channel and p-channel devices used L=4 μm and 7 μm respectively; with W=200 μm for both. The gains observed in the PMOS and CMOS inverters were 2.75 and 1.8, respectively, as measured at $V_{DD}=5V$ for the PMOS device and $V_{DD}=\pm 2$ V for the CMOS device.

The results presented here provide a straightforward and scalable path to SWNT based thin film electronics, with high performance capabilities. The array geometry, particularly at the levels of perfection achieved here, should also be useful for a range of other applications, which currently exist only in the form of single tube implementations. Examples include light emitting diodes, photodetectors, chemical sensors, nanoelectromechanical oscillators, and electrically or thermally conductive elements.

FIG. 29A provides SEM of an array of SWNTs showing 99.97% alignment. The inset shows a small segment of a tube that is misaligned. FIG. 29C provides an AFM image of an array of SWNTs showing excellent parallelism. FIG. 29D provides a plot of deviation in the position of a SWNT as a function of position along its length, measured relative to a perfect linear shape. To within the uncertainties of the AFM instrument, the SWNT is linear in its shape. FIG. 29B provides distribution of SWNT diameters measured from an array like that shown in FIG. 29A. FIG. 29D provides diameters of SWNT measured as a function of position across an array. FIG. 29F provides the distribution of SWNT lengths in an array similar to that shown in FIG. 25(A) of the main text. FIG. 29H provides the distribution of radial breathing mode frequencies as measured by Raman scattering from individual tubes in an array. FIG. 29G provides measured numbers of SWNTs that bridge the gap between source and drain electrodes spaced by some distance (i.e. the channel length). FIG. 29I provides measured on currents in transistors (TFTs) with different channel lengths (L).

Figure 30:
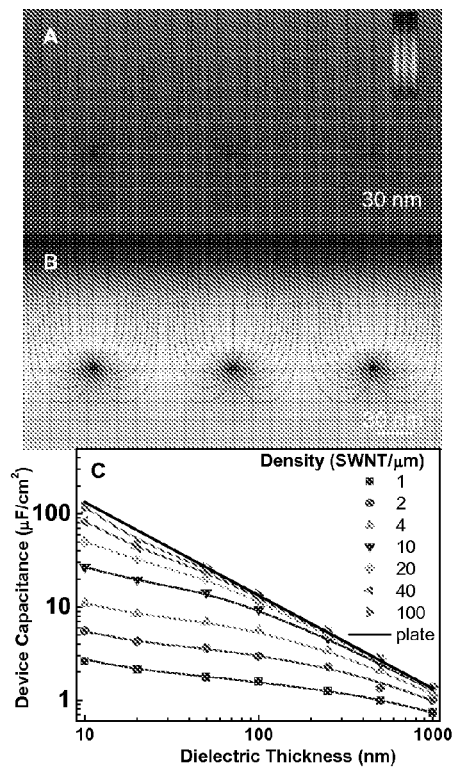
FIG. 30: Modeling results for the capacitance between an array of conducting wires and a gate electrode, separated by a dielectric.

FIG. 30 provides modeling results for the capacitance between an array of conducting wires and a gate electrode, separated by a dielectric.

FIG. 31A provides current-voltage response of a device during electrical breakdown procedures. FIG. 31B provides a schematic illustration of a device. FIG. 31C provides calculated field effect mobility as a function of on/off ratio. FIG. 31D provides on and off currents as a function of on/off ratio.

Figure 32:
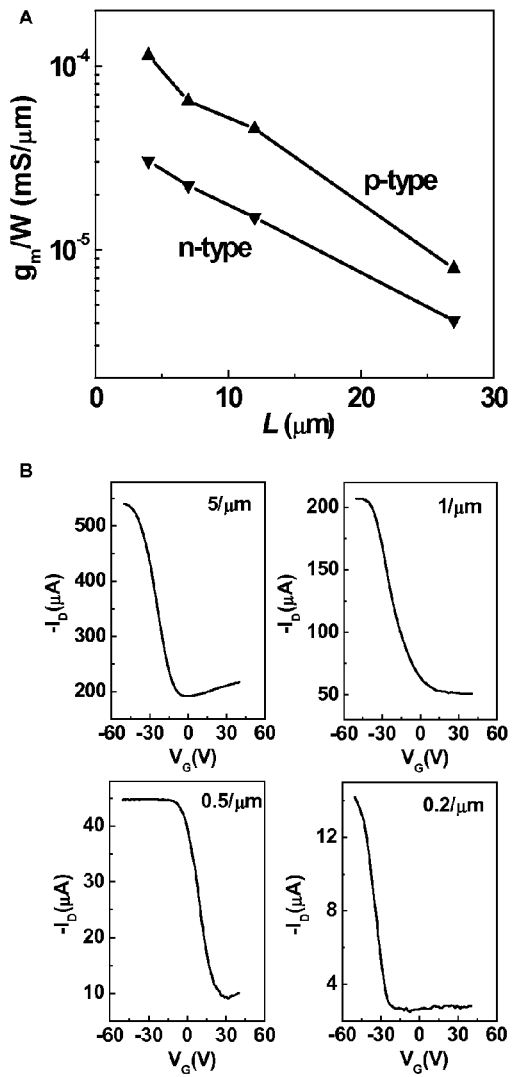
FIG. 32: Transconductance per unit width ($g_m/W$) as a function of channel length (L), for n and p type transistors that use arrays of SWNTs (top frame). The bottom frames show transfer curves measured from typical devices.

FIG. 32 provides a plot of Transconductance per unit width ($g_m/W$) as a function of channel length (L), for n and p type transistors that use arrays of SWNTs (top frame). The bottom frames show transfer curves measured from typical devices.

6(a) Methods
6(a)(i) Fabrication of Aligned SWNT Array Devices
SWNT Growth:
Aligned SWNTs were grown using catalytic chemical vapor deposition (CVD). Prior to the growth ST, cut quartz wafers (Hoffman Inc.) were annealed at 900° C. in air for 8 hours. The first step of the growth process involved photolithography to open lines (W=10 μm and L=1 cm) in a layer of photoresist (AZ 5214) on the quartz followed by electron beam evaporation ($3 \times 10^{-6}$ Torr; Temescal CV-8) of thin iron films (Kurt J. Lesker Co.; 99.95%) with thickness of <0.5 nm. Lifting off the photoresist with acetone left a pattern of iron in narrow strips, with submonolayer coverages. Oxidization of the iron at 550° C. in air forms isolated iron oxide nanoparticles with diameter near ~1 nm. The particles formed the catalytic seeds for CVD growth of the SWNTs. Heating to 900° C. in a hydrogen environment reduced the catalyst. Purging with hydrogen at 900° C. for 5 min and then introducing a flow of methane (1900 standard cubic centimeters per minute (sccm)) and hydrogen (300 sccm) at 900° C. for 1 hour led to the growth of SWNTs. The quartz substrates were placed on polished Si wafers in the growth chamber to enhance the homogeneity of the temperature distribution on their surfaces. The SWNTs preferentially grow along the [2, $\bar{1}$, 0] direction.

Aligned SWNT Arrays:

We found that the procedures described above yield the highest densities, the longest tubes and the best alignment, compared to many other explored growth procedures. The optimized conditions enabled average lengths of SWNT between 50 μm to 300 μm. The density of the SWNT array can be controlled by changing the thickness of the iron film and other parameters associated with the growth. The density of the array shown in FIG. 25A is ~5 SWNT/μm, obtained with catalyst patterned into 10 μm wide stripes separated by 100 μm. FIG. 29 summarizes many measurements on these arrays. The ratio of the summed lengths of segments of aligned SWNTs to those of misaligned SWNTs is ~0.9997, as shown in FIG. 29A. The only misaligned segment in this image appears in the inset. Atomic force microscopy quantified the distribution of diameters (FIG. 29B) and the degree of alignment and linearity (FIGS. 29C and 29D) of the SWNTs. Most of the tubes have diameters near 1 nm. More than 99% of the tubes are aligned to within 1 degree along lengths of 100 μm. The SWNTs have excellent linearity, with deviations from a perfect linear shape of <10 nm along lengths of several microns, limited by the resolution of the AFM. FIG. 29F shows that most SWNTs have lengths equal to the spacing between the catalyst stripes. The percentage of SWNTs that span source/drain electrodes, as a function of separation between these electrodes (i.e. the channel length), is shown in FIG. 29G. Raman measurements, summarized in FIG. 29H, indicate that roughly ⅔ of the tubes are semiconducting. These measurements used 632 nm excitation light because this wavelength has resonances with both metallic and semiconducting nanotubes in our range of diameters. FIG. 29G shows the histogram for the radial breading mode. Wavenumbers between 120 and 175 $cm^{-1}$ correspond to the second optical transition of semiconducting SWNTs; those between 180 to 220 $cm^{-1}$ correspond to the first optical transition of metallic SWNTs. FIG. 29I shows some statistical results on devices (W=200 μm) with different channel lengths. All devices used Pd (20 nm)/Ti (2 nm) for source and drain electrodes, aligned tubes (D=1 tubes/μm) for the semiconductor, epoxy (1.5 μm; SU8) for the gate dielectrics and Au (20 nm)/Ti (2 nm) for the gate electrodes.

Top Gate and Transferred Bottom Gate TFTs:

We fabricated top gate and bottom gate TFTs using aligned nanotubes. To make a top gate TFTs, Ti (1 nm)/Pd (20 nm) was then evaporated ($3 \times 10^{-6}$ Torr; Temescal CV-8) through photolithographically defined openings for the source/drain electrodes, on a quartz substrate with grown SWNTs. Lifting off the photoresist with acetone completed the fabrication of the source/drain electrodes. For the gate dielectric, we spin coated a photocurable epoxy (SU8-2, Microchem Corp.) at 3000 rpm for 30 seconds. Prebaking at 65° C. (2 min) and 95° C. (2 min) eliminated the solvent. A 20 seconds UV-exposed was done. Postexposure baking at 65° C. (2 min) and 95° C. (2 min) initiated full curing. On top of this layer, we defined the gate pattern (Cr (2 nm)/Au (20 nm)) using photolithography and liftoff. With another layer of photolithographically defined photoresist (Shipley 1818) and reactive ion etching (RIE), we created openings in the epoxy to enable probing of the source and drain electrodes.

For certain bottom gate devices, patterned align nanotubes on quartz were transferred onto $SiO_2$ (100 nm)/Si substrates. To pick up the aligned tubes, a 100 nm layer of Au was first deposited on the nanotubes/quartz by electron beam evaporation ($3 \times 10^{-6}$ Torr, 0.1 nm/sec; Temescal CV-8). On top of this Au layer, a film of polyimide (polyamic acid, Aldrich) was spin coated at 3000 rpm for 30 seconds and cured at 110° C. for 2 minutes. Physically peeling away the Pl/Au/SWNT film lifted the tubes off of the quartz with nearly 100% transfer efficiency. Placing this film on the receiving substrate ($SiO_2$/Si) after spin coating (3000 rpm for 30 sec) it with a thin adhesive layer of 150 nm SU8-2 (20% dilution in SU8 thinner) and then etching away the PI by RIE (150 mTorr, 20 sccm $O_2$, 150 watt 35 min) left the Au/SWNTs on the substrate. Photolithography and etching of the Au (Au-TFA, Transene Co.) defined Au source and drain electrodes. In the final step of the fabrication, SWNTs outside of the channel regions were removed by RIE to isolate the devices.

Electrolyte and $HfO_2$ Gate Dielectric TFTs:

To achieve high transconductances, we used high capacitance gate dielectrics using 10 nm $HfO_2$ and polymer electrolyte gating. The electrolytes were made by directly dissolving $LiClO_4 \cdot 3H_2O$ in poly(ethyleneoxide) (PEO, $M_n$=550) or in polyethylenimine (PEI, $M_n$=800) in air at room temperature with 2.4:1 and 1:1 polymer to salt weight ratios, respectively. The electrolytes were injected into a polydimethylsiloxane (PDMS) fluidic channel laminated over aligned arrays of SWNTs on quartz substrates with source/drain electrodes defined according to the previously described procedures. In these devices, gate voltages were applied through a silver wire dipped in the electrolyte. The $HfO_2$ was prepared on a doped silicon substrate using atomic layer deposition (ALD) (Savannah 100, Cambridge NanoTech Inc.). $HfO_2$ was grown using $H_2O$ and $Hf(NMe_2)_4$ (99.99+%, Aldrich) at a substrate temperature 150° C. SWNT arrays were transferred onto the $HfO_2$ using procedures like those described above, but without the SU8 adhesive layer. Photolithography defined electrodes of ~20 nm thick Au provide source and drain.

N-Type TFTs and Inverter:

Spin coating layers of PEI (~800, Aldrich.) on the top of the nanotubes switches the electrical properties from p-type to n-type in TFT devices. To form these coatings, PEI was first dissolved in methanol with a volume concentration of 1:5. Spin casting directly onto the SWNTs at 2000 rpm for 30 seconds created the coatings. Heating at 50° C. for 10 hours gave n-channel TFTs. We connected SWNT-array TFTs to make inverters. For PMOS devices, one TFT was used as a resistor load, while the other TFT served as the drive. CMOS inverter circuits were formed with uncoated p-channel TFTs and PEI coated n-channel TFTs.

6(a)(ii) Device Characterization and Mobility Calculations

Electrical Breakdown Process:

One method to obtain high on/off ratios involves electrical breakdown of the metallic nanotubes. For the devices described here, this process involved sweeping the drain voltage from 0 V to negative values while holding the gate voltage at +20 V. Multiple sweeps, up to voltages of 50 V, eventually eliminated virtually all of the off state current in the devices.

Figure 31:
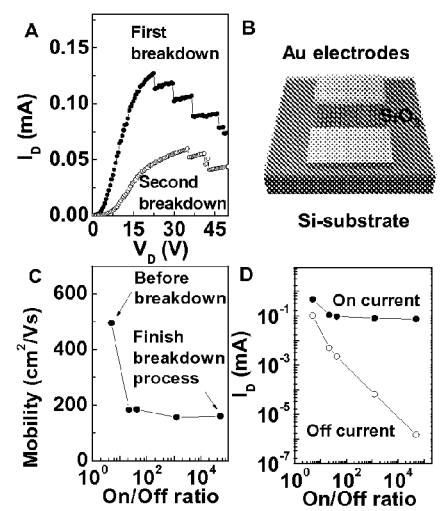
FIG. 31: (A) Current-voltage response of a device during electrical breakdown procedures. (B) Schematic illustration of a device. (C) Calculated field effect mobility as a function of on/off ratio. (D) On and off currents as a function of on/off ratio.

The current reductions tended to occur in well-defined steps of ~25 µA, consistent with expectation based on single tube device studies. FIG. 31 summarizes some aspects of these procedures, as performed on devices that consist of D=4, L=12 µm, W=200 µm on Su8 (150 nm)/SiO$_2$ (100 nm)/Si substrate with 100 nm Au layer source and drain electrodes.

Gate Capacitance and Mobility:

Mobility calculation requires knowledge of the charge density of a single SWNT in the channel and the average drift electric field: µ=I I(ρ E). We estimate the latter as $V_d$/L. The former depends on the gate voltage according to ρ=C $V_g$, where C is the specific capacitance per unit length of the single tube in the array, which depends on the device geometry. We define the field-effect mobility as $$\mu = \frac{L}{V_d C} \cdot \frac{dI}{dV_g}$$

for the single SNWT current channel and similarly for the effective field-effect mobility of $$\mu = \frac{L}{V_d C_W W} \cdot \frac{dI}{dV_g}$$

where $C_W$ is the specific capacitance per unit area. For example $C_W = \varepsilon_o \varepsilon_{ins}/d$ is the specific capacitance (per unit area) of the plate capacitor.

The relation between $C_W$ and C is important for our conclusions on the TFT performance. In order to obtain the total charge density (and current) of the TFT device with D tubes per unit width we have to multiply the single tube capacitance by D:

$$C_W = D \cdot C$$

As we have shown in Ref. [S. V. Rotkin, in *Applied Physics of Nanotubes*, (Ed: Avouris P.), Springer Verlag GmbH Co., KG 2005.] the SWNT capacitance has two contributions: the quantum one and the geometrical one. The former is given by the SWNT density of states: $C_Q = e^2 g_o \sim 3.2$ [S. Rosenblatt, Y. Yaish, J. Park, J. Gore, V. Sazonova, P. L. McEuen, *Nano Lett.* 2002, 2, 869. K. A. Bulashevich, S. V. Rotkin, *Jetp Lett.* 2002, 75, 205.]. The latter has been recently derived by us for an infinite array of parallel SWNTs with uniform spacing 1/D in:

$$C_{array}^{-1} = \frac{1}{2\pi\varepsilon_0\varepsilon_s} \cdot \log\left[\frac{\sinh(2\pi t D)}{\pi R D}\right]$$

where R is the SWNT radius, t is the distance to the gate electrode, $\varepsilon_s$ is the dielectric constant of the surface/interface where we place the tubes. For the SWNT in the quartz/SWNT/SU-8 sandwich structure the dielectric constant $\varepsilon_s = (\varepsilon_{SiO2} + \varepsilon_{SU-8})/2 = \sim 4$ due to the low dielectric contrast between theses materials: quartz substrate ($\varepsilon_{SiO2} = 4.1$), gate dielectric (SU-8 Epoxy, $\varepsilon_{SU-8} = 3.9$). For the case of the SWNT array been transfer at the quartz or resin surface, the effective capacitance is half of the substrate capacitance $\varepsilon_s = (\varepsilon_{SiO2}/_{SU-8} + 1)/2 = \sim 2$ where 1 is the dielectric permittivity of the air.

The specific capacitance per unit area for the SWNT TFT has an analytical expression:

$$C_W = D \cdot C = \frac{D}{\left[C_Q^{-1} + \frac{1}{2\pi\varepsilon_0\varepsilon_s} \cdot \log\left[\frac{\sinh(2\pi t D)}{\pi R D}\right]\right]}$$

This expression allows series expansion in a small unit-less parameter 1/(D t) which is just the number of SWNTs in an area of the width t, where the tubes are still electrostatically coupled. The tubes at the longer distances are completely screened by the gate. Then the specific capacitance reads as:

$$C_W = \frac{D\varepsilon_0\varepsilon_s}{\left[\varepsilon_0\varepsilon_s C_Q^{-1} + \frac{1}{2\pi} \cdot \log\left[\frac{\exp(2\pi t D)}{2\pi R D}\right]\right]} =$$

$$\frac{D\varepsilon_0\varepsilon_s}{\left[\varepsilon_0\varepsilon_s C_Q^{-1} + \left[tD - \frac{1}{2\pi}\log(2\pi R D)\right]\right]} \approx \frac{\varepsilon_0\varepsilon_s}{t} \cdot [1 + o(Dt)]$$

where in last expression we single out terms of the order of Dt and smaller that must be neglected for the dense array D>>1/t. This expression allows us to estimate the TFT drain current as $$I_d = WDI_{SWNT} = WDCV_g\frac{V_d}{L} = WV_g\frac{V_d}{L}\frac{\varepsilon_o\varepsilon_s}{t} \cdot [1 + o(Dt)]$$

We can draw two conclusions: (1) this formula shows that the capacitance coupling of the SWNT TFT with the density higher than the inverse distance to the gate D>1/t is almost equal to the capacitance of the solid metal plate channel of the same geometry. (2) the effective mobility of the SWNT TFT saturates at this density due to the inter-tube screening: even though we may increase the number of current channels per unit width by increasing D, the overall current will be approximately constant due to lower charge density per individual channel. We note that this analysis does not consider fringing field effects due to the finite length of the TFT device which effects would result in slightly underestimated capacitance.

The capacitance of the SWNT array has a weak (log) dependence on the inter-tube distance 1/D. We have shown that the result for the capacitance coupling is only weakly sensitive to deviations from the even spacing assumption used in the above analysis. Numerical simulation confirms that neither variations in D in different parts of a single device, nor weak angle deviation contribute any significant correction to the capacitance value.

In the regime of D>>1/t we may also neglect the variation in the number of tubes per device. Even though the smaller number of tubes per device width means a bit smaller number of current channels it means also better capacitance coupling according to our formula above. These two effects cancel each other and, thus, the overall device conductance depends only on the effective device width.

FIG. 30 shows the capacitance of the array for different tube densities. The derivation assumes that the tube-tube distance and tube diameters are constant. Numerical values of the gate capacitance can be calculated by finite element technique. Scatter plot shows the values calculated in this way. The FEM results and the analytical expression show very good agreement for all densities. For very low density case where D<<2 t analytical expression goes to single tube values. Our tube densities are typically between 1 SWNT/µm to 8 SWNT/µm. We have built devices with different gate dielectric thickness (from 10 nm to 1.5 µm). If the gate thickness is much larger than the tube-tube distance, the array can be assumed as continuous film and the parallel plate capacitance can be used.

Example 7

Transfer and Substrate Patterning of Longitudinally Aligned Arrays of Single Walled Carbon Nanotubes Methods of the present invention optionally comprise the step of transferring longitudinally aligned nanotubes and/or nanotube arrays generated via guided growth or guided deposition. This aspect of the present invention is particularly beneficial for generating longitudinally aligned nanotubes and/or nanotube arrays on a wide variety of substrates, including flexible substrates (e.g., polymer substrates), functional substrates, planar substrates and/or contoured substrates, and generating longitudinally aligned nanotubes and/or nanotube arrays in selected spatial orientations, configurations and positions, including multilayer geometries.

In these methods nanotubes and/or nanotube arrays are assembled on a guided deposition or guided growth substrate and subsequently transferred to a receiving substrate. Transfer methods useful for some functional device fabrication applications preserve relative spatial orientations and/or positions of longitudinally aligned nanotubes transferred and/or preserve the density and/or extent of longitudinal alignment of the nanotube arrays transferred. Soft lithographic transfer methods, such as contact printing and dry transfer printing techniques, are particularly useful in this aspect of the present invention.

In some embodiments, nanotube arrays are sequentially transferred and integrated so as to form one or more single layer or multilayer structures patterned on a receiving substrate. The present invention includes methods, for example, wherein longitudinally aligned nanotube arrays are sequentially transferred on top of each other so as to generate a multilayer stack comprising a plurality of nanotube arrays each having a selected spatial orientation. The present invention includes methods wherein nanotube arrays in different layers comprise longitudinally aligned nanotubes that are parallel to each other (e.g. tubes in different arrays are parallel to each other). Alternatively, the present invention includes methods wherein nanotube arrays of different layers have different spatially orientations, such as a first nanotube array comprising nanotubes parallel to a first primary axis and a second nanotube array comprising nanotubes parallel to a second primary axis that is oriented not parallel to the first primary axis. Multilayer geometries of the present invention include first and second primary axes of stacked nanotube arrays that differ by a selected angular deviation, for example orthogonal first and second primary axes. Multilayer geometries of the present invention may comprise any number of overlaying nanotube arrays useful for a given application.

Multilayer array geometries accessed by the present methods have a number of properties useful for functional devices. First, multilayer nanotube array structures are capable of providing enhanced nanotube densities of and/or are capable of providing large area coverage of substrate surfaces with longitudinally aligned nanotubes. Second, multilayer array geometries also provide overlapping nanotube arrays characterized by a large number of tube-tube junctions. Third, multilayer array geometries provide nanotube array configurations having isotropic or selectively anisotropic optical, electrical and/or mechanical properties.

Figure 33:
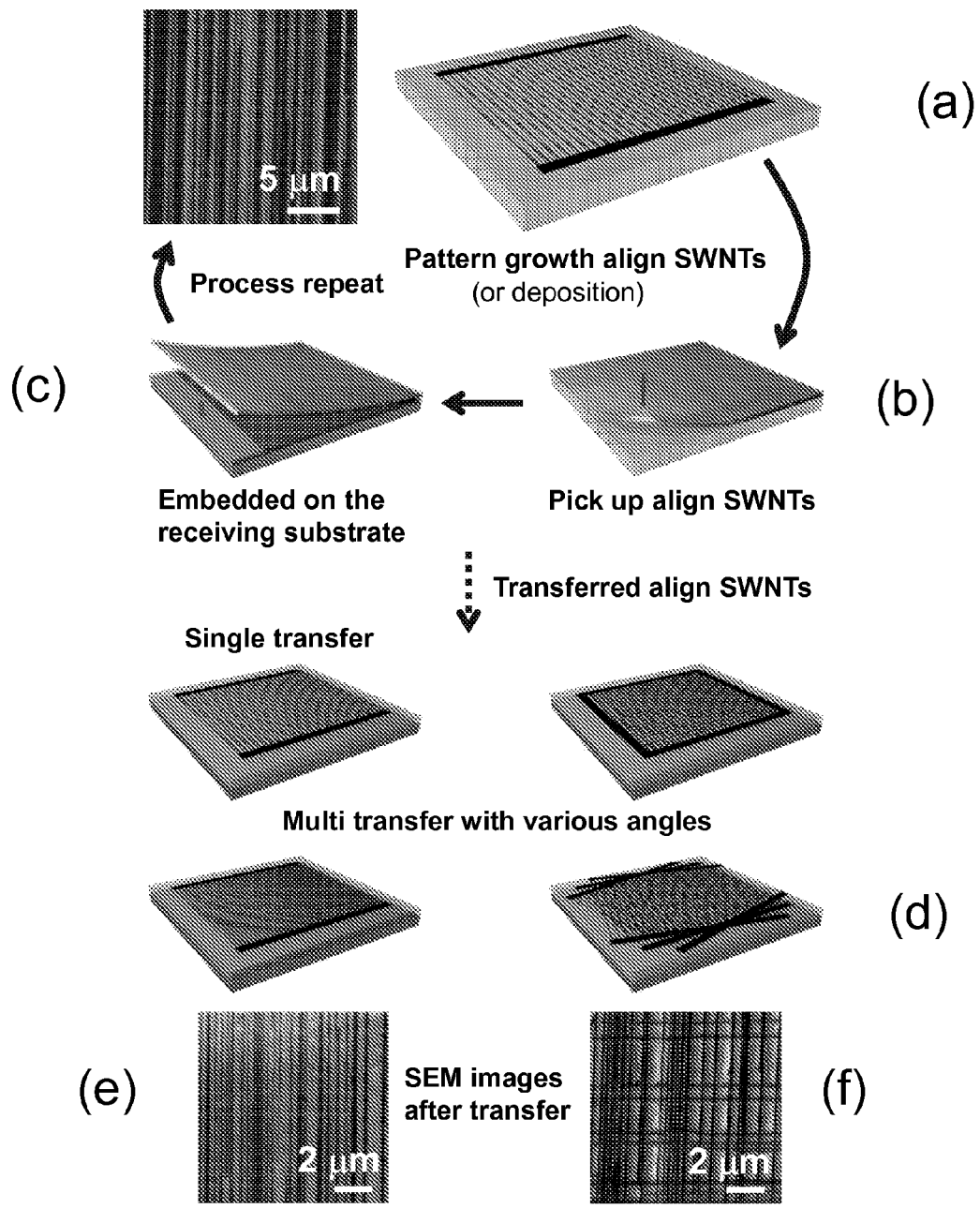
FIG. 33 provides a schematic diagram illustrating steps in a method of the present invention for generating a multilayer structure comprising a plurality of overlaying nanotube arrays with selected spatial orientations.

FIG. 33 provides a schematic diagram illustrating steps in a method of the present invention for generating a multilayer structure comprising a plurality of overlaying nanotube arrays with selected spatial orientations. A first array of longitudinally aligned nanotubes is generated on a guided growth or guided deposition substrate via guided growth methods or guided deposition methods, respectively (see, panel (a)). Next, the first nanotube array is transferred from the guided growth or guided deposition substrate to a patterning device, for example by lift off using an transfer stamp, such as an elastomeric stamp (See, panel (b)). The first nanotube array is subsequently transferred, and optionally assembled, on a receiving substrate (See, panel (c)) in a manner that preserves the relative orientations of tubes in the first array. Exemplary means of transferring and/or assembling the first nanotube array on the receiving substrate include the use of adhesive and/or laminating layers.

Processing steps (a)-(c) are repeated thereby generating and transferring additional nanotube arrays that are positioned on top of the first nanotube array. As indicated in FIG. 33, this process generates a multilayer structure comprising a stack of integrated nanotube arrays. Nanotube arrays in the multilayer structure are provided in selected orientations. For example, nanotube arrays in the multilayer stack may be aligned such that nanotubes in different arrays are longitudinally arranged parallel to a primary axis. Panel (e) shows a micrograph of multilayer stack wherein that nanotubes in different arrays are longitudinally aligned parallel to a primary axis. Alternatively, arrays in the multilayer structure may be provided in orientations that differ selectively from each other (See, panel (d)), such as orthogonal configurations or configurations wherein arrays of different layers are provided in spatially configurations having selected angularly deviations from parallelism. Panel (f) shows a micrograph of multilayer stack wherein that a nanotubes in an array of a first layer are longitudinally arranged orthogonal to nanotubes in an array of a second layer.

In one aspect, the present invention provides a method of making a multilayer carbon nanotube array structure comprising the steps of: (1) generating a first array of longitudinally aligned carbon nanotubes on a guided growth or guided deposition substrate, thereby generating a first nanotube array layer; (2) generating a second array of longitudinally aligned carbon nanotubes on a guided growth or guided deposition substrate; and (3) transferring the second array of longitudinally aligned carbon nanotubes from the guided growth or guided deposition substrate to the first array of longitudinally aligned carbon nanotubes on the receiving surface of a receiving substrate; thereby generating a second nanotube array layer supported the first nanotube array layer. Optionally the method of this aspect of the present invention further comprises the step of transferring the first array of longitudinally aligned carbon nanotubes from the guided growth or guided deposition substrate to the receiving surface of a receiving substrate. Accordingly, the present invention includes methods of making multilayer nanotube array structures on guided growth or guided deposition substrate and methods of making multilayer nanotube array structures on other substrates including flexible and functional substrates. In some embodiments, the multilayer nanotube array structure is first assembled on a guided growth or guided deposition substrate and subsequently transferred to the receiving surface of a receiving substrate. In other methods, the multilayer nanotube array structure is assembled on the receiving surface of a receiving substrate by sequential nanotube array transfer processing steps.

In an embodiment, the second array of longitudinally aligned carbon nanotubes is transferred on to an external surface of the first array of longitudinally aligned carbon nanotubes or on to an intermediate layer, such as an adhesive layer or laminating layer, on an external surface of the first array of longitudinally aligned carbon nanotubes.

Methods of the present invention are capable of making multilayer nanotube array structures comprising any number of nanotube arrays by sequential transfer of additional nanotube arrays. In one embodiment, the present method further comprises the steps of: (1) generating one or more additional arrays of longitudinally aligned carbon nanotubes on one or more guided growth or guided deposition substrates; and (2) transferring the additional arrays of longitudinally aligned carbon nanotubes from the guided growth or guided deposition substrate to the first array, second array or both; thereby generating additional nanotube array layers supported by the first array layer, second array layer or both.

Methods of the present invention are capable of generating multilayer carbon nanotube array structures comprising nanotube arrays in a variety of selected spatial orientations and positions. In one embodiment, for example, the first array and the second array comprise longitudinally aligned carbon nanotubes that are oriented parallel to a common central alignment axis. This embodiment is useful for making multilayer nanotube array structure having a parallel spatial orientation and optionally providing high nanotube densities. Alternatively, the present methods include configurations wherein the first array comprises longitudinally aligned carbon nanotubes that extend along a first set of alignment axes that are parallel to a first central alignment axis, the second array comprises longitudinally aligned carbon nanotubes that extend along a second set of alignment axes that are parallel to a second central alignment axis, and wherein the first and second central alignment axes are not parallel to each other. For example, the present methods includes embodiments wherein the first and second central alignment axes are orthogonal to each other, thus forming a multilayer carbon nanotube array stricture having an orthogonal crossbar geometry. The methods of the present invention enable fabrication of multilayer nanotube array structures wherein the alignment axes of nanotube arrays are angularly displaced from each other by a selected number of degrees.

In another aspect, the present invention provides a multilayer carbon nanotube array structure comprising: (1) an first array of longitudinally aligned carbon nanotubes, wherein the longitudinally aligned nanotubes of the first array extend lengths that are parallel to within 10 degrees of a first central alignment axis, and wherein the first array has a density of longitudinally aligned carbon nanotubes greater than or equal to about 0.1 nanotubes $\mu m^{-1}$; and (2) a second first array of longitudinally aligned carbon nanotubes supported by the first array, wherein the longitudinally aligned nanotubes of the second array extend lengths that are parallel to within 10 degrees of a second central alignment axis, and wherein the second array has a density of longitudinally aligned carbon nanotubes greater than or equal to about 0.1 nanotubes $\mu m^{-1}$. The multilayer carbon nanotube array structure of this aspect may further comprise at least one additional array of longitudinally aligned carbon nanotubes supported by said first array, said second array or both.

In an embodiment, the first central alignment axis and the second central alignment axis are parallel to each other. Alternatively, the first central alignment axis and the second central alignment axis are angularly displaced from each other by a selected number of degrees, for example the first central alignment axis and the second central alignment axis are orthogonal to each other. In an embodiment, the longitudinally aligned carbon nantoubes of the first and second arrays exhibit a high degree of linearity.

Example 8

Solution Printing for Guided Deposition of Carbon Nanotubes

Generation of longitudinally aligned nanotubes and nanotube arrays using guided deposition may employ a number of solution printing methods including, but not limited to, inkjet printing, screen printing, fluid-based printing and microcontact printing.

The following references relate generally to inkjet printing (thermal, piezoelectric, or electrohydrodynamic methods) techniques and are hereby incorporated by reference in their entireties: (1) Creagh, L. T.; McDonald, M. Mrs Bulletin 2003, 28, 807; (2) de Gans, B. J.; Duineveld, P. C.; Schubert, U.S. Advanced Materials 2004, 16, 203; Sirringhaus, H.; Kawase, T.; Friend, R. H.; Shimoda, T.; Inbasekaran, M.; Wu, W.; Woo, E. P. Science 2000, 290, 2123; (3) Shtein, M.; Peumans, P.; Benziger, J. B.; Forrest, S. R. Advanced Materials 2004, 16, 1615; (4) Shtein, M.; Peumans, P.; Benziger, J. B.; Forrest, S. R. Journal Of Applied Physics 2004, 96, 4500; (5) Preisler, E. J.; Guha, S.; Perkins, B. R.; Kazazis, D.; Zaslaysky, A. Applied Physics Letters 2005, 86; (6) Hayes, D. J.; Cox, W. R.; Grove, M. E. Journal Of Electronics Manufacturing 1998, 8, 209; (7) Son, H. Y.; Nah, J. W.; Paik, K. W. Ieee Transactions On Electronics Packaging Manufacturing 2005, 28, 274; (8) Hayes, D. J.; Cox, W. R.; Grove, M. E. Display Works '99 1999, 1; (9) Moon, J.; Grau, J. E.; Knezevic, V.; Cima, M. J.; Sachs, E. M. Journal Of The American Ceramic Society 2002, 85, 755; (10) Blazdell, P. F.; Evans, J. R. G.; Edirisinghe, M. J.; Shaw, P.; Binstead, M. J. Journal Of Materials Science Letters 1995, 14, 1562; (11) Blazdell, P. F.; Evans, J. R. G. Journal Of Materials Synthesis And Processing 1999, 7, 349; (12) Anagnostopoulos, C. N.; Chwalek, J. M.; Delametter, C. N.; Hawkins, G. A.; Jeanmaire, D. L.; Lebens, J. A.; Lopez, A.; Trauernicht, D. P. 12th Int. Conf. Solid State Sensors, Actuators and Microsystems, Boston, 2003; p 368; and Li, D.; Xia, Y. N. Advanced Materials 2004, 16, 1151.

The following references relate generally to screen printing techniques and are hereby incorporated by reference in their entireties: (1) Ling, M. M.; Bao, Z. N. Chemistry Of Materials 2004, 16, 4824; (2) Garnier, F.; Hajlaoui, R.; Yassar, A.; Srivastava, P. Science 1994, 265, 1684; (3) Gray, C.; Wang, J.; Duthaler, G.; Ritenour, A.; Drzaic, P. S. Proceedings of SPIE 2001, 4466, 89; (4) Bao, Z. N.; Feng, Y.; Dodabalapur, A.; Raju, V. R.; Lovinger, A. J. Chemistry Of Materials 1997, 9, 1299; (5) Someya, T.; Kitamura, M.; Arakawa, Y.; Sano, Y. Fall Materials Research Society (MRS) Meeting: Boston, Mass., Dec. 1-5 2003; (6) Min, G. Synthetic Metals 2003, 135, 141; (7) Pardo, D. A.; Jabbour, G. E.; Peyghambarian, N. Advanced Materials 2000, 12, 1249; (8) Jabbour, G. E.; Radspinner, R.; Peyghambarian, N. Ieee Journal Of Selected Topics In Quantum Electronics 2001, 7, 769; (9) Kim, J. M.; Choi, W. B.; Lee, N. S.; Jung, J. E. Diamond And Related Materials 2000, 9, 1184; and (10) Lee, N. S.; Chung, D. S.; Han, I. T.; Kang, J. H.; Choi, Y. S.; Kim, H. Y.; Park, S. H.; Jin, Y. W.; Yi, W. K.; Yun, M. J.; Jung, J. E.; Lee, C. J.; You, J. H.; Jo, S. H.; Lee, C. G.; Kim, J. M. Diamond And Related Materials 2001, 10, 265.

The following references relate generally to microcontact printing techniques and are hereby incorporated by reference in their entireties: (1) Decre, M. M. J.; Schneider, R.; Burdinski, D.; Schellekens, J.; Saalmink, M.; Dona, R. Materials Research Society Fall Meeting, 2003; p M4.9.1; Kumar, A.; Whitesides, G. M. Applied Physics Letters 1993, 63, 2002; (2) Geissler, M.; Schmid, H.; Michel, B.; Delamarche, E. Microelectronic Engineering 2003, 67-8, 326; (3) Kumar, A.; Biebuyck, H. A.; Whitesides, G. M. Langmuir 1994, 10, 1498; (4) Tate, J.; Rogers, J. A.; Jones, C. D. W.; Vyas, B.; Murphy, D. W.; Li, W. J.; Bao, Z. A.; Slusher, R. E.; Dodabalapur, A.; Katz, H. E. Langmuir 2000, 16, 6054; (5) Geissler, M.; Wolf, H.; Stutz, R.; Delamarche, E.; Grummt, U. W.; Michel, B.; Bietsch, A. Langmuir 2003, 19, 6301; (6) Goetting, L. B.; Deng, T.; Whitesides, G. M. Langmuir 1999, 15, 1182; (7) Kagan, C. R.; Breen, T. L.; Kosbar, L. L. Applied Physics Letters 2001, 79, 3536; (8) Truong, T. T.; Lin, R. S.; Rogers, J. A., 2006; (9) Balmer, T. E.; Schmid, H.; Stutz, R.; Delamarche, E.; Michel, B.; Spencer, N. D.; Wolf, H. Langmuir 2005, 21, 622; (10) Burdinski, D.; Brans, H. J. A.; Decre, M. M. J. Journal of the American Chemical Society 2005, 127, 10786; (11) (168) Rogers, J. A.; Bao, Z.; Baldwin, K.; Dodabalapur, A.; Crone, B.; Raju, V. R.; Kuck, V.; Katz, H.; Amundson, K.; Ewing, J.; Drzaic, P. Proceedings Of The National Academy Of Sciences Of The United States Of America 2001, 98, 4835; (12) Rogers, J. A.; Bao, Z. N.; Dodabalapur, A.; Makhija, A. Ieee Electron Device Letters 2000, 21, 100; (13) Rogers, J. A.; Bao, Z. N.; Makhija, A.; Braun, P. Advanced Materials 1999, 11, 741; (14) Michel, B.; Bernard, A.; Bietsch, A.; Delamarche, E.; Geissler, M.; Juncker, D.; Kind, H.; Renault, J. P.; Rothuizen, H.; Schmid, H.; Schmidt-Winkel, P.; Stutz, R.; Wolf, H. Ibm Journal of Research and Development 2001, 45, 697; (15) Schellekens, J.; Burdinski, D.; Saalmink, M.; Beenhakkers, M.; Gelinck, G.; Decre, M. M. J. Materials Research Society Fall Meeting, 2003; p M2.9.1.

The following references relate generally to carbon nanotube printing techniques and are hereby incorporated by reference in their entireties: (1) Hines, D. R.; Mezhenny, S.; Breban, M.; Williams, E. D.; Ballarotto, V. W.; Esen, G.; Southard, A.; Fuhrer, M. S. *Applied Physics Letters* 2005, 86; (2) Hur, S. H.; Park, O. O.; Rogers, J. A. Applied Physics Letters 2005, 86; (3) Cao, Q.; Zhu, Z. T.; Lemaitre, M. G.; Xia, M. G.; Shim, M.; Rogers, J. A. Applied Physics Letters 2006, 88; (4) Meitl, M. A.; Zhou, Y. X.; Gaur, A.; Jeon, S.; Usrey, M. L.; Strano, M. S.; Rogers, J. A. Nano Letters 2004, 4, 1643; (5) Cao, Q.; Hur, S. H.; Zhu, Z. T.; Sun, Y.; Wang, C. J.; Meitl, M. A.; Shim, M.; Rogers, J. A. Advanced Materials 2006, 18, 304; (6) Hur, S. H.; Yoon, M. H.; Gaur, A.; Shim, M.; Facchetti, A.; Marks, T. J.; Rogers, J. A. Journal of the American Chemical Society 2005, 127, 13808; (7) Allen, A. C.; Sunden, E.; Cannon, A.; Graham, S.; King, W. Applied Physics Letters 2006, 88, 083112; and (8) Zhou, Y. X.; Hu, L. B.; Gruner, G. Applied Physics Letters 2006, 88.

REFERENCES

T. Durkop, S. A. Getty, Enrique Cobas, M. S. Fuhrer, *Nano Letters* 4, 35 (2004).

Zhen Yao, Charles L. Kane, Cees Dekker, *Phys. Rev. Lett* 84, 2941 (2000).

All Javey, Jing Guo, Qian Wang, Mark Lundstrom, Hongjie Dai, *Nature* 424, 654 (2003). Yu-Ming Lin, Joerg Appenzeller, Joachim Knoch, Phaedon Avouris, *IEEE Trans. Nano* 4, 481 (2005).

Zhihong Chen, Joerg Appenzeller, Yu-Ming Lin, Jennifer Sippel-Oakley, Andrew G. Rinzler, Jinyao Tang, Shalom J. Wind, Paul M. Solomon, Phaedon Avouris, *Science* 311, 1735 (2006).

Adrian Bachtold, Peter Hadley, Takeshi Nakanishi, Cees Dekker, *Science* 294, 1317 (2001).

J. A. Misewich, R. Martel, Ph. Avouris, J. C. Tsang, S. Heinze, J. Tersoff, *Science* 300, 783 (2003).

Jing Kong, Nathan R. Franklin, Chongwu Zhou, Michael G. Chapline, Shu Peng, Kyeongjae Cho, Hongjie Dai, *Science* 287, 622 (2000).

V. Derycke, R. Martel, J. Appenzeller, Ph. Avouris, *Nano Letters* 1, 453 (2001).

Bae-Horng Chen, Horng-Chih Lin, Tiao-Yuan Huang, Jeng-Hua Wei, Hung-Hsiang Wang, Ming-Jinn Tsai, Tien Sheng Chao, *Appl. Phys. Lett.* 88, 093502 (2006).

Coskun Kocabas, Moonsub Shim, John A. Rogers, *JACS* 128, 4540 (2006).

Ariel Ismach, Lior Segev, Ellen Wachtel, Ernesto Joselevich, *Angew. Chem. Int. Ed.* 43, 6140 (2004).

Song Han, Xiaolei Liu, Chongwu Zhou, *JACS* 127, 5294 (2005).

Coskun Kocabas, Seung-Hyun Hur, Anshu Gaur, Matthew A. Meitl, Moonsub Shim, John A. Rogers, *Small* 1, 1110 (2005).

E. Menard, R. G. Nuzzo, J. A. Rogers, *Appl. Phys. Lett.* 86, 093507 (2005).

Zhihong Chen, Joerg Appenzeller, Joachim Knoch, Yu-Ming Lin, Phaedon Avouris, *Nano Letters* 5, 1497 (2005).

All Javey, Hyoungsub Kim, Markus Brink, Qian Wang, Ant Ural, Jing Guo, Paul Mcintyre, Paul Mceuen, Mark Lundstrom, Hongjie Dai, *Nature Materials* 1, 241 (2002).

Xinjian Zhou, Ji-Yong Park, Shaoming Huang, Jie Liu, Paul L. Mceuen, *Phys. Rev. Lett.* 95, 146805 (2005).

Jing Guo, Sebastien Goasguen, Mark Lundstrom, Supriyo Datta, *Appl. Phys. Lett.* 81, 1486 (2002).

S. J. Wind, J. Appenzeller, R. Martel, V. Derycke, Ph. Avouris, *Appl. Phys. Lett.* 80, 3817 (2002).

Philip G. Collins, Michael S. Arnold, Phaedon Avouris, *Science* 292, 706 (2001).

Seung-Hyun Hur, O Ok Park, John A. Rogers, *Appl. Phys. Lett.* 86, 243502 (2005). Yangxin Zhou, Anshu Gaur, Seung-Hyun Hur, Coskun Kocabas, Matthew A. Meitl, Moonsub Shim, John A. Rogers, *Nano Letters* 4, 2031 (2004).

We claim:

1. A method for making an array of longitudinally aligned carbon nanotubes; said method comprising the steps of:

providing a guided growth substrate having a receiving surface, wherein said guided growth substrate is a single crystalline Y-cut or rotated Y-cut quartz substrate having a cut angle selected from the range of 0 degrees to 42.75 degrees; wherein said guided growth substrate is characterized by a principle guided growth axis in the plane of said receiving surface;

patterning said receiving surface with a carbon nanotube growth catalyst to generate bands of catalyst separated from each other by regions of said receiving surface having substantially no catalyst present, wherein said bands of catalyst are oriented to intersect the principle guided growth axis and have a surface concentration of catalyst selected from the range of 1000 particles $\mu m^{-2}$ to 10 particles $\mu m^{-2}$; and wherein said regions of said receiving surface having substantially no catalyst present have a surface concentration of catalyst less than or equal to 1 particle $\mu m^{-2}$; and growing longitudinally aligned carbon nanotubes on said receiving surface of said guided growth substrate via guided growth, wherein said nanotubes grow between the bands of catalyst along nanotube growth axes parallel to the principle guided growth axis of said guided growth substrate, thereby making said array of longitudinally aligned carbon nanotubes.

2. The method of claim 1 wherein said guided growth substrate is said Y-cut quartz substrate.

3. The method of claim 1 wherein said rotated Y-cut quartz substrate is an AT-cut quartz substrate.

4. The method of claim 1 wherein said rotated Y-cut quartz substrate is a ST-cut quartz substrate.

5. The method of claim 1 wherein said cut angle of said rotated Y-cut quartz substrate is tilted toward a Z-cut quartz plane.

6. The method of claim 1 wherein said guided growth substrate provides for energetically favorable van der Waals interactions for growth and alignment between growing longitudinally aligned carbon nanotubes and the guided growth substrate.

7. The method of claim 1 wherein said bands of catalyst are parallel bands of catalyst.

8. The method of claim 1 wherein said bands of catalyst are longitudinally oriented along longitudinal catalyst alignment axes oriented perpendicular to the principle guided growth axis of the guided growth substrate.

9. The method of claim 1 wherein said bands of catalyst have lengths and widths each selected from the range of 100 nanometers to 100 microns.

10. The method of claim 1 wherein said bands of catalyst comprise first and second bands of catalyst, and said first and second bands of catalyst are separated along an axis parallel to the principle guided growth axis by a distance selected from the range of 100 nanometers to 500 microns.

11. The method of claim 1 wherein said bands of catalyst comprise ferritin, nickel, molybdenum, palladium, yttrium, iron, copper, molybdenum, or cobalt.

12. The method of claim 1 wherein said step of growing longitudinally aligned carbon nanotubes on said receiving surface of said guided growth substrate is carried out by exposure of said carbon nanotube growth catalyst patterned on said receiving surface to a precursor gas.

13. The method of claim 1 wherein said step of growing longitudinally aligned carbon nanotubes on said receiving surface of said guided substrate is carried out by chemical vapor deposition.

14. The method of claim 1 wherein said step of growing longitudinally aligned carbon nanotubes on said receiving surface of said guided growth substrate generates single walled carbon nanotubes.

15. The method of claim 1 wherein the array has a density of the longitudinally aligned carbon nanotubes between said bands of catalyst greater than or equal to 1 nanotube $\mu m^{-1}$.

16. The method of claim 1 wherein the array has a density of the longitudinally aligned carbon nanotubes between said bands of catalyst greater than or equal to 5 nanotubes $\mu m^{-1}$.

17. The method of claim 1 wherein at least 95% of said longitudinally aligned carbon nanotubes of said array are parallel to each other within 10 degrees.

18. The method of claim 1 wherein at least 95% of said longitudinally aligned carbon nanotubes of said array have deviations from perfect linearity along their entire lengths that are less than or equal to 50 nanometers per micron of length.

19. The method of claim 1 wherein the array of longitudinally aligned carbon nanotubes has an area selected from the range of 100 $nm^2$ to 10 $cm^2$.

20. The method of claim 7 wherein said step of patterning said receiving surface with the carbon nanotube growth catalyst comprises the steps of:
depositing said catalyst onto selected deposition areas of said receiving surface corresponding to said parallel bands of catalyst, and
preventing catalyst accumulation on areas of said receiving surface between said parallel bands of catalyst.

21. The method of claim 7 wherein said step of patterning said receiving surface with the carbon nanotube growth catalyst comprises the steps of:
providing a catalyst layer of said nanotube growth catalyst to said receiving surface; and
removing said catalyst from selected areas of said catalyst layer corresponding to the regions of said receiving surface having substantially no catalyst present, thereby generating the parallel bands of catalyst.

22. The method of claim 1 further comprising annealing the guided growth substrate to a temperature equal to or greater than 900 degrees Celsius for an annealing time equal to or greater than 8 hours prior to said step of growing said longitudinally aligned carbon nanotubes on said receiving surface of said guided growth substrate.

23. The method of claim 1 further comprising the step of transferring said array of longitudinally aligned carbon nanotubes from said receiving surface of said guided growth substrate to a surface of a different substrate.

24. The method of claim 23 wherein said step of transferring said array of longitudinally aligned carbon nanotubes from said receiving surface of said guided growth substrate to said surface of said different substrate is achieved by contact printing, microcontact printing, transfer printing, dry transfer printing or solution printing said array of longitudinally aligned carbon nanotubes.

25. The method of claim 23 wherein said different substrate is a flexible substrate.

26. The method of claim 23 wherein said different substrate is a polymer substrate, a dielectric substrate, a metal substrate, a ceramic substrate, a glass substrate or a semiconductor substrate.

27. The method of claim 23 wherein said different substrate is prepatterned with device components.

28. The method of claim 27 wherein said device components of said different substrate are one or more electrodes, metal layers, dielectric layers, semiconductor layers, diodes, insulators, or nanotube layers.

29. The method of claim 1 further comprising applying a laminating or coating layer to the array of longitudinally aligned carbon nanotubes.

30. The method of claim 1 further comprising providing one or more electrodes in contact with at least a portion of the longitudinally aligned carbon nanotubes in the array.

31. The method of claim 1 further comprising the step of oxidizing said carbon nanotube growth catalyst, reducing said carbon nanotube growth catalyst or both oxidizing and reducing said carbon nanotube growth catalyst prior to said step of growing longitudinally aligned carbon nanotubes on said receiving surface of said guided growth substrate.

* * * * *